US010777687B2

(12) United States Patent
Endo et al.

(10) Patent No.: US 10,777,687 B2
(45) Date of Patent: Sep. 15, 2020

(54) SEMICONDUCTOR DEVICE

(71) Applicant: Semiconductor Energy Laboratory Co., Ltd., Atsugi-shi, Kanagawa-ken (JP)

(72) Inventors: Yuta Endo, Atsugi (JP); Hiromi Sawai, Atsugi (JP); Hajime Kimura, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 16/437,642

(22) Filed: Jun. 11, 2019

(65) Prior Publication Data
US 2019/0312149 A1 Oct. 10, 2019

Related U.S. Application Data

(62) Division of application No. 15/782,165, filed on Oct. 12, 2017, now Pat. No. 10,374,098.

(30) Foreign Application Priority Data

Oct. 21, 2016 (JP) ................... 2016-206544

(51) Int. Cl.
*H01L 29/786* (2006.01)
*H01L 29/22* (2006.01)
(Continued)

(52) U.S. Cl.
CPC ........ *H01L 29/78696* (2013.01); *H01L 27/10* (2013.01); *H01L 27/1225* (2013.01);
(Continued)

(58) Field of Classification Search
CPC .......... H01L 29/7869; H01L 29/78696; H01L 29/4908; H01L 29/78618; H01L 29/786;
(Continued)

(56) References Cited

U.S. PATENT DOCUMENTS 6,384,427 B1* 5/2002 Yamazaki ............ H01L 27/127
257/59
7,674,650 B2 3/2010 Akimoto et al.
(Continued)

FOREIGN PATENT DOCUMENTS

JP 2007-096055 A 4/2007
JP 2007-123861 A 5/2007
(Continued)

OTHER PUBLICATIONS

International Search Report (Application No. PCT/IB2017/056237) dated Jan. 23, 2018.
(Continued)

*Primary Examiner* — Errol V Fernandes
*Assistant Examiner* — Jeremy J Joy
(74) *Attorney, Agent, or Firm* — Robinson Intellectual Property Law Office; Eric J. Robinson

(57) ABSTRACT

A high-performance and highly reliable semiconductor device is provided. The semiconductor device includes: a first oxide; a source electrode; a drain electrode; a second oxide over the first oxide, the source electrode, and the drain electrode; a gate insulating film over the second oxide; and a gate electrode over the gate insulating film. The source electrode is electrically connected to the first oxide. The drain electrode is electrically connected to the first oxide. Each of the first oxide and the second oxide includes In, an element M (M is Al, Ga, Y, or Sn), and Zn. Each of the first oxide and the second oxide includes more In atoms than element M atoms. An atomic ratio of the In, the Zn, and the element M in the first oxide is equal to or similar to an atomic ratio of the In, the Zn, and the element M in the second oxide.

15 Claims, 33 Drawing Sheets

(51) Int. Cl.
*H01L 29/49* (2006.01)
*H01L 29/66* (2006.01)
*H01L 27/12* (2006.01)
*H01L 27/10* (2006.01)

(52) U.S. Cl.
CPC ...... *H01L 29/2206* (2013.01); *H01L 29/4908* (2013.01); *H01L 29/66969* (2013.01); *H01L 29/786* (2013.01); *H01L 29/7869* (2013.01); *H01L 29/78618* (2013.01); *H01L 29/78648* (2013.01)

(58) Field of Classification Search
CPC ........... H01L 27/1225; H01L 21/02565; H01L 21/02554
See application file for complete search history.

(56) References Cited

U.S. PATENT DOCUMENTS

| | | | |
|---|---|---|---|
| 8,748,886 B2* | 6/2014 | Yamazaki | H01L 29/78696 257/43 |
| 8,860,108 B2 | 10/2014 | Yamazaki et al. | |
| 9,018,624 B2* | 4/2015 | Yamazaki | H01L 27/1225 257/43 |
| 9,281,409 B2 | 3/2016 | Yamazaki et al. | |
| 9,379,192 B2 | 6/2016 | Ito et al. | |
| 9,401,432 B2 | 7/2016 | Kobayashi et al. | |
| 9,450,080 B2* | 9/2016 | Yamazaki | H01L 29/66969 |
| 9,455,337 B2 | 9/2016 | Hodo et al. | |
| 9,472,678 B2 | 10/2016 | Yamazaki et al. | |
| 9,666,722 B2 | 5/2017 | Matsubayashi et al. | |
| 9,705,004 B2 | 7/2017 | Kobayashi et al. | |
| 9,722,088 B2 | 8/2017 | Hanaoka et al. | |
| 9,768,318 B2 | 9/2017 | Yamazaki et al. | |
| 9,780,226 B2 | 10/2017 | Koezuka et al. | |
| 9,806,198 B2 | 10/2017 | Suzawa | |
| 9,847,429 B2 | 12/2017 | Yamazaki et al. | |
| 2012/0097942 A1* | 4/2012 | Imoto | H01L 29/7869 257/43 |
| 2012/0187395 A1* | 7/2012 | Koezuka | H01L 29/66969 257/43 |
| 2013/0069055 A1* | 3/2013 | Yamazaki | H01L 29/78693 257/43 |
| 2013/0270563 A1* | 10/2013 | Yamazaki | H01L 21/30604 257/57 |
| 2013/0292671 A1 | 11/2013 | Yamazaki et al. | |
| 2014/0027762 A1* | 1/2014 | Tsurume | H01L 29/24 257/43 |
| 2014/0151688 A1* | 6/2014 | Yamazaki | H01L 29/78636 257/43 |
| 2014/0154837 A1* | 6/2014 | Yamazaki | H01L 29/7869 438/104 |
| 2014/0175435 A1* | 6/2014 | Yamazaki | H01L 29/78696 257/43 |
| 2014/0183530 A1* | 7/2014 | Yamazaki | H01L 29/45 257/43 |
| 2014/0264320 A1* | 9/2014 | Liang | H01L 29/7869 257/43 |
| 2014/0291674 A1* | 10/2014 | Kurata | H01L 27/1225 257/43 |
| 2014/0306217 A1* | 10/2014 | Yamazaki | H01L 29/7869 257/43 |
| 2014/0319514 A1* | 10/2014 | Noda | H01L 29/78603 257/43 |
| 2014/0326992 A1* | 11/2014 | Hondo | H01L 29/7869 257/43 |
| 2015/0001533 A1* | 1/2015 | Kuwabara | H01L 29/7869 257/43 |
| 2015/0021593 A1* | 1/2015 | Yamazaki | H01L 29/66969 257/43 |
| 2015/0021596 A1* | 1/2015 | Yamazaki | H01L 29/7869 257/43 |
| 2015/0034945 A1* | 2/2015 | Sakakura | H01L 29/78684 257/43 |
| 2015/0153599 A1* | 6/2015 | Yamazaki | H01L 29/7869 257/43 |
| 2015/0155362 A1 | 6/2015 | Nakazawa et al. | |
| 2015/0179803 A1 | 6/2015 | Yamazaki et al. | |
| 2015/0187952 A1* | 7/2015 | Yamazaki | H01L 29/7869 257/43 |
| 2015/0228799 A1* | 8/2015 | Koezuka | H01L 27/1237 257/43 |
| 2015/0243737 A1* | 8/2015 | Escoffier | H01L 21/8252 327/534 |
| 2015/0255029 A1* | 9/2015 | Niikura | G09G 3/3648 345/98 |
| 2015/0255310 A1 | 9/2015 | Yamazaki et al. | |
| 2015/0348998 A1* | 12/2015 | Koezuka | H01L 27/1225 257/43 |
| 2016/0155852 A1* | 6/2016 | Yamazaki | H01L 21/02554 257/43 |
| 2016/0240682 A1* | 8/2016 | Shimomura | H01L 29/78648 |
| 2016/0283028 A1* | 9/2016 | Yamazaki | G06F 3/0412 |
| 2016/0284862 A1 | 9/2016 | Yamazaki et al. | |
| 2016/0329436 A1 | 11/2016 | Kobayashi et al. | |
| 2017/0033230 A1 | 2/2017 | Yamazaki et al. | |
| 2017/0236842 A1 | 8/2017 | Matsuda et al. | |
| 2017/0263774 A1 | 9/2017 | Matsubayashi et al. | |
| 2017/0271523 A1 | 9/2017 | Hanaoka et al. | |
| 2017/0309750 A1 | 10/2017 | Kobayashi et al. | |

FOREIGN PATENT DOCUMENTS

| | | |
|---|---|---|
| JP | 2011-119674 A | 6/2011 |
| JP | 2014-232870 A | 12/2014 |
| JP | 2015-029087 A | 2/2015 |
| JP | 2016-058708 A | 4/2016 |
| KR | 2014-0131264 A | 11/2014 |
| KR | 2015-0002500 A | 1/2015 |
| TW | 201442249 | 11/2014 |
| TW | 201501311 | 1/2015 |
| WO | WO-2014/125820 | 8/2014 |

OTHER PUBLICATIONS

Written Opinion (Application No. PCT/IB2017/056237) dated Jan. 23, 2018.

* cited by examiner

10,777,687 B2

SEMICONDUCTOR DEVICE

TECHNICAL FIELD

Embodiments of the present invention relate to a semiconductor device and a method of driving the semiconductor device. Another embodiment of the present invention relates to a semiconductor wafer, a module, and an electronic device.

In this specification and the like, a semiconductor device refers to every device that can function by utilizing semiconductor characteristics. A display device (e.g., a liquid crystal display device and a light-emitting display device), a projection device, a lighting device, an electro-optical device, a power storage device, a memory device, a semiconductor circuit, an imaging device, an electronic device, and the like may include a semiconductor device.

Note that one embodiment of the present invention is not limited to the above technical field. One embodiment of the invention disclosed in this specification and the like relates to an object, a method, or a manufacturing method. One embodiment of the present invention relates to a process, a machine, manufacture, or a composition of matter.

BACKGROUND ART

A technique by which a transistor is formed using a semiconductor thin film has been attracting attention. The transistor is used in a wide range of electronic devices such as an integrated circuit (IC) and an image display device (also simply referred to as a display device). Silicon-based semiconductor materials are widely known as materials for semiconductor thin films that can be used for transistors. As other materials, oxide semiconductors have been attracting attention.

For example, techniques have been disclosed by each of which a display device is manufactured using a transistor whose active layer is formed of zinc oxide or an In—Ga—Zn-based oxide as an oxide semiconductor (see Patent Documents 1 and 2).

In recent years, a technique has been disclosed by which an integrated circuit of a memory device is manufactured using a transistor including an oxide semiconductor (see Patent Document 3). Furthermore, not only memory devices but also arithmetic devices and the like are manufactured using transistors including oxide semiconductors.

REFERENCES

Patent Documents

[Patent Document 1] Japanese Published Patent Application No. 2007-123861
[Patent Document 2] Japanese Published Patent Application No. 2007-096055
[Patent Document 3] Japanese Published Patent Application No. 2011-119674

DISCLOSURE OF INVENTION

An object of one embodiment of the present invention is to provide a semiconductor device having favorable electrical characteristics. Another object of one embodiment of the present invention is to provide a highly reliable semiconductor device. Another object of one embodiment of the present invention is to provide a semiconductor device that can be miniaturized or highly integrated. Another object of one embodiment of the present invention is to provide a semiconductor device that can be manufactured with high productivity.

Another object of one embodiment of the present invention is to provide a semiconductor device capable of retaining data for a long time. Another object of one embodiment of the present invention is to provide a semiconductor device capable of high-speed data writing. Another object of one embodiment of the present invention is to provide a semiconductor device with high design flexibility. Another object of one embodiment of the present invention is to provide a semiconductor device capable of reducing power consumption. Another object of one embodiment of the present invention is to provide a novel semiconductor device.

Note that the description of these objects does not disturb the existence of other objects. In one embodiment of the present invention, there is no need to achieve all the objects. Other objects will be apparent from and can be derived from the description of the specification, the drawings, the claims, and the like.

A transistor included in a semiconductor device is required to have favorable electrical characteristics and high reliability. For example, states of a region in which a channel of a transistor is formed (referred to as a channel formation region) and its vicinity greatly influence electrical characteristics and reliability of the transistor. Therefore, in the channel formation region and its vicinity, it is important to reduce factors of deterioration in electrical characteristics, such as defects and contamination, and factors of a reduction in reliability as much as possible.

According to one embodiment of the present invention, defects and contamination in the channel formation region and its vicinity are reduced, so that a semiconductor device including a transistor with favorable electrical characteristics and high reliability can be achieved.

One embodiment of the present invention is a semiconductor device including: a first oxide; a source electrode; a drain electrode; a second oxide over the first oxide, the source electrode, and the drain electrode; a gate insulating film over the second oxide; and a gate electrode over the gate insulating film. The source electrode is electrically connected to the first oxide. The drain electrode is electrically connected to the first oxide. Each of the first oxide and the second oxide includes In, an element M (M is Al, Ga, Y, or Sn), and Zn. Each of the first oxide and the second oxide includes more In atoms than element M atoms. An atomic ratio of the In, the Zn, and the element M in the first oxide is equal to or similar to an atomic ratio of the In, the Zn, and the element M in the second oxide.

A difference between an electron affinity of the first oxide and an electron affinity of the second oxide is greater than or equal to 0 eV and less than or equal to 0.15 eV.

The second oxide is electrically connected to the source electrode.

One embodiment of the present invention is a semiconductor device including: a first oxide; a source electrode; a drain electrode; a second oxide over the first oxide, the source electrode, and the drain electrode; a third oxide over the second oxide; a gate insulating film over the third oxide; and a gate electrode over the gate insulating film. The source electrode is electrically connected to the first oxide. The drain electrode is electrically connected to the first oxide. Each of the first oxide, the second oxide, and the third oxide includes In, an element M (M is Al, Ga, Y, or Sn), and Zn. Each of the first oxide and the second oxide includes more In atoms than element M atoms. The third oxide includes more element M atoms than In atoms. An atomic ratio of the In, the Zn, and the element M in the first oxide is equal to or similar to an atomic ratio of the In, the Zn, and the element M in the second oxide.

A difference between an electron affinity of the first oxide and an electron affinity of the second oxide is greater than or equal to 0 eV and less than or equal to 0.15 eV. An electron affinity of the third oxide is smaller than the electron affinity of the second oxide. A difference between the electron affinity of the third oxide and the electron affinity of the second oxide is greater than or equal to 0.2 eV and less than or equal to 0.4 eV.

The second oxide is electrically connected to the source electrode.

One embodiment of the present invention is a semiconductor device including: a first oxide; a second oxide over the first oxide, a source electrode; a drain electrode; a third oxide over the second oxide, the source electrode, and the drain electrode; a gate insulating film over the third oxide; and a gate electrode over the gate insulating film. The source electrode is electrically connected to the second oxide. The drain electrode is electrically connected to the second oxide. Each of the first oxide, the second oxide, and the third oxide includes In, an element M (M is Al, Ga, Y, or Sn), and Zn. Each of the second oxide and the third oxide includes more In atoms than element M atoms. An atomic ratio of the In, the Zn, and the element M in the second oxide is equal to or similar to an atomic ratio of the In, the Zn, and the element M in the third oxide.

A difference between an electron affinity of the second oxide and an electron affinity of the third oxide is greater than or equal to 0 eV and less than or equal to 0.15 eV.

The third oxide is electrically connected to the source electrode.

One embodiment of the present invention is a module including the above-described semiconductor device and a printed circuit board.

One embodiment of the present invention is an electronic device including the above-described semiconductor device, the module, and a speaker or an operation key.

One embodiment of the present invention is a semiconductor wafer including a plurality of the semiconductor devices and a region for dicing.

One embodiment of the present invention is a method of manufacturing a semiconductor device, including the steps of: forming a first oxide by a sputtering method using a first target; forming a second oxide over the first oxide by a sputtering method using a second target; forming a first conductor and a second conductor over the second oxide; forming a third oxide over the second oxide, the first conductor, and the second conductor by a sputtering method using a third target; forming an insulator over the third oxide; and forming a third conductor over the insulator. Each of the first target, the second target, and the third target includes at least two kinds of metal elements. An atomic ratio of metal elements in the second target is equal to or similar to an atomic ratio of metal elements in the third target.

Each of the second target and the third target includes In, an element M (M is Al, Ga, Y, or Sn), and Zn. Each of the second target and the third target preferably includes more In atoms than element M atoms.

The first oxide and the second oxide are preferably formed in this order under a reduced pressure.

One embodiment of the present invention is a method of manufacturing a semiconductor device, including the steps of: forming a first oxide by a sputtering method using a first target; forming a second oxide over the first oxide by a sputtering method using a second target; forming a first conductor and a second conductor over the second oxide; forming a third oxide over the second oxide, the first conductor, and the second conductor by a sputtering method using a third target; forming a fourth oxide over the third oxide by a sputtering method using a fourth target, forming an insulator over the fourth oxide; and forming a third conductor over the insulator. Each of the first target, the second target, the third target, and the fourth target includes at least two kinds of metal elements. An atomic ratio of metal elements in the second target is equal to or similar to an atomic ratio of metal elements in the third target.

It is preferable that each of the first to fourth targets include In, an element M (M is Al, Ga, Y, or Sn), and Zn, each of the second target and the third target include more In atoms than element M atoms, and the fourth target include more element M atoms than In atoms.

The first oxide and the second oxide are preferably formed in this order under a reduced pressure.

The third oxide and the fourth oxide are preferably formed in this order under a reduced pressure.

One embodiment of the present invention is a method of manufacturing a module. The module includes a printed circuit board and a semiconductor device manufactured by the method of manufacturing a semiconductor device.

One embodiment of the present invention is a method of manufacturing an electronic device. The electronic device includes a semiconductor device manufactured by the method of manufacturing a semiconductor device, a module manufactured by the method of manufacturing a module, and a speaker or an operation key.

A semiconductor device having favorable electrical characteristics can be provided. A highly reliable semiconductor device can be provided. A semiconductor device that can be miniaturized or highly integrated can be provided. A semiconductor device that can be manufactured with high productivity can be provided.

A semiconductor device capable of retaining data for a long time can be provided. A semiconductor device capable of high-speed data writing can be provided. A semiconductor device with high design flexibility can be provided. A semiconductor device capable of reducing power consumption can be provided. A novel semiconductor device can be provided.

Note that the description of these effects does not preclude the existence of other effects. One embodiment of the present invention does not have to have all the effects listed above. Other effects will be apparent from and can be derived from the description of the specification, the drawings, the claims, and the like.

BEST MODE FOR CARRYING OUT THE INVENTION

Figure 1A:
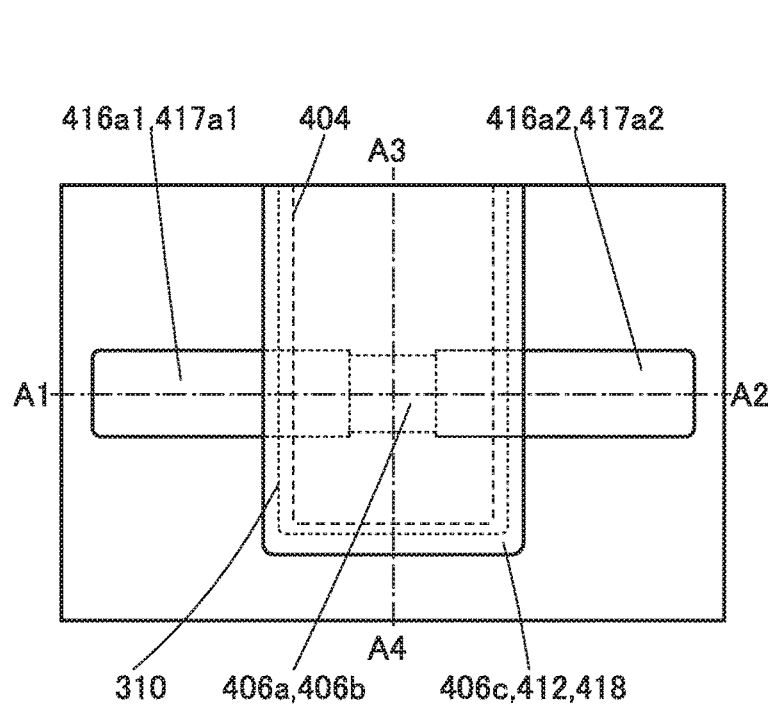
FIGS. 1A to 1C are a top view and cross-sectional views illustrating a transistor of one embodiment of the present invention.

Hereinafter, embodiments will be described with reference to drawings. Note that the embodiments can be implemented with various modes, and it will be readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, the size, the layer thickness, or the region is not limited to the illustrated scale. Note that the drawings are schematic views showing ideal examples, and embodiments of the present invention are not limited to the shapes or values shown in the drawings. In the drawings, the same portions or portions having similar functions are denoted by the same reference numerals in different drawings, and explanation thereof will not be repeated. In addition, the same hatching pattern is applied to portions having similar functions, and the portions are not particularly denoted by reference numerals in some cases.

Note that the ordinal numbers such as "first" and "second" in this specification and the like are used for convenience and do not denote the order of steps or the stacking order of layers. Therefore, for example, description can be made even when "first" is replaced with "second" or "third", as appropriate. In addition, the ordinal numbers in this specification and the like are not necessarily the same as those which specify one embodiment of the present invention.

In this specification, terms for describing arrangement, such as "over", "above", "under", and "below", are used for convenience in describing a positional relation between components with reference to drawings. Furthermore, the positional relation between components is changed as appropriate in accordance with the direction in which each component is described. Thus, there is no limitation on terms used in this specification, and description can be made appropriately depending on the situation.

The "semiconductor device" in this specification and the like means every device which can operate by utilizing semiconductor characteristics. A semiconductor element such as a transistor, a semiconductor circuit, an arithmetic device, and a memory device are each an embodiment of a semiconductor device. An imaging device, a display device, a liquid crystal display device, a light-emitting device, an electro-optical device, a power generation device (including a thin film solar cell, an organic thin film solar cell, and the like), and an electronic device may each include a semiconductor device.

In this specification and the like, a transistor is an element having at least three terminals of a gate, a drain, and a source. In addition, the transistor includes a channel formation region between a drain (a drain terminal, a drain region, or a drain electrode) and a source (a source terminal, a source region, or a source electrode), and current can flow between the source and the drain through the channel formation region. Note that in this specification and the like, a channel formation region refers to a region through which current mainly flows.

Furthermore, the functions of a source and a drain might be interchanged with each other when transistors having different polarities are employed or the direction of current flow is changed in circuit operation, for example. Therefore, in this specification and the like, the terms "source" and "drain" can be interchanged with each other in some cases.

In this specification and the like, a "silicon oxynitride film" contains more oxygen than nitrogen. For example, the silicon oxynitride film preferably contains oxygen, nitrogen, silicon, and hydrogen in the concentration ranges of 55 atomic % or higher and 65 atomic % or lower, 1 atomic % or higher and 20 atomic % or lower, 25 atomic % or higher and 35 atomic % or lower, and 0.1 atomic % or higher and 10 atomic % or lower, respectively. Furthermore, a "silicon nitride oxide film" contains more nitrogen than oxygen. For example, the silicon nitride oxide film preferably contains nitrogen, oxygen, silicon, and hydrogen in the concentration ranges of 55 atomic % or higher and 65 atomic % or lower, 1 atomic % or higher and 20 atomic % or lower, 25 atomic % or higher and 35 atomic % or lower, and 0.1 atomic % or higher and 10 atomic % or lower, respectively.

In this specification and the like, the terms "film" and "layer" can be interchanged with each other. For example, the term "conductive layer" can be changed into the term "conductive film" in some cases. Also, the term "insulating film" can be changed into the term "insulating layer" in some cases.

Furthermore, unless otherwise specified, transistors described in this specification and the like are field effect transistors. Unless otherwise specified, transistors described in this specification and the like are n-channel transistors. Thus, unless otherwise specified, the threshold voltage (also referred to as "Vth") is higher than 0 V.

In this specification and the like, the term "parallel" indicates that the angle formed between two straight lines is greater than or equal to −10° and less than or equal to 10°, and accordingly also includes the case where the angle is greater than or equal to −5° and less than or equal to 5°. In addition, the term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. In addition, the term "substantially perpendicular" indicates that the angle formed between two straight lines is greater than or equal to 60° and less than or equal to 120°.

In this specification, trigonal and rhombohedral crystal systems are included in a hexagonal crystal system.

For example, in this specification and the like, an explicit description "X and Y are connected" means that X and Y are electrically connected, X and Y are functionally connected, and X and Y are directly connected. Accordingly, without being limited to a predetermined connection relation, for example, the connection relation shown in drawings or texts, another connection relation is included in the drawings or the texts.

Here, X and Y each denote an object (e.g., a device, an element, a circuit, a wiring, an electrode, a terminal, a conductive film, or a layer).

Examples of the case where X and Y are directly connected include the case where an element that allows an electrical connection between X and Y (e.g., a switch, a transistor, a capacitor, an inductor, a resistor, a diode, a display element, a light-emitting element, and a load) is not connected between X and Y, and the case where X and Y are connected without the element that allows the electrical connection between X and Y provided therebetween.

For example, in the case where X and Y are electrically connected, one or more elements that enable an electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, the switch is turned on or off to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable a functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up circuit and a step-down circuit) and a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, and a buffer circuit; a signal generation circuit; a memory circuit; and a control circuit) can be connected between X and Y. For example, even when another circuit is interposed between X and Y, X and Y are functionally connected if a signal output from X is transmitted to Y. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the description "X and Y are connected".

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path" and "a source (or a first terminal or the like) of a transistor is electrically connected to X at least with a first connection path through Z1, the first connection path does not include a second connection path, the second connection path includes a connection path through which the transistor is provided, a drain (or a second terminal or the like) of the transistor is electrically connected to Y at least with a third connection path through Z2, and the third connection path does not include the second connection path". Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit configuration is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

Note that in this specification, a barrier film refers to a film having a function of inhibiting the passage of oxygen and impurities such as hydrogen. The barrier film that has conductivity may be referred to as a conductive barrier film.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in an active layer of a transistor is called an oxide semiconductor in some cases. In other words, an OS FET is a transistor including an oxide or an oxide semiconductor.

Embodiment 1

Structure Example 1 of Semiconductor Device

An example of a semiconductor device including a transistor 1000 of one embodiment of the present invention is described below.

Figure 1C:
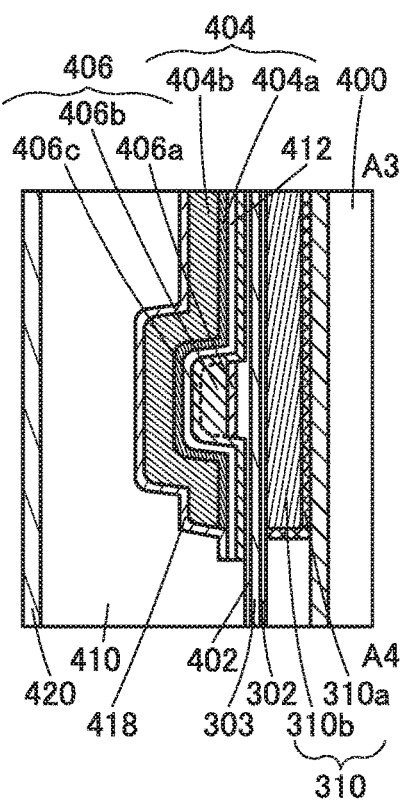
Figure 1B:
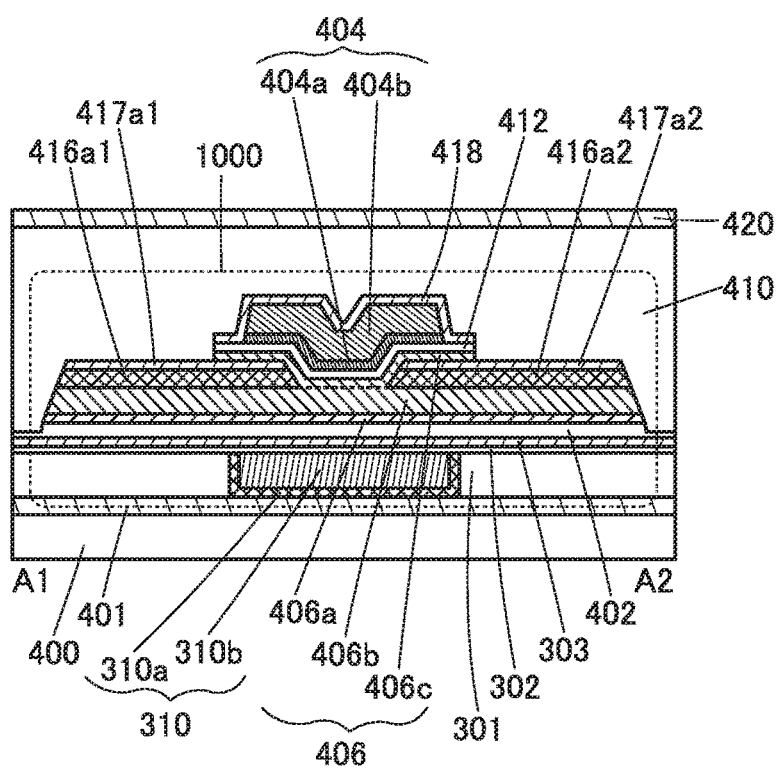

FIG. 1A is a top view of a semiconductor device including the transistor 1000. FIG. 1B is a cross-sectional view of a portion indicated by a dashed-dotted line A1-A2 in FIG. 1A, illustrating a cross section of the transistor 1000 in a channel length direction. FIG. 1C is a cross-sectional view of a portion indicated by a dashed-dotted line A3-A4 in FIG. 1A, illustrating a cross section of the transistor 1000 in a channel width direction. Note that for simplification of the drawing, some components are not illustrated in the top view in FIG. 1A.

The semiconductor device of one embodiment of the present invention includes a substrate 400, an insulator 401 over the substrate 400, the transistor 1000 over the insulator 401, an insulator 410 over the transistor 1000, and an insulator 420 over the insulator 410.

The transistor 1000 includes a conductor 310 and an insulator 301 over the insulator 401; an insulator 302 over the conductor 310 and the insulator 301; an insulator 303 over the insulator 302; an insulator 402 over the insulator 303; an oxide 406*a* over the insulator 402; an oxide 406*b* over the oxide 406*a*; a conductor 416*a*1 and a conductor 416*a*2 each including a region in contact with a top surface of the oxide 406*b*; a barrier film 417*a*1 over the conductor 416*a*1; a barrier film 417*a*2 over the conductor 416*a*2; an oxide 406*c* including a region in contact with a side surface of the conductor 416*a*1, a side surface of the conductor 416*a*2, a side surface of the barrier film 417*a*1, a side surface of the barrier film 417*a*2, and a top surface of the oxide 406*b*; an insulator 412 over the oxide 406*c*; a conductor 404 including a region overlapping with the top surface of the oxide 406*b* with the oxide 406*c* and the insulator 412 therebetween; and an insulator 418 over the conductor 404. The insulator 301 has an opening, and the conductor 310*a* and the conductor 310*b* are provided in the opening.

In the cross-sectional view in the channel length direction in FIG. 1B, end portions of the insulator 418, end portions of the insulator 412, and end portions of the oxide 406*c* are aligned and positioned over the barrier film 417*a*1 and the barrier film 417*a*2. In the cross-sectional view in the channel width direction in FIG. 1C, an end portion of the insulator 418, an end portion of the insulator 412, and an end portion of the oxide 406*c* are aligned and positioned over the insulator 402.

In the transistor 1000, the conductor 404 serves as a first gate electrode. The conductor 404 can have a stacked-layer structure including a conductor 404*a* and a conductor 404*b*. Furthermore, the conductor 404 can have a stacked-layer structure including three or more layers. For example, when the conductor 404a having a function of inhibiting the passage of oxygen is formed under the conductor 404b, oxidation of the conductor 404b can be prevented. Alternatively, for example, the conductor 404 preferably includes a metal having resistance to oxidation. Alternatively, for example, an oxide conductor or the like may be used. Alternatively, for example, a multilayer structure including an oxide having conductivity may be employed. The insulator 412 serves as a first gate insulator.

The conductors 416a1 and 416a2 function as a source electrode and a drain electrode of the transistor. The conductors 416a1 and 416a2 can each have a stacked-layer structure including a conductor having a function of inhibiting the passage of oxygen. For example, when a conductor having a function of inhibiting the passage of oxygen is formed as an upper layer, oxidation of the conductors 416a1 and 416a2 can be prevented. Alternatively, the conductor 416a1 and the conductor 416a2 preferably contain a metal having resistance to oxidation. Alternatively, an oxide conductor or the like may be used.

The barrier films 417a1 and 417a2 each have a function of inhibiting the passage of oxygen and impurities such as hydrogen and water. The barrier film 417a1 is located over the conductor 416a1 and prevents diffusion of oxygen into the conductor 416a1. The barrier film 417a2 is located over the conductor 416a2 and prevents diffusion of oxygen into the conductor 416a2.

In the transistor 1000, the oxide 406b and the oxide 406c have a channel formation region. That is, in the transistor 1000, the resistance of the oxide 406b and the oxide 406c can be controlled by a potential applied to the conductor 404. That is, conduction or non-conduction between the conductor 416a1 and the conductor 416a2 can be controlled by the potential applied to the conductor 404.

As illustrated in FIG. 1C, the conductor 404 functioning as the first gate electrode is provided so as to cover the whole oxide 406b and part of the oxide 406c with the insulator 412 functioning as the first gate insulator positioned therebetween. Thus, the whole oxide 406b and part of the oxide 406c can be electrically surrounded by an electric field of the conductor 404 functioning as the first gate electrode. Such a transistor structure in which a channel formation region is electrically surrounded by an electric field of a first gate electrode is referred to as a surrounded channel (s-channel) structure.

Furthermore, as illustrated in FIG. 1B, the conductors 416a1 and 416a2 which serve as a source electrode and a drain electrode are sandwiched between the oxide 406b and the oxide 406c. This structure can increase the area in contact with the source electrode and the drain electrode. Therefore, the contact area between the oxides 406b and 406c and the conductors 416a1 and 416a2 is large, which is preferable because the contact resistance can be low.

The oxide 406 is preferably formed using a metal oxide functioning as an oxide semiconductor (hereinafter, the metal oxide is also referred to as an oxide semiconductor). However, silicon (including strained silicon), germanium, silicon germanium, silicon carbide, gallium arsenide, aluminum gallium arsenide, indium phosphide, gallium nitride, an organic semiconductor, or the like may be used instead of the oxides.

A transistor formed using an oxide semiconductor has an extremely low leakage current in an off state; thus, a semiconductor device with low power consumption can be provided. An oxide semiconductor can be formed by a sputtering method or the like and thus can be used in a transistor included in a highly integrated semiconductor device.

However, the transistor formed using an oxide semiconductor is likely to have its electrical characteristics changed by impurities and oxygen vacancies in the oxide semiconductor; as a result, the reliability is reduced, in some cases. Hydrogen contained in an oxide semiconductor reacts with oxygen bonded to a metal atom to be water, and thus causes an oxygen vacancy, in some cases. Entry of hydrogen into the oxygen vacancy generates an electron serving as a carrier in some cases. Accordingly, a transistor including an oxide semiconductor containing oxygen vacancies is likely to have normally-on characteristics. Thus, it is preferable that oxygen vacancies in the oxide semiconductor be reduced as much as possible.

An oxide semiconductor preferably contains at least indium or zinc. In particular, indium and zinc are preferably contained. In addition, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, and the like may be contained.

Here, the case where the oxide semiconductor is an In-M-Zn oxide that contains indium, an element M, and zinc is considered. The element M is aluminum, gallium, yttrium, tin, or the like. Examples of other elements that can be used as the element M include boron, silicon, titanium, iron, nickel, germanium, zirconium, molybdenum, lanthanum, cerium, neodymium, hafnium, tantalum, tungsten, and magnesium. Note that two or more of the above elements may be used in combination as the element M.

Note that in this specification and the like, a metal oxide including nitrogen is also called a metal oxide in some cases. Moreover, a metal oxide including nitrogen may be called a metal oxynitride.

Here, each of the In-M-Zn oxides used for the oxide 406b and the oxide 406c preferably includes more In atoms than element M atoms. Use of such an oxide increases the mobility of the transistor 1000 and the carrier density. In addition, the oxide is preferably disposed on the side of the conductor 404 that serves as a gate electrode, in which case the controllability of a channel formation region is high.

For example, oxide semiconductors with the same composition or similar compositions are preferably used for the oxide 406b and the oxide 406c. Alternatively, for example, the oxide 406b and the oxide 406c are preferably formed using sputtering targets with the same composition or substantially the same compositions. Alternatively, for example, the oxide 406b and the oxide 406c are preferably formed under substantially the same process conditions (e.g., deposition temperature and an oxygen proportion).

Alternatively, for example, the oxide 406b and the oxide 406c may be formed using sputtering targets with different compositions. For example, when the process conditions (e.g., deposition temperature and an oxygen proportion) for the oxide 406b and the oxide 406c are adjusted as appropriate, the oxide 406b and the oxide 406c can be oxide semiconductors with the same composition or similar compositions in some cases. Oxide semiconductors with more similar compositions are preferred as the oxide 406b and the oxide 406c in some cases, while desired thicknesses and functions are different and thus the optimum deposition conditions are also different in some cases. For this reason, sputtering targets with different compositions are preferred over sputtering targets with the same composition or similar compositions in some cases because compositions of the oxide 406b and the oxide 406c formed using the former can be closer to each other than those formed using the latter.

The oxide 406b and the oxide 406c with the same composition or similar compositions can have the same electron affinity or a small difference in electron affinity. In particular, when not only the compositions but also the process conditions are substantially the same, the oxide 406b and the oxide 406c have the same electron affinity or a small difference in electron affinity. Accordingly, the interface state density between the oxide 406b and the oxide 406c can be low. Low interface state density can prevent a decrease in on-state current of the transistor 1000. Note that the electron affinity can be also called energy value Ec of the conduction band minimum. A difference between Ec of the oxide 406b and Ec of the oxide 406c is preferably small, and preferably greater than or equal to 0 eV and less than or equal to 0.15 eV, more preferably greater than or equal to 0 V and less than or equal to 0.07 eV.

Figure 16:
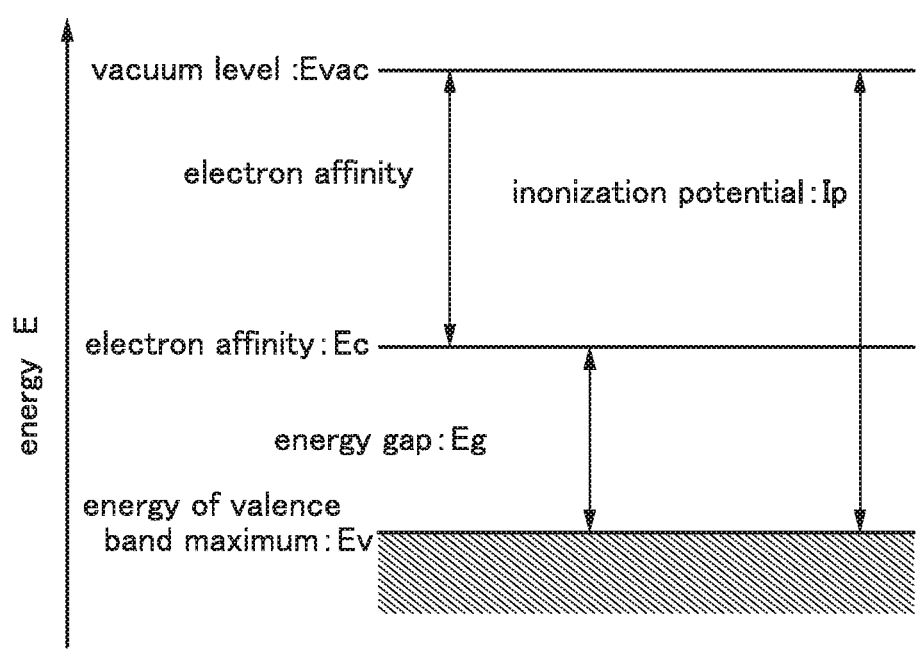
FIG. 16 shows an energy band structure of an oxide.

The electron affinity or the Ec can be obtained from an energy gap Eg and an ionization potential Ip, which is a difference between the vacuum level and the energy Ev of the valence band maximum, as shown in FIG. 16. The ionization potential Ip can be measured using, for example, an ultraviolet photoelectron spectroscopy (UPS) apparatus. The energy gap Eg can be measured using, for example, a spectroscopic ellipsometer.

In the structure of the transistor 1000, process damage might be caused on a top surface or a side surface of the oxide 406b when the source electrode and the drain electrode are formed. That is, a defect due to the process damage might be caused at or near the interface between the oxide 406b and the oxide 406c. Since oxide semiconductors with the same composition or similar compositions are used for the oxide 406b and the oxide 406c and thus the difference between the Ec of the oxide 406b and the Ec of the oxide 406c is small, a channel formation region is formed not only at or near the interface between the oxide 406b and the oxide 406c but also at or near an interface between the oxide 406c and the insulator 412 that serves as the first gate insulator.

Therefore, influence of the interface between the oxide 406b subjected to the process damage and the oxide 406c and the vicinity of the interface can be small. Furthermore, an oxide to be the oxide 406c and an insulator to be the insulator 412 that serves as the first gate insulator are stacked, and then processed into the oxide 406c and the insulator 412, in which case the interface and the vicinity thereof are favorable without being influenced by the process damage.

Accordingly, the reliability of the transistor 1000 can be improved. In addition, since the oxide 406b and part of the oxide 406c are surrounded by the electric field of the conductor 404, current in an off state (off-state current) can be decreased.

In the transistor 1000, the conductor 404 functioning as a first gate electrode partly overlaps with each of the conductors 416a1 and 416a2 functioning as the source electrode and the drain electrode, whereby parasitic capacitance between the conductor 404 and the conductor 416a1 and parasitic capacitance between the conductor 404 and the conductor 416a2 are formed.

The structure of the transistor 1000 including the barrier film 417a1 as well as the insulator 412 and the oxide 406c between the conductor 404 and the conductor 416a1 allows a reduction in the parasitic capacitance. Similarly, the transistor structure including the barrier film 417a2 as well as the insulator 412 and the oxide 406c between the conductor 404 and the conductor 416a2 allows a reduction in the parasitic capacitance. Thus, the transistor has excellent frequency characteristics.

Furthermore, the above structure of the transistor 1000 allows a reduction or prevention of generation of a leakage current between the conductor 404 and each of the conductors 416a1 and 416a2 when the transistor operates, for example, when a potential difference between the conductor 404 and each of the conductors 416a1 and 416a2 occurs.

A conductor 310 is provided in the opening formed in the insulator 301. The conductor 310a is formed in contact with an inner wall of the opening in the insulator 301, and the conductor 310b is formed on the inner side. Here, top surfaces of the conductors 310a and 310b can have substantially the same level as a top surface of the insulator 301. The conductor 310 functions as a second gate electrode. The conductor 310 can be a multilayer film including a conductor that has a function of inhibiting the passage of oxygen. For example, when the conductor 310a is formed using a conductor that has a function of inhibiting the passage of oxygen, a decrease in the conductivity due to oxidation of the conductor 310b can be prevented.

The insulator 302, the insulator 303, and the insulator 402 function as a second gate insulating film. By controlling a potential supplied to the conductor 310, the threshold voltage of the transistor can be adjusted.

Structure Example 2 of Semiconductor Device

An example of a semiconductor device including a transistor 1000a of one embodiment of the present invention is described below.

Figure 2A:
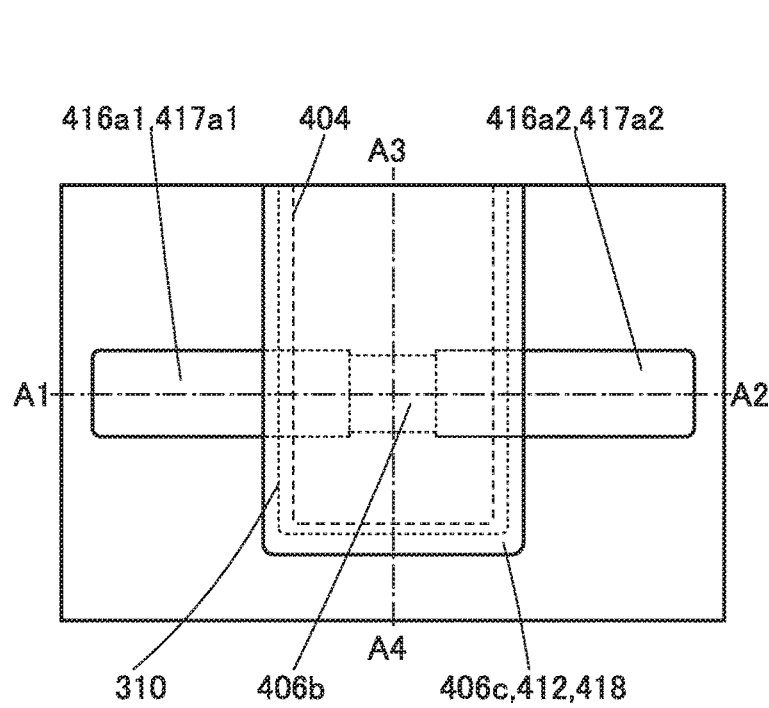
FIGS. 2A to 2C are a top view and cross-sectional views illustrating a transistor of one embodiment of the present invention.
Figure 2C:
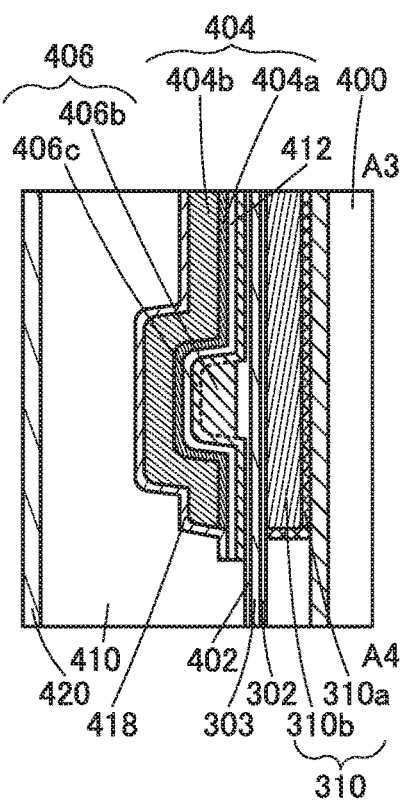
Figure 2B:
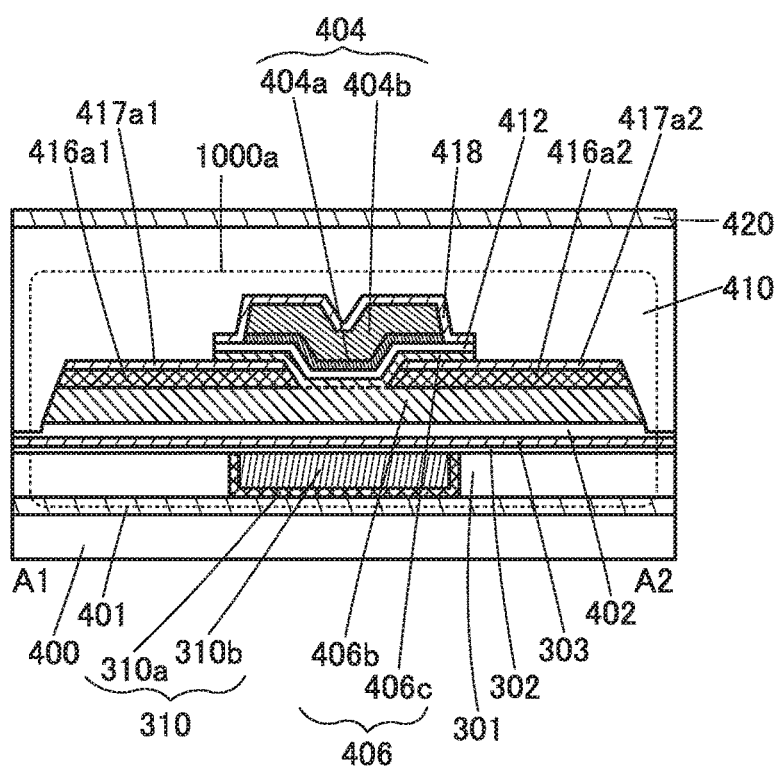

FIG. 2A is a top view of a semiconductor device including the transistor 1000a. FIG. 2B is a cross-sectional view of a portion indicated by a dashed-dotted line A1-A2 in FIG. 2A, illustrating a cross section of the transistor 1000a in a channel length direction. FIG. 2C is a cross-sectional view of a portion indicated by a dashed-dotted line A3-A4 in FIG. 2A, illustrating a cross section of the transistor 1000a in a channel width direction. Note that for simplification of the drawing, some components are not illustrated in the top view in FIG. 2A.

The semiconductor device of one embodiment of the present invention includes a substrate 400, an insulator 401 over the substrate 400, the transistor 1000a over the insulator 401, an insulator 410 over the transistor 1000a, and an insulator 420 over the insulator 410.

The transistor 1000a includes a conductor 310 and an insulator 301 over the insulator 401; an insulator 302 over the conductor 310 and the insulator 301; an insulator 303 over the insulator 302; an insulator 402 over the insulator 303; an oxide 406b over the oxide 402; the conductor 416a1 and the conductor 416a2 each including a region in contact with a top surface of the oxide 406b; a barrier film 417a1 over the conductor 416a1; a barrier film 417a2 over the conductor 416a2; an oxide 406c including a region in contact with a side surface of the conductor 416a1, a side surface of the conductor 416a2, a side surface of the barrier film 417a1, a side surface of the barrier film 417a2, and a top surface of the oxide 406b; an insulator 412 over the oxide 406c; a conductor 404 including a region overlapping with the top surface of the oxide 406b with the oxide 406c and the insulator 412 therebetween; and an insulator 418 over the conductor 404. The insulator 301 has an opening, and the conductor 310a and the conductor 310b are provided in the opening.

In the cross-sectional view in the channel length direction in FIG. 2B, end portions of the insulator 418, end portions of the insulator 412, and end portions of the oxide 406c are aligned and positioned over the barrier film 417a1 and the barrier film 417a2. In the cross-sectional view in the channel width direction in FIG. 2C, an end portion of the insulator 418, an end portion of the insulator 412, and an end portion of the oxide 406c are aligned and positioned over the insulator 402.

The transistor 1000a of this semiconductor device does not include the oxide 406a which is included in the transistor 1000. The description of the transistor 1000 can be referred to for the other structure, functions, and effects of the transistor 1000a.

Structure Example 3 of Semiconductor Device

An example of a semiconductor device including a transistor 1000b of one embodiment of the present invention is described below.

Figure 3A:
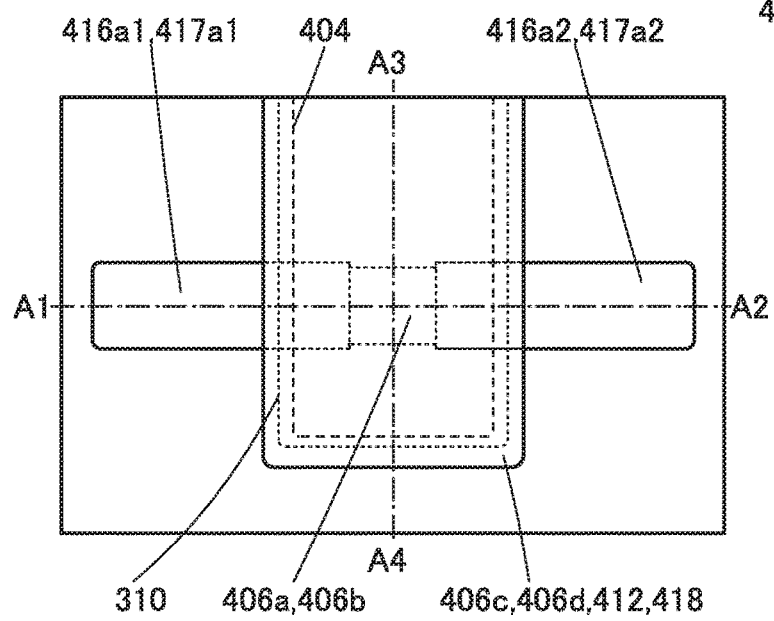
FIGS. 3A to 3C are a top view and cross-sectional views illustrating a transistor of one embodiment of the present invention.
Figure 3C:
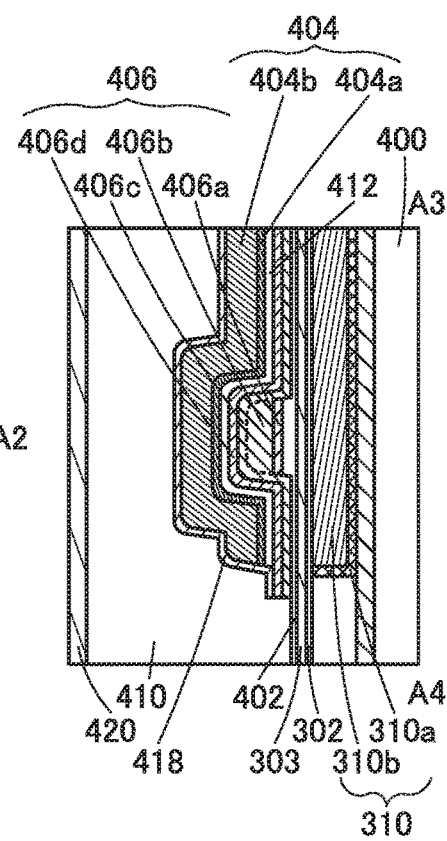
Figure 3B:
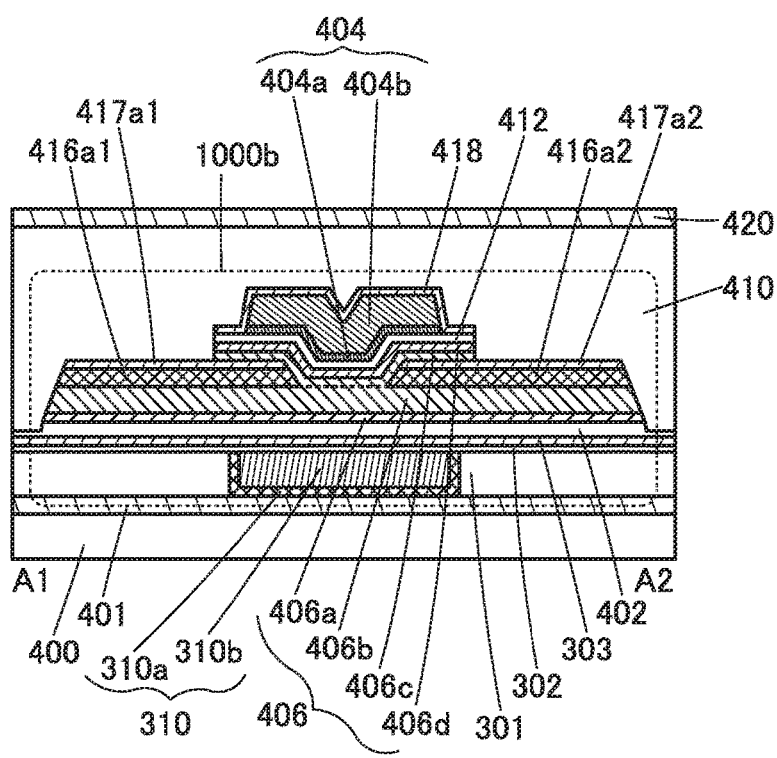

FIG. 3A is a top view of a semiconductor device including the transistor 1000b. FIG. 3B is a cross-sectional view of a portion indicated by a dashed-dotted line A1-A2 in FIG. 3A, illustrating a cross section of the transistor 1000b in a channel length direction. FIG. 3C is a cross-sectional view of a portion indicated by a dashed-dotted line A3-A4 in FIG. 3A, illustrating a cross section of the transistor 1000b in a channel width direction. Note that for simplification of the drawing, some components are not illustrated in the top view in FIG. 3A.

The semiconductor device of one embodiment of the present invention includes a substrate 400, an insulator 401 over the substrate 400, the transistor 1000b over the insulator 401, an insulator 410 over the transistor 1000b, and an insulator 420 over the insulator 410.

The transistor 1000b includes a conductor 310 and an insulator 301 over the insulator 401; an insulator 302 over the conductor 310 and the insulator 301; an insulator 303 over the insulator 302; an insulator 402 over the insulator 303; an oxide 406a over the insulator 402; an oxide 406b over the oxide 406a; the conductor 416a1 and the conductor 416a2 each including a region in contact with a top surface of the oxide 406b; a barrier film 417a1 over the conductor 416a1; a barrier film 417a2 over the conductor 416a2; an oxide 406c including a region in contact with a side surface of the conductor 416a1, a side surface of the conductor 416a2, a side surface of the barrier film 417a1, a side surface of the barrier film 417a2, and a top surface of the conductor 406b; an oxide 406d over the oxide 406c; the insulator 412 over the oxide 406d; a conductor 404 including a region overlapping with the top surface of the oxide 406b with the oxide 406c, the oxide 406d, and the insulator 412 positioned therebetween; and an insulator 418 over the conductor 404. The insulator 301 has an opening, and the conductor 310a and the conductor 310b are provided in the opening.

In the cross-sectional view in the channel length direction in FIG. 3B, end portions of the insulator 418, end portions of the insulator 412, end portions of the oxides 406c, and end portions of the oxides 406d are aligned and positioned over the barrier film 417a1 and the barrier film 417a2. In the cross-sectional view in the channel width direction in FIG. 3C, an end portion of the insulator 418, an end portion of the insulator 412, an end portion of the oxide 406c, and an end portion of the oxide 406d are aligned and positioned over the insulator 402.

The transistor 1000b included in the semiconductor device includes the oxide 406d. In the transistor 1000b, the conductor 404 serves as a first gate electrode. The conductor 404 can have a stacked-layer structure including a conductor 404a and a conductor 404b. For example, when the conductor 404a having a function of inhibiting the passage of oxygen is formed under the conductor 404b, oxidation of the conductor 404b can be prevented. Alternatively, the conductor 404 preferably includes a metal having resistance to oxidation. Alternatively, an oxide conductor or the like may be used. The insulator 412 serves as a first gate insulator.

The conductors 416a1 and 416a2 function as a source electrode and a drain electrode of the transistor. The conductors 416a1 and 416a2 can each have a stacked-layer structure including a conductor having a function of inhibiting the passage of oxygen. For example, when a conductor having a function of inhibiting the passage of oxygen is formed as an upper layer, oxidation of the conductors 416a1 and 416a2 can be prevented. Alternatively, the conductor 416a1 and the conductor 416a2 preferably contain a metal having resistance to oxidation. Alternatively, an oxide conductor e or the like may be used.

The barrier films 417a1 and 417a2 each have a function of inhibiting the passage of oxygen and impurities such as hydrogen and water. The barrier film 417a1 is located over the conductor 416a1 and prevents diffusion of oxygen into the conductor 416a1. The barrier film 417a2 is located over the conductor 416a2 and prevents diffusion of oxygen into the conductor 416a2.

In the transistor 1000b, the oxide 406b, the oxide 406c, and the oxide 406d serve as a channel formation region. That is, in the transistor 1000b, the resistance of the oxide 406b, the oxide 406c, and the oxide 406d can be controlled by a potential applied to the conductor 404. That is, conduction or non-conduction between the conductor 416a1 and the conductor 416a2 can be controlled by the potential applied to the conductor 404.

As illustrated in FIG. 3C, the conductor 404 functioning as the first gate electrode is provided so as to cover the whole oxide 406b, part of the oxide 406c, and part of the oxide 406d with the insulator 412 functioning as the first gate insulator positioned therebetween. Thus, the whole oxide 406b, part of the oxide 406c, and part of the oxide 406d can be electrically surrounded by an electric field of the conductor 404 functioning as the first gate electrode. Such a transistor structure in which a channel formation region is electrically surrounded by an electric field of a first gate electrode is referred to as a surrounded channel (s-channel) structure.

Furthermore, as illustrated in FIG. 3B, the conductors 416a1 and 416a2 which serve as a source electrode and a drain electrode are sandwiched between the oxide 406b and the oxide 406c. This structure can increase the area in contact with the source electrode and the drain electrode. Therefore, the contact area between the oxides 406b and 406c and the conductors 416a1 and 416a2 is large, which is preferable because the contact resistance can be low.

The oxide 406 is preferably formed using a metal oxide functioning as an oxide semiconductor (hereinafter, the metal oxide is also referred to as an oxide semiconductor). However, silicon (including strained silicon), germanium, silicon germanium, silicon carbide, gallium arsenide, aluminum gallium arsenide, indium phosphide, gallium nitride, an organic semiconductor, or the like may be used instead of the oxides.

A transistor formed using an oxide semiconductor has an extremely low leakage current in an off state; thus, a semiconductor device with low power consumption can be provided. An oxide semiconductor can be formed by a sputtering method or the like and thus can be used in a transistor included in a highly integrated semiconductor device.

However, the transistor formed using an oxide semiconductor is likely to have its electrical characteristics changed by impurities and oxygen vacancies in the oxide semiconductor; as a result, the reliability is reduced, in some cases. Hydrogen contained in an oxide semiconductor reacts with oxygen bonded to a metal atom to be water, and thus causes an oxygen vacancy, in some cases. Entry of hydrogen into the oxygen vacancy generates an electron serving as a carrier in some cases. Accordingly, a transistor including an oxide semiconductor containing oxygen vacancies is likely to have normally-on characteristics. Thus, it is preferable that oxygen vacancies in the oxide semiconductor be reduced as much as possible.

An oxide semiconductor preferably contains at least indium or zinc. In particular, indium and zinc are preferably contained. In addition, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, and the like may be contained.

Here, the case where the oxide semiconductor is an In-M-Zn oxide that contains indium, an element M, and zinc is considered. The element M is aluminum, gallium, yttrium, tin, or the like. Examples of other elements that can be used as the element M include boron, silicon, titanium, iron, nickel, germanium, zirconium, molybdenum, lanthanum, cerium, neodymium, hafnium, tantalum, tungsten, and magnesium. Note that two or more of the above elements may be used in combination as the element M.

Note that in this specification and the like, a metal oxide including nitrogen is also called a metal oxide in some cases. Moreover, a metal oxide including nitrogen may be called a metal oxynitride.

Here, each of the In-M-Zn oxides used for the oxide 406b and the oxide 406c preferably includes more In atoms than element M atoms. Use of such an oxide increases the mobility of the transistor 1000b and the carrier density.

For example, oxide semiconductors with the same composition or similar compositions are preferably used for the oxide 406b and the oxide 406c. Alternatively, for example, the oxide 406b and the oxide 406c are preferably formed using sputtering targets with the same composition or substantially the same compositions. Alternatively, for example, the oxide 406b and the oxide 406c are preferably formed under substantially the same process conditions (e.g., deposition temperature and an oxygen proportion).

Alternatively, for example, the oxide 406b and the oxide 406c may be formed using sputtering targets with different compositions. For example, when the process conditions (e.g., deposition temperature and an oxygen proportion) for the oxide 406b and the oxide 406c are adjusted as appropriate, the oxide 406b and the oxide 406c can be oxide semiconductors with the same composition or similar compositions in some cases. Oxide semiconductors with more similar compositions are preferred as the oxide 406b and the oxide 406c in some cases, while desired thicknesses and functions are different and thus the optimum deposition conditions are also different in some cases. For this reason, sputtering targets with different compositions are preferred over sputtering targets with the same composition or similar compositions in some cases because compositions of the oxide 406b and the oxide 406c formed using the former can be closer to each other than those formed using the latter.

The oxide 406b and the oxide 406c with the same composition or similar compositions can have the same electron affinity or a small difference in electron affinity. In particular, when not only the compositions but also the process conditions are substantially the same, the oxide 406b and the oxide 406c have the same electron affinity or a small difference in electron affinity. Accordingly, the interface state density between the oxide 406b and the oxide 406c can be low. Low interface state density can prevent a decrease in on-state current of the transistor 1000. Note that the electron affinity can be also called energy value Ec of the conduction band minimum. A difference between Ec of the oxide 406b and Ec of the oxide 406c is preferably small, and preferably greater than or equal to 0 eV and less than or equal to 0.15 eV, more preferably greater than or equal to 0 V and less than or equal to 0.07 eV.

For example, oxide semiconductors with different Ec are preferably used for the oxide 406c and the oxide 406d. Specifically, for example, it is preferable that the Ec of the oxide 406d be smaller than that of the oxide 406c and a difference between the Ec of the oxide 406d and that of the oxide 406c be greater than or equal to 0.2 eV and less than or equal to 0.4 eV. With this structure, a buried channel structure can be achieved. That is, a path in which the amount of current flowing at or near the interface between the oxide 406c and the oxide 406d is larger than the amount of current flowing at or near the interface between the oxide 406d and the insulator 412 is formed. Accordingly, in the current path, the number of trap states at or near the interface can be reduced. As a result, the on-state current can be increased and the reliability can be improved.

The In-M-Zn oxide used for the oxide 406d preferably includes, for example, more element M atoms than In atoms. Such a composition of the oxide 406d can make the Ec of the oxide 406c and that of the oxide 406d different.

Alternatively, for example, the oxide 406c and the oxide 406d may be formed using sputtering targets with substantially the same compositions under different process conditions. Alternatively, the oxide 406c and the oxide 406d may be formed using sputtering targets with the same composition under different process conditions. Thus, the Ec of the oxide 406c and that of the oxide 406d can be different in some cases.

Alternatively, for example, the oxide 406b, the oxide 406c, and the oxide 406d may be formed using sputtering targets with substantially the same compositions under different process conditions. For example, the oxide 406b and the oxide 406c may be formed under substantially the same process conditions, and the oxide 406c and the oxide 406d may be formed under different process conditions.

Alternatively, for example, oxide semiconductors with substantially the same compositions may be used for the oxide 406a and the oxide 406d. Alternatively, for example, the oxide 406a and the oxide 406d may be formed using sputtering targets with the same composition or substantially the same compositions. Alternatively, for example, the oxide 406a and the oxide 406d may be formed under substantially the same process conditions (e.g., deposition temperature and an oxygen proportion). Alternatively, for example, the oxide 406a and the oxide 406d may be formed using sputtering targets with different compositions. For example, when the process conditions (e.g., deposition temperature and an oxygen proportion) for the oxide 406a and the oxide 406d are adjusted as appropriate, the oxide 406a and the oxide 406d can be oxide semiconductors with the same composition or similar compositions in some cases. Note that in these cases, for the oxide 406d and the oxide 406b, oxide semiconductors with different compositions may be used or oxide semiconductors with substantially the same compositions may be used.

Alternatively, for example, the oxide 406a, the oxide 406b, the oxide 406c, and the oxide 406d may be formed using sputtering targets with substantially the same compositions under different process conditions. For example, the oxide 406b and the oxide 406c may be formed under substantially the same process conditions, and the oxide 406a and the oxide 406d may be formed under different process conditions.

In the structure of the transistor 1000b, process damage might be caused on a top surface or a side surface of the oxide 406b when the source electrode and the drain electrode are formed. That is, a defect due to the process damage might be caused at or near the interface between the oxide 406b and the oxide 406c. Since oxide semiconductors with the same composition or similar compositions are used for the oxide 406b and the oxide 406c and thus the difference between the Ec of the oxide 406b and the Ec of the oxide 406c is small, a channel formation region is formed not only at or near the interface between the oxide 406b and the oxide 406c but also at or near the interface between the oxide 406c and the oxide 406d whose Ec is smaller than that of the oxide 406c.

Therefore, influence of the interface between the oxide 406b subjected to the process damage and the oxide 406c and the vicinity of the interface can be small. Furthermore, an oxide to be the oxide 406c, an oxide to be the oxide 406d, and an insulator to be the insulator 412 that serves as the first gate insulator are stacked, and then processed into the oxide 406c, the oxide 406d, and the insulator 412, in which case the interface between the oxide 406c and the oxide 406d, the vicinity thereof, the interface between the oxide 406d and the insulator 412, and the vicinity thereof are favorable without being influenced by the process damage.

Accordingly, the reliability of the transistor 1000b can be improved. In addition, since the oxide 406b, part of the oxide 406c, and part of the oxide 406d are surrounded by the electric field of the conductor 404, current in an off state (off-state current) can be decreased.

The description of the transistor 1000 can be referred to for the other structure, functions, and effects of the transistor 1000b.

Structure Example 4 of Semiconductor Device

An example of a semiconductor device including a transistor 1000c of one embodiment of the present invention is described below.

Figure 4A:
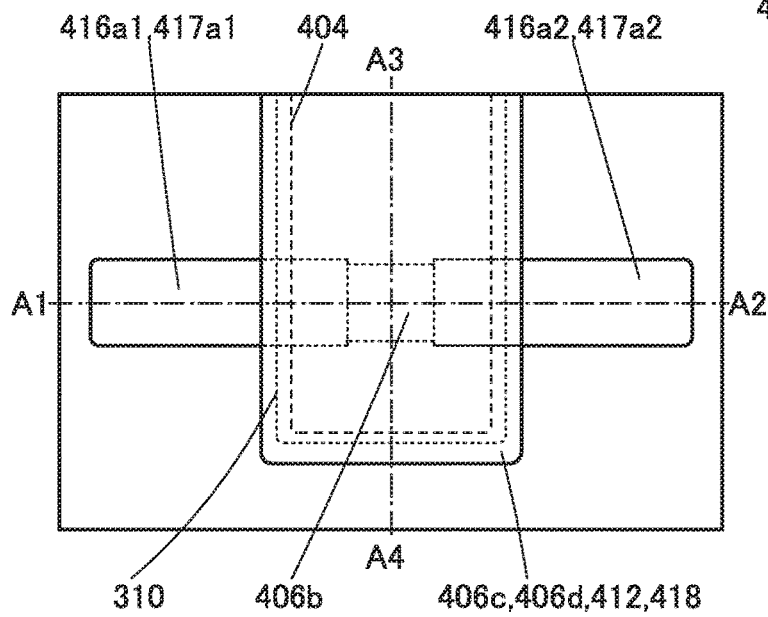
FIGS. 4A to 4C are a top view and cross-sectional views illustrating a transistor of one embodiment of the present invention.
Figure 4C:
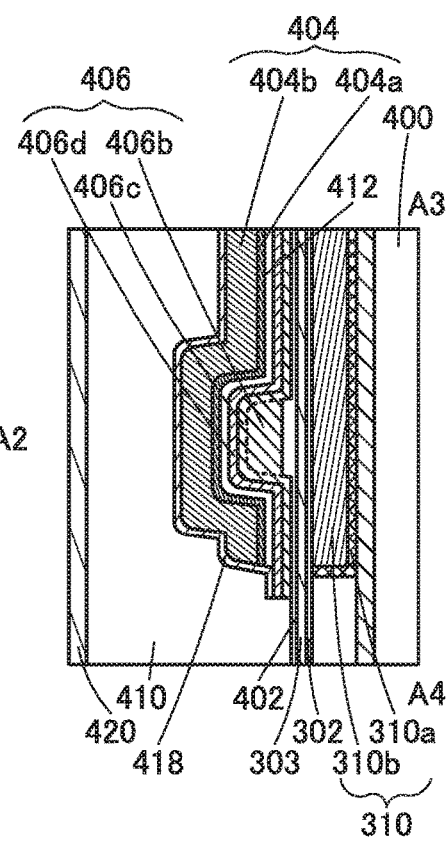
Figure 4B:
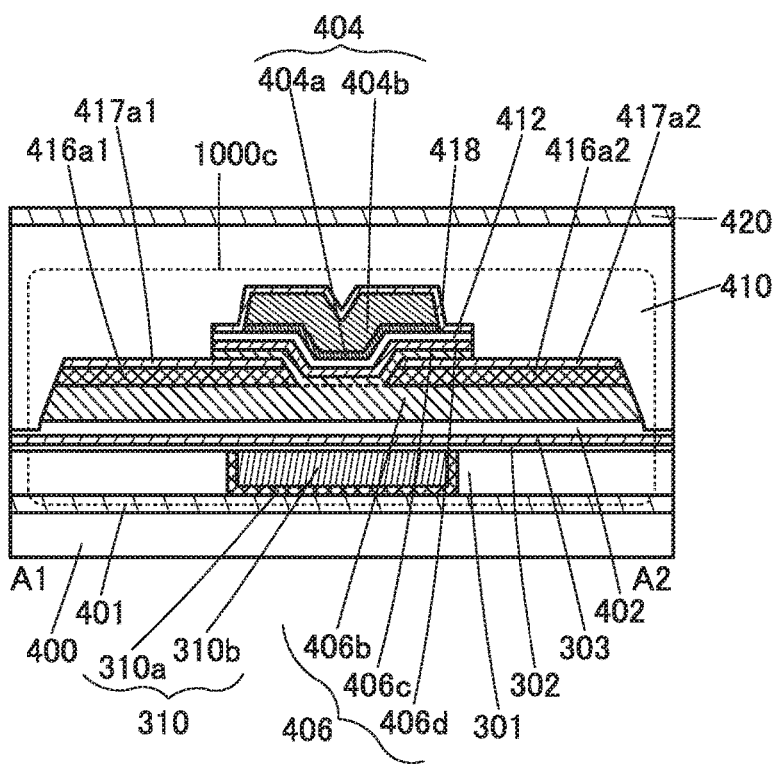

FIG. 4A is a top view of a semiconductor device including the transistor 1000c. FIG. 4B is a cross-sectional view of a portion indicated by a dashed-dotted line A1-A2 in FIG. 4A, illustrating a cross section of the transistor 1000c in a channel length direction. FIG. 4C is a cross-sectional view of a portion indicated by a dashed-dotted line A3-A4 in FIG. 4A, illustrating a cross section of the transistor 1000c in a channel width direction. Note that for simplification of the drawing, some components are not illustrated in the top view in FIG. 4A.

The semiconductor device of one embodiment of the present invention includes a substrate 400, an insulator 401 over the substrate 400, the transistor 1000c over the insulator 401, an insulator 410 over the transistor 1000c, and an insulator 420 over the insulator 410.

The transistor 1000c includes a conductor 310 and an insulator 301 over the insulator 401; an insulator 302 over the conductor 310 and the insulator 301; an insulator 303 over the insulator 302; an insulator 402 over the insulator 303; an oxide 406b over the insulator 402; the conductor 416a1 and the conductor 416a2 each including a region in contact with a top surface of the oxide 406b; a barrier film 417a1 over the conductor 416a1; a barrier film 417a2 over the conductor 416a2; an oxide 406c including a region in contact with a side surface of the conductor 416a1, a side surface of the conductor 416a2, a side surface of the barrier film 417a1, a side surface of the barrier film 417a2, and a top surface of the oxide 406b; an oxide 406d over the oxide 406c; the insulator 412 over the oxide 406d; a conductor 404 including a region overlapping with the top surface of the oxide 406b with the oxide 406c, the oxide 406d, and the insulator 412 therebetween; and an insulator 418 over the conductor 404. The insulator 301 has an opening, and the conductor 310a and the conductor 310b are provided in the opening.

In the cross-sectional view in the channel length direction in FIG. 4B, end portions of the insulator 418, end portions of the insulator 412, end portions of the oxide 406d, and end portions of the oxide 406c are aligned and positioned over the barrier film 417a1 and the barrier film 417a2. In the cross-sectional view in the channel width direction in FIG. 4C, an end portion of the insulator 418, an end portion of the insulator 412, an end portion of the oxide 406c, and an end portion of the oxide 406d are aligned and positioned over the insulator 402.

The transistor 1000c of this semiconductor device does not include the oxide 406a which is included in the transistor 1000b. The description of the transistor 1000b can be referred to for the other structure, functions, and effects of the transistor 1000c.

Structure Example 5 of Semiconductor Device

An example of a semiconductor device including a transistor 1000d of one embodiment of the present invention is described below.

Figure 5A:
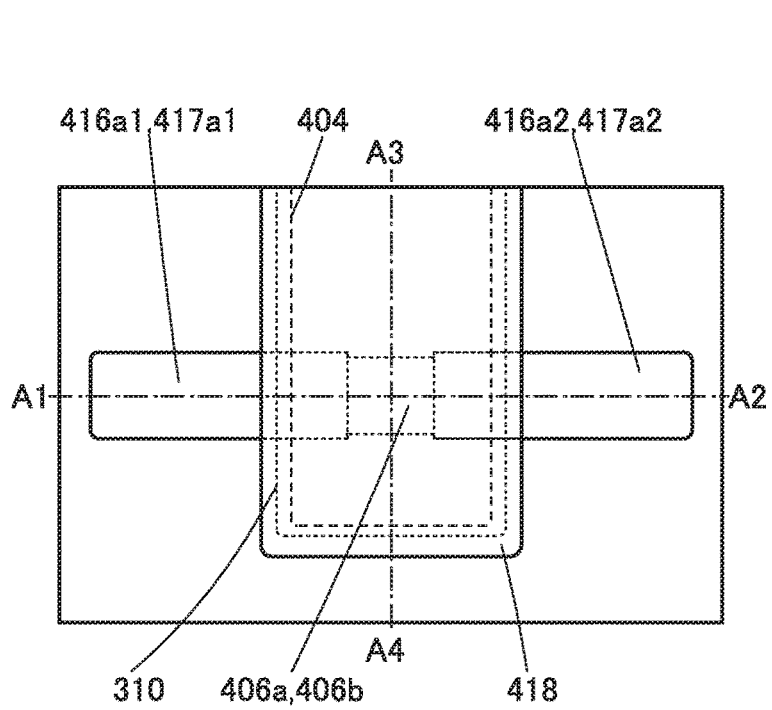
FIGS. 5A to 5C are a top view and cross-sectional views illustrating a transistor of one embodiment of the present invention.
Figure 5C:
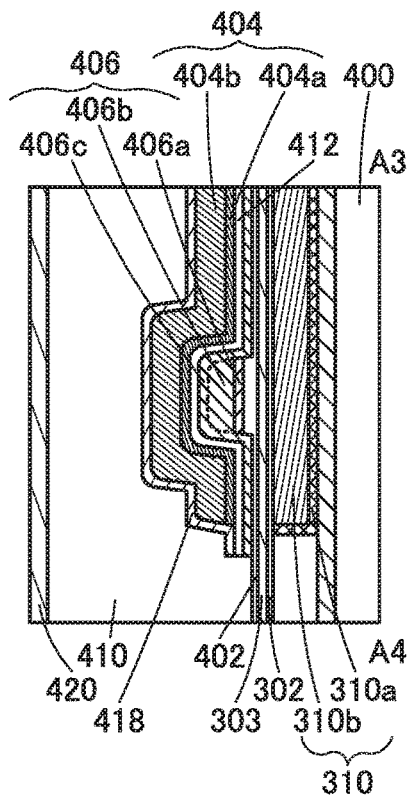
Figure 5B:
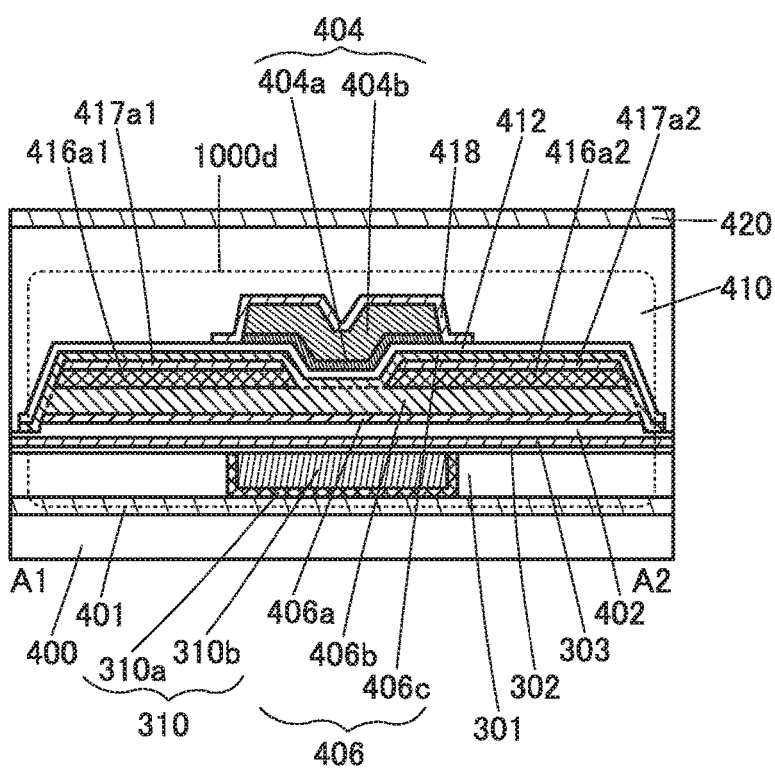

FIG. 5A is a top view of a semiconductor device including the transistor 1000d. FIG. 5B is a cross-sectional view of a portion indicated by a dashed-dotted line A1-A2 in FIG. 5A, illustrating a cross section of the transistor 1000d in a channel length direction. FIG. 5C is a cross-sectional view of a portion indicated by a dashed-dotted line A3-A4 in FIG. 5A, illustrating a cross section of the transistor 1000d in a channel width direction. Note that for simplification of the drawing, some components are not illustrated in the top view in FIG. 5A.

The semiconductor device of one embodiment of the present invention includes a substrate 400, an insulator 401 over the substrate 400, the transistor 1000d over the insulator 401, an insulator 410 over the transistor 1000d, and an insulator 420 over the insulator 410.

The transistor 1000d includes a conductor 310 and an insulator 301 over the insulator 401; an insulator 302 over the conductor 310 and the insulator 301; an insulator 303 over the insulator 302; an insulator 402 over the insulator 303; an oxide 406a over the insulator 402; an oxide 406b over the oxide 406a; the conductor 416a1 and the conductor 416a2 each including a region in contact with a top surface of the oxide 406b; a barrier film 417a1 over the conductor 416a1; a barrier film 417a2 over the conductor 416a2; an oxide 406c including a region in contact with a side surface of the conductor 416a1, a side surface of the conductor 416a2, a side surface of the barrier film 417a1, a side surface of the barrier film 417a2, and a top surface of the oxide 406b; an insulator 412 over the oxide 406c; a conductor 404 including a region overlapping with the top surface of the oxide 406b with the oxide 406c and the insulator 412 therebetween; and an insulator 418 over the conductor 404. The insulator 301 has an opening, and the conductor 310a and the conductor 310b are provided in the opening.

In FIGS. 5B and 5C, the end portions of the insulator 412, and end portions of the oxide 406c are aligned and positioned over the insulator 402. Since the oxide 406c is disposed to cover the side surface of the conductor 416a1 and the side surface of the conductor 416a2, oxidation of the side surface of the conductor 416a1 and the side surface of the conductor 416a2 can be prevented.

The description of the transistor 1000 can be referred to for the other structure, functions, and effects of the transistor 1000d.

Structure Example 6 of Semiconductor Device

An example of a semiconductor device including a transistor 1000e of one embodiment of the present invention is described below.

Figure 6A:
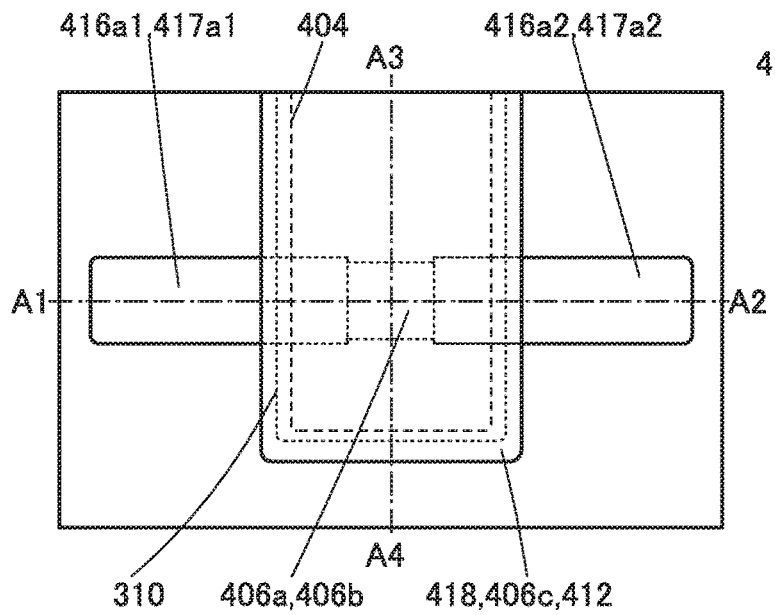
FIGS. 6A to 6C are a top view and cross-sectional views illustrating a transistor of one embodiment of the present invention.
Figure 6C:
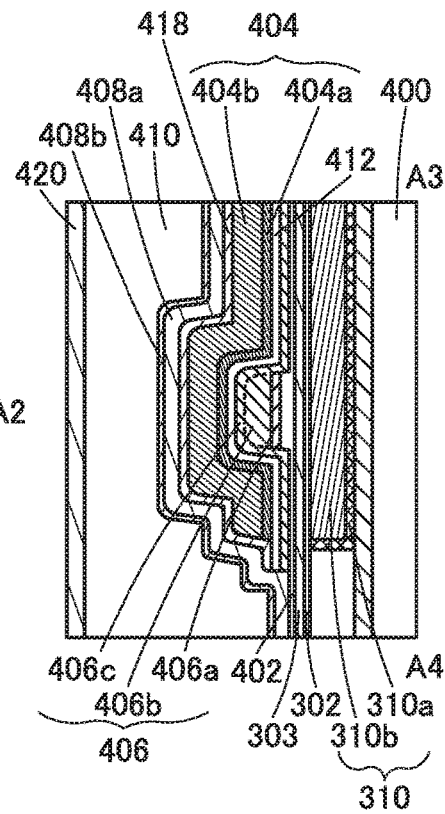
Figure 6B:
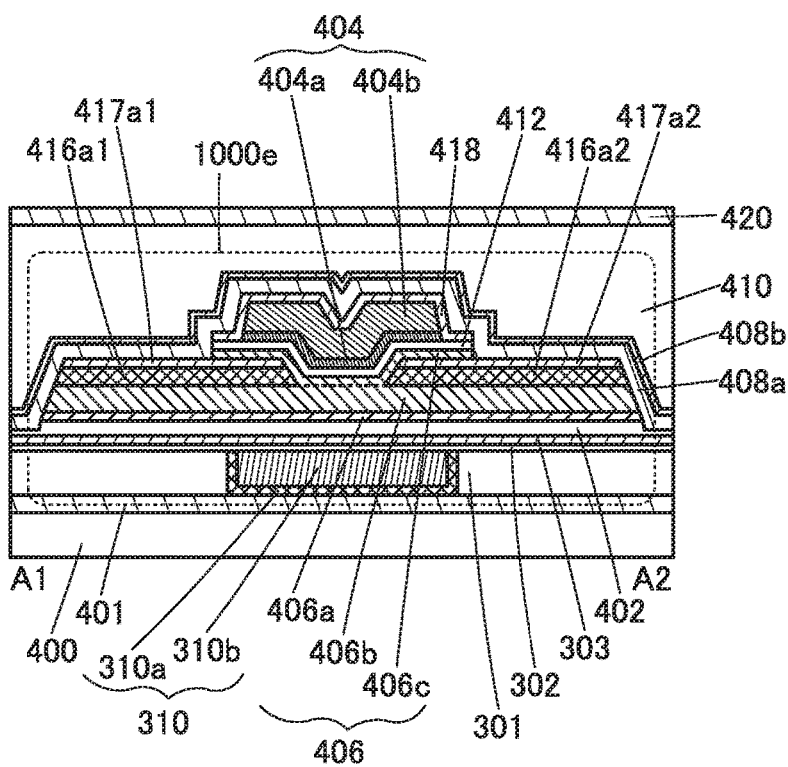
Figure 7A:
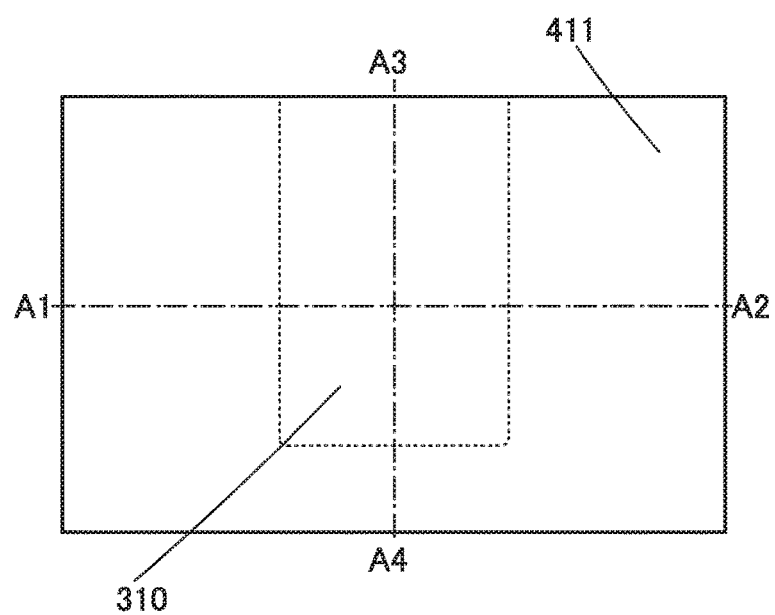
FIGS. 7A to 7C illustrate a method of manufacturing a transistor of one embodiment of the present invention.
Figure 7C:
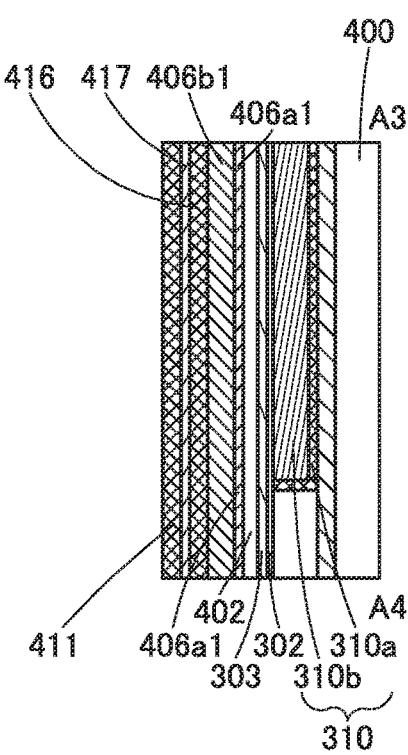
Figure 7B:
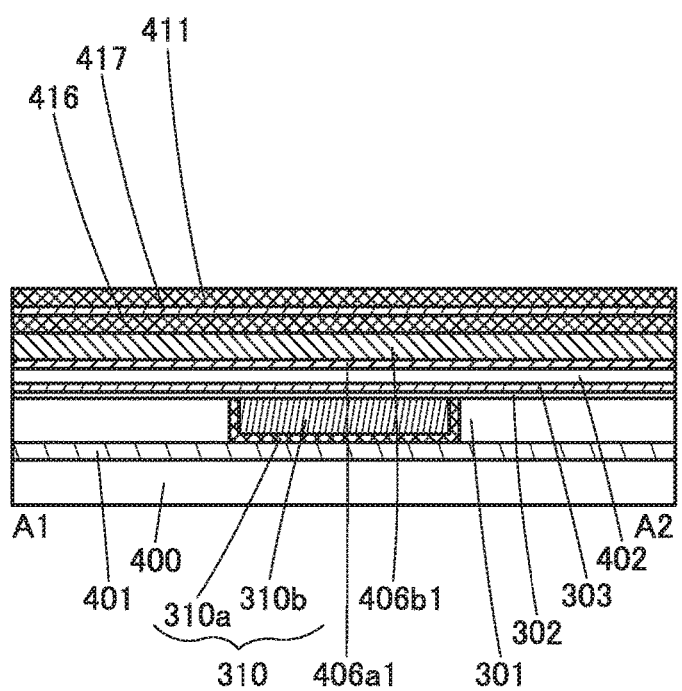
Figure 8A:
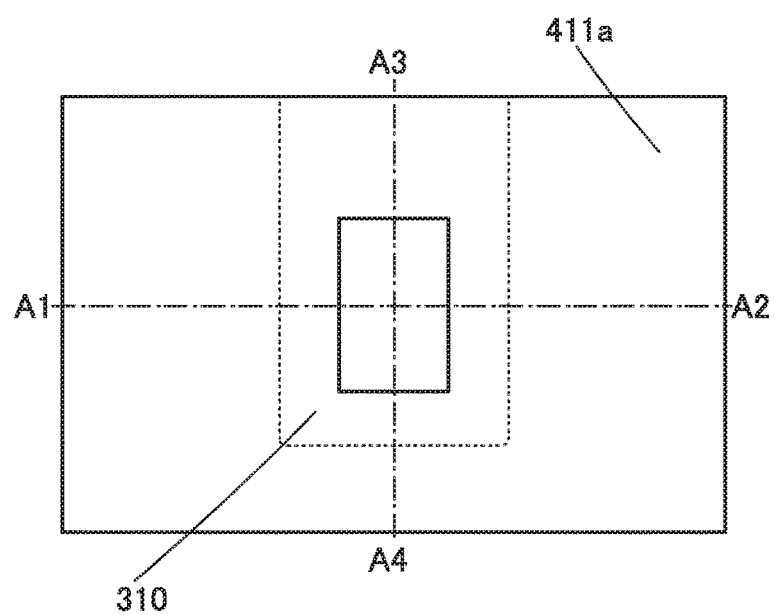
FIGS. 8A to 8C illustrate a method of manufacturing a transistor of one embodiment of the present invention.
Figure 8C:
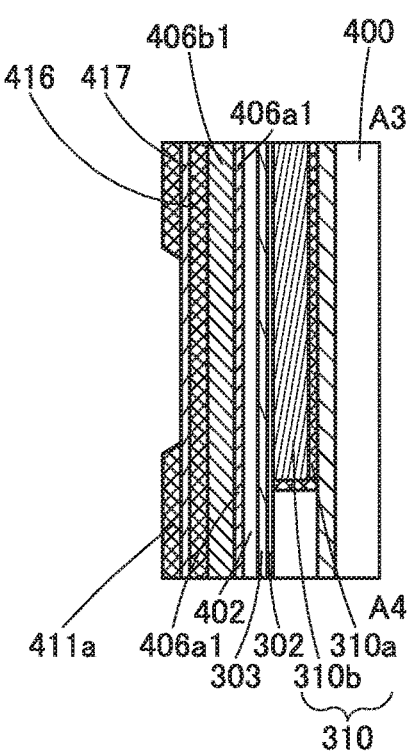
Figure 8B:
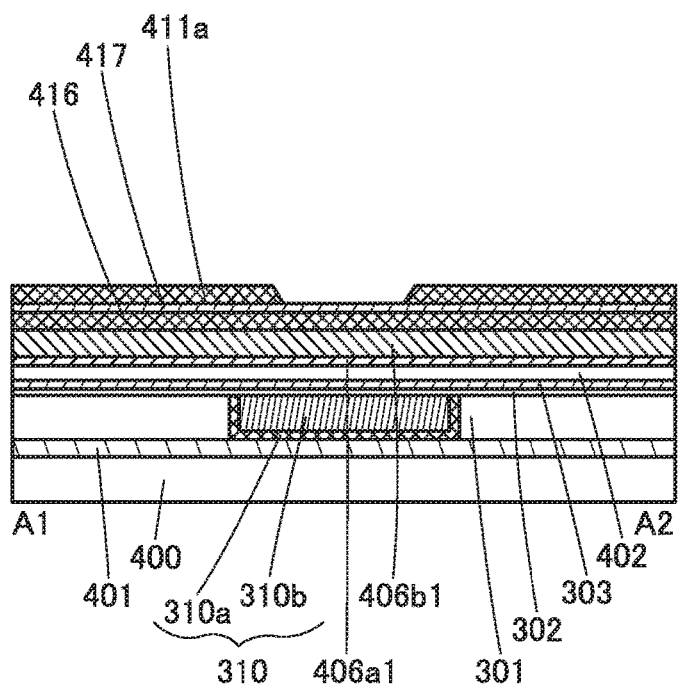

FIG. 6A is a top view of a semiconductor device including the transistor 1000e. FIG. 6B is a cross-sectional view of a portion indicated by a dashed-dotted line A1-A2 in FIG. 6A, illustrating a cross section of the transistor 1000e in a channel length direction. FIG. 6C is a cross-sectional view of a portion indicated by a dashed-dotted line A3-A4 in FIG. 6A, illustrating a cross section of the transistor 1000e in a channel width direction. Note that for simplification of the drawing, some components are not illustrated in the top view in FIG. 6A.

The semiconductor device of one embodiment of the present invention includes a substrate 400, an insulator 401 over the substrate 400, the transistor 1000e over the insulator 401, an insulator 408a over the transistor 1000e, an insulator 408b over the insulator 408a, the insulator 410 over the insulator 408b, and an insulator 420 over the insulator 410.

For the insulator 408a, a metal oxide that is formed by a sputtering method is preferably used, and for example, aluminum oxide is preferably used. The insulator 408a enables oxygen to be added to a surface at which the insulator 408a and the insulator 402 are in contact with each other, and thus, the insulator 402 can be brought into an oxygen excess state. The oxygen can be effectively supplied, by heat treatment or the like, to the channel formation region in the oxide 406 through the insulator 402. The oxygen is supplied to the oxide 406 in this manner, whereby oxygen vacancies in the oxide 406 can be reduced. Since the oxide 406 and the insulator 402 including excess oxygen are provided in contact with each other, oxygen can be supplied to the oxide 406 uniformly. Thus, the transistor 1000e can have favorable characteristics.

In addition, when a metal oxide that has a function of inhibiting the passage of oxygen, such as aluminum oxide, is used for the insulator 408a, the oxygen added to the insulator 402 can be prevented from being diffused upward during deposition. Accordingly, oxygen can be added to the insulator 402 more efficiently. The insulator 408b may be provided over the insulator 408a. For the insulator 408b, a metal oxide that is formed by an atomic layer deposition (ALD) method is preferably used, and for example, aluminum oxide is preferably used. Since a film that is formed by an ALD method has an excellent coverage, the oxygen added to the insulator 402 can be further prevented from being diffused upward during deposition. The insulator 402 is formed using an insulating material that is more likely to transmit oxygen than the insulator 408a or the insulator 408b. For example, silicon oxide or silicon oxynitride can be used.

The description of the transistor 1000 can be referred to for the other structure, functions, and effects of the transistor 1000e.

Structure Example 7 of Semiconductor Device

An example of a semiconductor device including a transistor 2000 of one embodiment of the present invention is described below. The transistor 2000 includes the oxide 406d and can be formed over the substrate over which the semiconductor device including the transistor 1000b is formed.

Figure 15A:
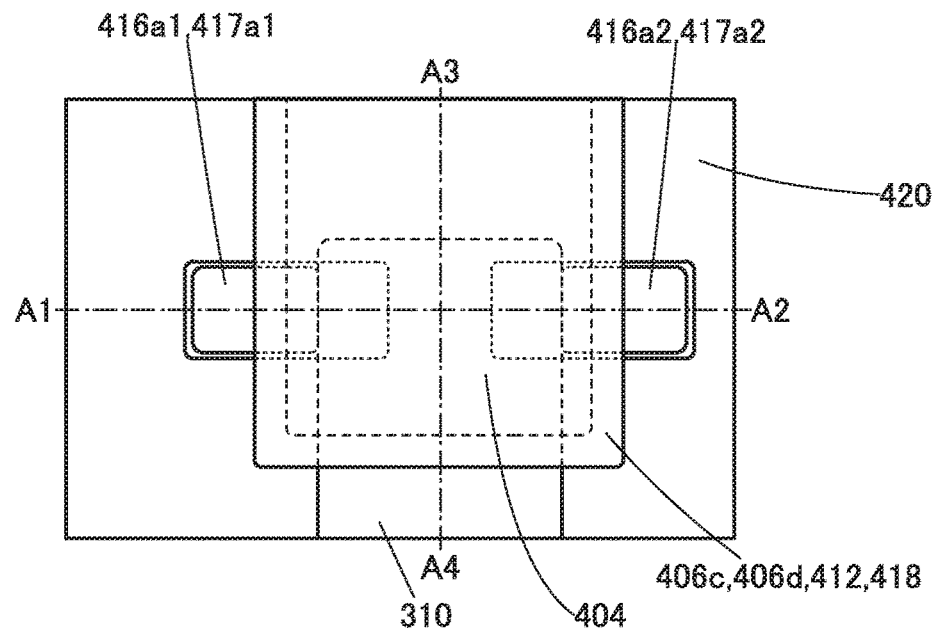
FIGS. 15A to 15C are a top view and cross-sectional views illustrating a transistor of one embodiment of the present invention.
Figures 15B, 15C:
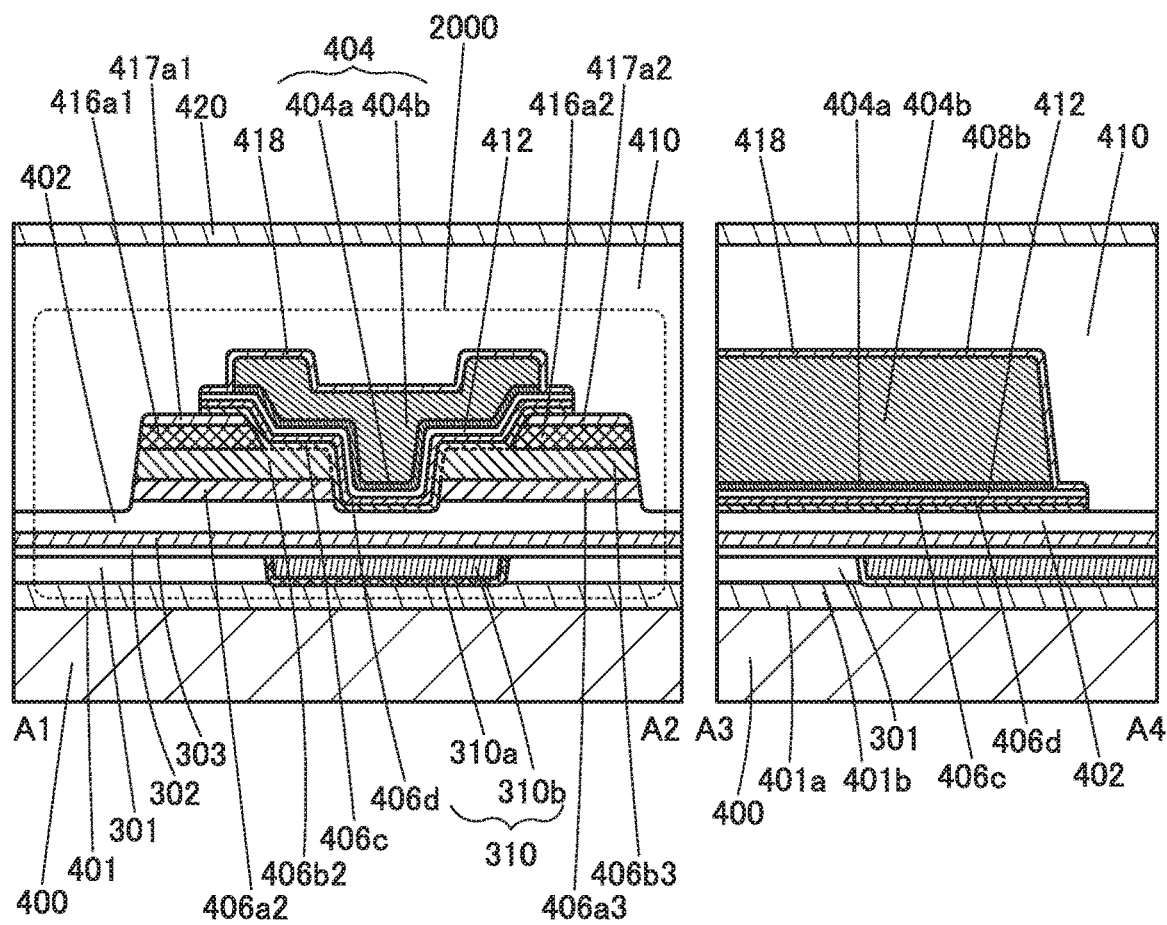

FIG. 15A is a top view of a semiconductor device including the transistor 2000. FIG. 15B is a cross-sectional view of a portion indicated by a dashed-dotted line A1-A2 in FIG. 15A, illustrating a cross section of the transistor 2000 in a channel length direction. FIG. 15C is a cross-sectional view of a portion indicated by a dashed-dotted line A3-A4 in FIG. 15A, illustrating a cross section of the transistor 2000 in a channel width direction. Note that for simplification of the drawing, some components are not illustrated in the top view in FIG. 15A.

The semiconductor device of one embodiment of the present invention includes a substrate 400, an insulator 401 over the substrate 400, the transistor 2000 over the insulator 401, an insulator 410 over the transistor 2000, and an insulator 420 over the insulator 410.

The transistor 2000 includes the conductor 310 and the insulator 301 over the insulator 401, the insulator 302 over the conductor 310 and the insulator 301, the insulator 303 over the insulator 302, the insulator 402 over the insulator 303, an oxide 406a2 and an oxide 406a3 over the insulator 402, an oxide 406b2 and an oxide 406b3 over the oxide 406a2 and the oxide 406a3, the conductor 416a1 including a region in contact with a top surface of the oxide 406b2, the conductor 416a2 including a region in contact with a top surface of the oxide 406b3, the barrier film 417a1 over the conductor 416a1, the barrier film 417a2 over the conductor 416a2, the oxide 406c including a region in contact with a side surface of the conductor 416a1, a side surface of the conductor 416a2, a top surface and a side surface of the oxide 406b2, a top surface and a side surface of the oxide 406b3, a side surface of the oxide 406a2, and a side surface of the oxide 406a3, the oxide 406d over the oxide 406c, the insulator 412 over the oxide 406d, the conductor 404 over the insulator 412, and the insulator 418 over the conductor 404. The insulator 301 has an opening, and the conductor 310a and the conductor 310b are provided in the opening.

In the transistor 2000, the conductor 404 serves as a first gate electrode. The conductor 404 can have a stacked-layer structure including a conductor 404a and a conductor 404b. Furthermore, the conductor 404 can have a stacked-layer structure including three or more layers. For example, when the conductor 404a having a function of inhibiting the passage of oxygen is formed under the conductor 404b, oxidation of the conductor 404b can be prevented. Alternatively, for example, the conductor 404 preferably includes a metal having resistance to oxidation. Alternatively, for example, an oxide conductor or the like may be used. Alternatively, for example, a multilayer structure including an oxide having conductivity may be employed. The insulator 412 serves as a first gate insulator.

The conductors 416a1 and 416a2 function as a source electrode and a drain electrode of the transistor. The conductors 416a1 and 416a2 can each have a stacked-layer structure including a conductor having a function of inhibiting the passage of oxygen. For example, when a conductor having a function of inhibiting the passage of oxygen is formed as an upper layer, oxidation of the conductors 416a1 and 416a2 can be prevented. Alternatively, the conductor 416a1 and the conductor 416a2 preferably contain a metal having resistance to oxidation. Alternatively, an oxide conductor e or the like may be used.

The barrier films 417a1 and 417a2 each have a function of inhibiting the passage of oxygen and impurities such as hydrogen. The barrier film 417a1 is located over the conductor 416a1 and prevents diffusion of oxygen into the conductor 416a1. The barrier film 417a2 is located over the conductor 416a2 and prevents diffusion of oxygen into the conductor 416a2.

As illustrated in FIG. 15B, in the transistor 2000, a layer including the oxide 406a2, the oxide 406b2, and the conductor 416a1 and a layer including the oxide 406a3, the oxide 406b3, and the conductor 416a2 are positioned with a region where part of a top surface of the insulator 402 and the oxide 406c are in contact with each other provided therebetween. Here, a side surface of the layer including the oxide 406a2, the oxide 406b2, and the conductor 416a1 and a side surface of the layer including the oxide 406a3, the oxide 406b3, and the conductor 416a2, which face each other, are each called one side surface, and side surfaces of the layers, which do not face each other, are each called the other side surface.

The oxide 406c includes a region in contact with the one side surface of the conductor 416a1 and a region in contact with the one side surface of the conductor 416a2. Furthermore, the oxide 406c also includes a region in contact with part of a top surface and the one side surface of the oxide 406b2, a region in contact with part of a top surface and the one side surface of the oxide 406b3, a region in contact with the one side surface of the oxide 406a2, and a region in contact with the one side surface of the oxide 406a3. That is, the one side surfaces have step-like shapes in which the conductors 416a1 and 416a2 recede from the oxides 406b2 and 406b3. The other side surfaces of the oxide 406a2, the oxide 406b2, and the conductor 416a1 are substantially aligned with one another, and the other side surfaces of the oxide 406a3, the oxide 406b3, and the conductor 416a2 are substantially aligned with one another. In other words, the other side surfaces are flat.

The transistor 2000 includes the oxide 406d and can be formed over the substrate over which the semiconductor device including the transistor 1000b is formed.

In the transistor 2000, the resistance of the oxide 406 can be controlled by a potential applied to the conductor 404. That is, conduction or non-conduction between the conductor 416a1 and the conductor 416a2 can be controlled by the potential applied to the conductor 404.

Since the channel is formed in the oxide 406c in the transistor 2000, the transistor 2000 has different characteristics from the transistor 1000b.

Since the oxide 406a is processed into the oxide 406a2 and the oxide 406a3, the oxide 406a2 and the oxide 406a3 are oxide semiconductors with the same composition. Similarly, since the oxide 406b is processed into the oxide 406b2 and the oxide 406b3, the oxide 406b2 and the oxide 406b3 are oxide semiconductors with the same composition.

Here, each of the In-M-Zn oxides used for the oxide 406b2, the oxide 406b3, and the oxide 406c preferably includes In atoms than element M atoms. Use of such an oxide is preferable because it increases the mobility of the transistor 2000 and the carrier density.

The oxides 406b2 and 406b3 and the oxide 406c with the same composition or similar compositions can have the same Ec or a small difference in Ec. Accordingly, the interface state density between the oxide 406b2 and the oxide 406c and the interface state density between the oxide 406b3 and the oxide 406c can be low. These low interface state densities can prevent a decrease in on-state current of the transistor 2000. A difference between Ec of the oxide 406b2 and Ec of the oxide 406c and a difference between Ec of the oxide 406b3 and Ec of the oxide 406c are each preferably small, and preferably greater than or equal to 0 eV and less than or equal to 0.15 eV, more preferably greater than or equal to 0 V and less than or equal to 0.07 eV.

The In-M-Zn oxide used for the oxide 406d preferably includes more element M atoms than In atoms. Therefore, an oxide semiconductor whose Ec is different from the Ec of the oxide 406c is used for the oxide 406d. It is preferable that the Ec of the oxide 406d be smaller than that of the oxide 406c and a difference between the Ec of the oxide 406d and that of the oxide 406c be greater than or equal to 0.2 eV and less than or equal to 0.4 eV.

In the structure of the transistor 2000, process damage might be caused on top surfaces or side surfaces of the oxides 406b2 and 406b3 when the source electrode and the drain electrode are formed. That is, a defect due to the process damage might be caused at or near the interface between the oxide 406b2 and the oxide 406c and the interface between the oxide 406b3 and the oxide 406c. A channel formation region is formed not only in the oxide 406c but also at or near the interface between the oxide 406c and the oxide 406d whose Ec is smaller than that of the oxide 406c.

Therefore, influence of the interface between the oxide 406b2 subjected to the process damage and the oxide 406c, the interface between the oxide 406b3 subjected to the process damage and the oxide 406c, and the vicinity of the interfaces can be small. Furthermore, an oxide to be the oxide 406c, an oxide to be the oxide 406d, and an insulator to be the insulator 412 that serves as the first gate insulator are stacked, and then processed into the oxide 406c, the oxide 406d, and the insulator 412, in which case the interface between the oxide 406c and the oxide 406d, the vicinity thereof, the interface between the oxide 406d and the insulator 412, and the vicinity thereof are favorable without being influenced by the process damage.

Thus, a current when the transistor 2000 is on (on-state current) can be large. Furthermore, the reliability can be improved.

In the transistor 2000, the conductor 404 functioning as a first gate electrode partly overlaps with each of the conductors 416a1 and 416a2 functioning as the source electrode and the drain electrode, whereby parasitic capacitance between the conductor 404 and the conductor 416a1 and parasitic capacitance between the conductor 404 and the conductor 416a2 are formed.

The structure of the transistor 2000 including the barrier film 417a1 as well as the insulator 412, the oxide 406c, and the oxide 406d between the conductor 404 and the conductor 416a1 allows a reduction in the parasitic capacitance. Similarly, the transistor structure including the barrier film 417a2 as well as the insulator 412, the oxide 406c, and the oxide 406d between the conductor 404 and the conductor 416a2 allows a reduction in the parasitic capacitance. Thus, the transistor 2000 has excellent frequency characteristics.

Furthermore, the above structure of the transistor 2000 allows a reduction or prevention of generation of a leakage current between the conductor 404 and each of the conductors 416a1 and 416a2 when the transistor 2000 operates, for example, when a potential difference between the conductor 404 and each of the conductors 416a1 and 416a2 occurs.

The conductor 310 serves as a second gate electrode. The conductor 310a serves as a conductive barrier film. Since the conductor 310a is provided so as to cover a bottom surface and side surfaces of the conductor 310b, oxidation of the conductor 310b can be prevented.

<Substrate>

As the substrate 400, an insulator substrate, a semiconductor substrate, or a conductor substrate may be used, for example. As the insulator substrate, a glass substrate, a quartz substrate, a sapphire substrate, a stabilized zirconia substrate (e.g., an yttria-stabilized zirconia substrate), or a resin substrate is used, for example. As the semiconductor substrate, a semiconductor substrate of silicon, germanium, or the like, or a compound semiconductor substrate of silicon carbide, silicon germanium, gallium arsenide, indium phosphide, zinc oxide, or gallium oxide is used, for example. A semiconductor substrate in which an insulator region is provided in the above semiconductor substrate, e.g., a silicon on insulator (SOI) substrate or the like is used. As the conductor substrate, a graphite substrate, a metal substrate, an alloy substrate, a conductive resin substrate, or the like is used. A substrate including a metal nitride, a substrate including a metal oxide, or the like is used. An insulator substrate provided with a conductor or a semiconductor, a semiconductor substrate provided with a conductor or an insulator, a conductor substrate provided with a semiconductor or an insulator, or the like is used. Alternatively, any of these substrates over which an element is provided may be used. As the element provided over the substrate, a capacitor, a resistor, a switching element, a light-emitting element, a memory element, or the like is used.

Alternatively, a flexible substrate may be used as the substrate 400. As a method of providing a transistor over a flexible substrate, there is a method in which the transistor is formed over a non-flexible substrate and then the transistor is separated and transferred to the substrate 400 which is a flexible substrate. In that case, a separation layer is preferably provided between the non-flexible substrate and the transistor. As the substrate 400, a sheet, a film, or a foil containing a fiber may be used. The substrate 400 may have elasticity. The substrate 400 may have a property of returning to its original shape when bending or pulling is stopped. Alternatively, the substrate 400 may have a property of not returning to its original shape. The substrate 400 has a region with a thickness of, for example, greater than or equal to 5 µm and less than or equal to 700 µm, preferably greater than or equal to 10 µm and less than or equal to 500 µm, further preferably greater than or equal to 15 µm and less than or equal to 300 µm. When the substrate 400 has a small thickness, the weight of the semiconductor device including the transistor can be reduced. When the substrate 400 has a small thickness, even in the case of using glass or the like, the substrate 400 may have elasticity or a property of returning to its original shape when bending or pulling is stopped. Therefore, an impact applied to the semiconductor device over the substrate 400, which is caused by dropping or the like, can be reduced. That is, a robust semiconductor device can be provided.

For the substrate 400 that is a flexible substrate, metal, an alloy, a resin, glass, or fiber thereof can be used, for example. The flexible substrate 400 preferably has a lower coefficient of linear expansion because deformation due to an environment is suppressed. The flexible substrate 400 is formed using, for example, a material whose coefficient of linear expansion is lower than or equal to $1 \times 10^{-3}$/K, lower than or equal to $5 \times 10^{-5}$/K, or lower than or equal to $1 \times 10^{-5}$/K. Examples of the resin include polyester, polyolefin, polyamide (e.g., nylon or aramid), polyimide, polycarbonate, and acrylic. In particular, aramid is preferably used for the flexible substrate 400 because of its low coefficient of linear expansion.

<Insulator>

Examples of an insulator include an insulating oxide, an insulating nitride, an insulating oxynitride, an insulating nitride oxide, an insulating metal oxide, an insulating metal oxynitride, and an insulating metal nitride oxide.

The transistor is surrounded by an insulator that has a function of inhibiting the passage of oxygen and impurities such as hydrogen, whereby the transistor can have stable electrical characteristics. For example, an insulator that has a function of inhibiting the passage of oxygen and impurities such as hydrogen may be used as each of the insulator 303 and the insulators 401, 408a, 408b, 418, and 420.

An insulator that has a function of inhibiting the passage of oxygen and impurities such as hydrogen may be formed to have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum.

Furthermore, for example, the insulator 303 and the insulators 401, 408a, 408b, 418, and 420 may each be formed using a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; or silicon nitride. Note that the insulator 303 and the insulators 401, 408a, 408b, 418, and 420 each preferably include aluminum oxide.

For example, when the insulator 408a or the insulator 420 is formed by a sputtering method with the use of plasma including oxygen, oxygen can be added to an insulator serving as a base layer of the oxide.

The insulators 301, 302, 402, and 412 can each be formed to have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. For example, the insulators 301, 302, 402, and 412 preferably contain silicon oxide, silicon oxynitride, or silicon nitride.

In particular, the insulators 402 and 412 preferably include an insulator with a high relative permittivity. For example, the insulators 402 and 412 each preferably include gallium oxide, hafnium oxide, zirconium oxide, oxide containing aluminum and hafnium, oxynitride containing aluminum and hafnium, oxide containing silicon and hafnium, oxynitride containing silicon and hafnium, nitride containing silicon and hafnium, or the like. Alternatively, the insulators 402 and 412 each preferably have a stacked-layer structure of silicon oxide or silicon oxynitride and an insulator with a high relative permittivity. Because silicon oxide and silicon oxynitride have thermal stability, combination of silicon oxide or silicon oxynitride with an insulator with a high relative permittivity allows the stacked-layer structure to be thermally stable and have a high relative permittivity. For example, when aluminum oxide, gallium oxide, or hafnium oxide is in contact with the oxide 406 side in each of the insulators 402 and 412, entry of silicon included in silicon oxide or silicon oxynitride into the oxide 406 can be inhibited. When silicon oxide or silicon oxynitride is in contact with the oxide 406 side in each of the insulators 402 and 412, for example, trap centers might be formed at the interface between aluminum oxide, gallium oxide, or hafnium oxide and silicon oxide or silicon oxynitride. The trap centers can shift the threshold voltage of the transistor in the positive direction by trapping electrons in some cases.

The insulator 410 preferably includes an insulator with a low relative permittivity. For example, the insulator 410 preferably includes silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. Alternatively, the insulator 410 preferably has a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. When silicon oxide or silicon oxynitride, which is thermally stable, is combined with a resin, the stacked-layer structure can have thermal stability and a low relative permittivity. Examples of the resin include polyester, polyolefin, polyamide (e.g., nylon or aramid), polyimide, polycarbonate, and acrylic.

An insulator that has a function of inhibiting the passage of oxygen and impurities such as hydrogen may be used for each of the barrier films 417a1 and 417a2. The barrier films 417a1 and 417a2 can prevent excess oxygen included in the insulator 410 from diffusing to the conductors 416a1 and 416a2.

The barrier films 417a1 and 417a2 can be formed using a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; or silicon nitride, for example.

<Conductor>

The conductors 404a, 404b, 310a, 310b, 416a1, and 416a2 can be formed using a material containing one or more metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like. Alternatively, a semiconductor having a high electric conductivity typified by polycrystalline silicon including an impurity element such as phosphorus, or silicide such as nickel silicide may be used.

Alternatively, a conductive material including oxygen and a metal element included in a metal oxide that can be used for the oxide 406 and is to be described later may be used. A conductive material including any of the above metal elements and nitrogen may be used. For example, a conductive material including nitrogen, such as titanium nitride or tantalum nitride, may be used. Indium tin oxide, indium oxide including tungsten oxide, indium zinc oxide including tungsten oxide, indium oxide including titanium oxide, indium tin oxide including titanium oxide, indium zinc oxide, or indium tin oxide to which silicon is added may be used. Indium gallium zinc oxide including nitrogen may be used. With any of such materials, hydrogen included in the oxide 406 can be captured in some cases. Alternatively, hydrogen entering from an external insulator or the like can be captured in some cases.

A stack of a plurality of conductive layers formed with the above materials may be used. For example, a stacked-layer structure formed using a combination of a material including any of the metal elements listed above and a conductive material including oxygen may be used. Alternatively, a stacked-layer structure formed using a combination of a material including any of the metal elements listed above and a conductive material including nitrogen may be used. Alternatively, a stacked-layer structure formed using a combination of a material including any of the metal elements listed above, a conductive material including oxygen, and a conductive material including nitrogen may be used.

When an oxide is used for the channel formation region of the transistor, a stacked-layer structure formed using a combination of a material including any of the above-described metal elements and a conductive material including oxygen is preferably used for the gate electrode. In that case, the conductive material including oxygen is preferably formed on the channel formation region side. When the conductive material including oxygen is formed on the channel formation region side, oxygen released from the conductive material is likely to be supplied to the channel formation region.

<Metal Oxide that can be Used for Oxide 406>

A metal oxide is preferably used for the oxide 406. However, silicon (including strained silicon), germanium, silicon germanium, silicon carbide, gallium arsenide, aluminum gallium arsenide, indium phosphide, gallium nitride, an organic semiconductor, or the like may be used instead of the oxide 406 in some cases.

The oxide 406 of one embodiment of the present invention is described below. The oxide 406 is preferably formed using a metal oxide functioning as an oxide semiconductor (hereinafter, the metal oxide is also referred to as an oxide semiconductor).

An oxide semiconductor preferably contains at least indium or zinc. In particular, indium and zinc are preferably contained. In addition, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, and the like may be contained.

Here, the case where the oxide semiconductor is an In-M-Zn oxide that contains indium, an element M, and zinc is considered. The element M is aluminum, gallium, yttrium, tin, or the like. Examples of other elements that can be used as the element M include boron, silicon, titanium, iron, nickel, germanium, zirconium, molybdenum, lanthanum, cerium, neodymium, hafnium, tantalum, tungsten, and magnesium. Note that two or more of the above elements may be used in combination as the element M.

Note that in this specification and the like, a metal oxide including nitrogen is also called a metal oxide in some cases. Moreover, a metal oxide including nitrogen may be called a metal oxynitride.

<Composition of Metal Oxide>

Described below is the composition of a cloud-aligned composite oxide semiconductor (CAC-OS) applicable to a transistor disclosed in one embodiment of the present invention.

In this specification and the like, "c-axis aligned crystal (CAAC)" or "cloud-aligned composite (CAC)" might be stated. Note that CAAC refers to an example of a crystal structure, and CAC refers to an example of a function or a material composition.

A CAC-OS or a CAC metal oxide has a conducting function in a part of the material and has an insulating function in another part of the material; as a whole, the CAC-OS or the CAC metal oxide has a function of a semiconductor. In the case where the CAC-OS or the CAC metal oxide is used in an active layer of a transistor, the conducting function is to allow electrons (or holes) serving as carriers to flow, and the insulating function is to not allow electrons serving as carriers to flow. By the complementary action of the conducting function and the insulating function, the CAC-OS or the CAC metal oxide can have a switching function (on/off function). In the CAC-OS or the CAC metal oxide, separation of the functions can maximize each function.

The CAC-OS or the CAC metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. The conductive regions are observed to be coupled in a cloud-like manner with their boundaries blurred, in some cases.

Furthermore, in the CAC-OS or the CAC metal oxide, the conductive regions and the insulating regions each have a size of more than or equal to 0.5 nm and less than or equal to 10 nm, preferably more than or equal to 0.5 nm and less than or equal to 3 nm and are dispersed in the material, in some cases.

The CAC-OS or the CAC metal oxide includes components having different bandgaps. For example, the CAC-OS or the CAC metal oxide includes a component having a wide gap due to the insulating region and a component having a narrow gap due to the conductive region. In the case of such a composition, carriers mainly flow in the component having a narrow gap. The component having a narrow gap complements the component having a wide gap, and carriers also flow in the component having a wide gap in conjunction with the component having a narrow gap. Therefore, in the case where the above-described CAC-OS or the CAC metal oxide is used in a channel formation region of a transistor, high current drive capability in the on state of the transistor, that is, high on-state current and high field-effect mobility, can be obtained.

In other words, the CAC-OS or the CAC metal oxide can be called a matrix composite or a metal matrix composite.

<Structure of Metal Oxide>

An oxide semiconductor is classified into a single crystal oxide semiconductor and a non-single-crystal oxide semiconductor. Examples of a non-single-crystal oxide semiconductor include a c-axis-aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

The CAAC-OS has c-axis alignment, its nanocrystals are connected in the a-b plane direction, and its crystal structure has distortion. Note that distortion refers to a portion where the direction of a lattice arrangement changes between a region with a uniform lattice arrangement and another region with a uniform lattice arrangement in a region where the nanocrystals are connected.

The shape of the nanocrystal is basically a hexagon but is not always a regular hexagon and is a non-regular hexagon in some cases. A pentagonal lattice arrangement, a heptagonal lattice arrangement, or the like is included in the distortion in some cases. Note that a clear crystal grain boundary cannot be observed even in the vicinity of distortion in the CAAC-OS. That is, formation of a grain boundary is inhibited due to the distortion of lattice arrangement. This is probably because the CAAC-OS can tolerate distortion owing to a low density of arrangement of oxygen atoms in an a-b plane direction, a change in interatomic bond distance by substitution of a metal element, and the like.

The CAAC-OS tends to have a layered crystal structure (also referred to as a layered structure) in which a layer containing indium and oxygen (hereinafter, In layer) and a layer containing the element M, zinc, and oxygen (hereinafter, (M,Zn) layer) are stacked. Note that indium and the element M can be replaced with each other, and when the element M of the (M,Zn) layer is replaced with indium, the layer can also be referred to as an (In,M,Zn) layer. When indium of the In layer is replaced with the element M, the layer can also be referred to as an (In,M) layer.

The CAAC-OS is an oxide semiconductor with high crystallinity. In contrast, in the CAAC-OS, a reduction in electron mobility due to the grain boundary is less likely to occur because a clear grain boundary cannot be observed. Entry of impurities, formation of defects, or the like might decrease the crystallinity of an oxide semiconductor. This means that the CAAC-OS has small amounts of impurities and defects (e.g., oxygen vacancies). Thus, an oxide semiconductor including a CAAC-OS is physically stable. Therefore, the oxide semiconductor including a CAAC-OS is resistant to heat and has high reliability.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different nanocrystals in the nc-OS. Thus, the orientation of the whole film is not observed. Accordingly, in some cases, the nc-OS cannot be distinguished from an a-like OS or an amorphous oxide semiconductor, depending on an analysis method.

The a-like OS has a structure between those of the nc-OS and the amorphous oxide semiconductor. The a-like OS has a void or a low-density region. That is, the a-like OS has low crystallinity as compared with the nc-OS and the CAAC-OS.

An oxide semiconductor can have various structures which show various different properties. Two or more of the amorphous oxide semiconductor, the polycrystalline oxide semiconductor, the a-like OS, the nc-OS, and the CAAC-OS may be included in an oxide semiconductor of one embodiment of the present invention.

<Transistor Including Oxide Semiconductor>

Next, the case where the oxide semiconductor is used for a transistor is described.

Note that when the oxide semiconductor is used for a transistor, the transistor can have high field-effect mobility. In addition, the transistor can have high reliability.

An oxide semiconductor with a low carrier density is preferably used for the transistor. In order to reduce the carrier density of the oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. For example, an oxide semiconductor whose carrier density is lower than $8\times10^{11}/cm^3$, preferably lower than $1\times10^{11}/cm^3$, more preferably lower than $1\times10^{10}/cm^3$, and greater than or equal to $1\times10^{-9}/cm^3$ is used.

A highly purified intrinsic or substantially highly purified intrinsic oxide semiconductor film has a low density of defect states and accordingly has a low density of trap states in some cases.

Charge trapped by the trap states in the oxide semiconductor takes a long time to be released and may behave like fixed charge. Thus, a transistor whose channel formation region is formed in an oxide semiconductor with a high density of trap states has unstable electrical characteristics in some cases.

In view of the above, to obtain stable electrical characteristics of a transistor, it is effective to reduce the concentration of impurities in the oxide semiconductor. To reduce the concentration of impurities in the oxide semiconductor, the concentration of impurities in a film that is adjacent to the oxide semiconductor is preferably reduced. Examples of impurities include hydrogen, nitrogen, alkali metal, alkaline earth metal, iron, nickel, and silicon.

<Impurity>

Here, the influence of impurities in the oxide semiconductor is described.

When silicon or carbon, which is a Group 14 element, is contained in the oxide semiconductor, defect states are formed in the oxide semiconductor. Thus, the concentration of silicon or carbon in the oxide semiconductor and at or around an interface with the oxide semiconductor (the concentration obtained by secondary ion mass spectrometry (SIMS)) is set lower than or equal to $2\times10^{18}$ atoms/cm$^3$, preferably lower than or equal to $2\times10^{17}$ atoms/cm$^3$.

When the oxide semiconductor contains alkali metal or alkaline earth metal, defect states are formed and carriers are generated in some cases. Thus, a transistor using an oxide semiconductor that contains alkali metal or alkaline earth metal is likely to have normally-on characteristics. Accordingly, it is preferable to reduce the concentration of alkali metal or alkaline earth metal in the oxide semiconductor. Specifically, the concentration of alkali metal or alkaline earth metal in the oxide semiconductor measured by SIMS is set lower than or equal to $1\times10^{18}$ atoms/cm$^3$, preferably lower than or equal to $2\times10^{16}$ atoms/cm$^3$.

When the oxide semiconductor contains nitrogen, the oxide semiconductor easily becomes n-type by generation of electrons serving as carriers and an increase of carrier density. Thus, a transistor in which an oxide semiconductor containing nitrogen is used as a semiconductor is likely to have normally-on characteristics. For this reason, nitrogen in the oxide semiconductor is preferably reduced as much as possible. For example, the nitrogen concentration in the oxide semiconductor measured by SIMS is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in an oxide semiconductor reacts with oxygen bonded to a metal atom to be water, and thus causes an oxygen vacancy in some cases. Due to entry of hydrogen into the oxygen vacancy, an electron serving as a carrier is sometimes generated. Furthermore, in some cases, bonding of part of hydrogen to oxygen bonded to a metal atom causes generation of an electron serving as a carrier. Thus, a transistor using an oxide semiconductor that contains hydrogen is likely to have normally-on characteristics.

Accordingly, it is preferred that hydrogen in the oxide semiconductor be reduced as much as possible. Specifically, the hydrogen concentration in the oxide semiconductor measured by SIMS is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurity concentration is used for a channel formation region in a transistor, the transistor can have stable electrical characteristics.

This embodiment can be implemented in an appropriate combination with any of the structures described in the other embodiments, Example, and the like.

Embodiment 2

<Method 1 for Manufacturing Semiconductor Device>

A method of manufacturing a semiconductor device including the transistor 1000 of one embodiment of the present invention is described below with reference to FIGS. 1A to 1C, FIGS. 7A to 7C, FIGS. 8A to 8C, FIGS. 9A to 9C, FIGS. 10A to 10C, FIGS. 11A to 11C, FIGS. 12A to 12C, FIGS. 13A to 13C, and FIGS. 14A to 14C. FIG. 1A, FIG. 7A, FIG. 8A, FIG. 9A, FIG. 10A, FIG. 11A, FIG. 12A, FIG. 13A, and FIG. 14A are top views. FIG. 1B, FIG. 7B, FIG. 8B, FIG. 9B, FIG. 10B, FIG. 11B, FIG. 12B, FIG. 13B, and FIG. 14B are cross-sectional views taken along the dashed-dotted lines A1-A2 in FIG. 1A, FIG. 7A, FIG. 8A, FIG. 9A, FIG. 10A, FIG. 11A, FIG. 12A, FIG. 13A, and FIG. 14A. FIG. 1C, FIG. 7C, FIG. 8C, FIG. 9C, FIG. 10C, FIG. 11C, FIG. 12C, FIG. 13C, and FIG. 14C are cross-sectional views taken along the dashed-dotted lines A3-A4 in FIG. 1A, FIG. 7A, FIG. 8A, FIG. 9A, FIG. 10A, FIG. 11A, FIG. 12A, FIG. 13A, and FIG. 14A.

First, the substrate 400 is prepared.

Next, the insulator 401 is formed. The insulator 401 can be formed by a sputtering method, a chemical vapor deposition (CVD) method, a molecular beam epitaxy (MBE) method, a pulsed laser deposition (PLD) method, an atomic layer deposition (ALD) method, or the like.

The CVD method can include a plasma enhanced CVD (PECVD) method using plasma, a thermal CVD (TCVD) method using heat, a photo CVD method using light, and the like. Moreover, the CVD method can include a metal CVD (MCVD) method and a metal organic CVD (MOCVD) method depending on a source gas.

By using a PECVD method, a high-quality film can be formed at a relatively low temperature. Furthermore, a TCVD method does not use plasma and thus causes less plasma damage to an object. For example, a wiring, an electrode, an element (e.g., transistor or capacitor), or the like included in a semiconductor device might be charged up by receiving charges from plasma. In that case, accumulated charges might break the wiring, electrode, element, or the like included in the semiconductor device. By contrast, when a TCVD method not using plasma is employed, such plasma damage is not caused and the yield of semiconductor devices can be increased. A TCVD method does not cause plasma damage during deposition, so that a film with few defects can be obtained.

An ALD method also causes less plasma damage to an object. An ALD method does not cause plasma damage during deposition, so that a film with few defects can be obtained.

Unlike in a deposition method in which particles ejected from a target or the like are deposited, in a CVD method and an ALD method, a film is formed by reaction at a surface of an object. Thus, a CVD method and an ALD method enable favorable step coverage almost regardless of the shape of an object. In particular, an ALD method enables excellent step coverage and excellent thickness uniformity and can be favorably used for covering a surface of an opening with a high aspect ratio, for example. On the other hand, an ALD method has a relatively low deposition rate; thus, it is sometimes preferable to combine an ALD method with another deposition method with a high deposition rate such as a CVD method.

When a CVD method or an ALD method is used, the composition of a film to be formed can be controlled with a flow rate ratio of a source gas. For example, by a CVD method or an ALD method, a film with a certain composition can be formed depending on a flow rate ratio of a source gas. Moreover, by changing the flow rate ratio of a source gas during deposition by a CVD method or an ALD method, a film whose composition is continuously changed can be formed. In the case where a film is formed while the flow rate ratio of a source gas is changed, the time for deposition can be shorter than in the case where a film is formed using a plurality of deposition chambers because time for transfer and pressure adjustment can be saved. Thus, semiconductor devices can be manufactured with improved productivity in some cases.

The insulator 401 may have a multilayer structure. For example, the multilayer structure may be formed in such a manner that an aluminum oxide is formed by a sputtering method and an aluminum oxide is formed over the aluminum oxide by an ALD method. Alternatively, the multilayer structure may be formed in such a manner that an aluminum oxide is formed by an ALD method and an aluminum oxide is formed over the aluminum oxide by a sputtering method.

Next, the insulator 301 is formed over the insulator 401. The insulator 301 can be formed by a sputtering method, a CVD method, an MBE method, a PLD method, an ALD method, or the like.

Then, a groove is formed in the insulator 301 so as to reach the insulator 401. Examples of the groove include a hole and an opening. In forming the groove, wet etching may be employed; however, dry etching is preferably employed in terms of microfabrication. The insulator 401 is preferably an insulator that serves as an etching stopper film used in forming the groove by etching the insulator 301. For example, in the case where a silicon oxide film is used as the insulator 301 in which the groove is to be formed, the insulator 401 is preferably formed using a silicon nitride film, an aluminum oxide film, or a hafnium oxide film.

In this embodiment, for the insulator 401, aluminum oxide is formed by a sputtering method and aluminum oxide is formed by an ALD method over the aluminum oxide. Silicon oxide is formed by a CVD method for the insulator 301.

After the formation of the groove, a conductor to be the conductor 310 is formed. The conductor to be the conductor 310 desirably contains a conductor that has a function of inhibiting penetration of oxygen. For example, tantalum nitride, tungsten nitride, or titanium nitride can be used. Alternatively, a stacked-layer film formed using the conductor and tantalum, tungsten, titanium, molybdenum, aluminum, copper, or a molybdenum-tungsten alloy can be used. The conductor to be the conductor 310 can be formed by a sputtering method, a CVD method, an MBE method, a PLD method, an ALD method, or the like.

In this embodiment, tantalum nitride is deposited by a sputtering method for the conductor to be the conductor 310a.

Then, a conductor to be the conductor 310b is formed over the conductor to be the conductor 310a. The conductor to be the conductor 310b can be formed by a sputtering method, a CVD method, an MBE method, a PLD method, an ALD method, or the like.

In this embodiment, for the conductor to be the conductor 310b, titanium nitride is deposited by a CVD method and tungsten is deposited by a CVD method over the titanium nitride.

Next, chemical mechanical polishing (CMP) is performed to remove the conductor to be the conductor 310a and the conductor to be the conductor 310b that are located over the insulator 301. Consequently, the conductor to be the conductor 310a and the conductor to be the conductor 310b remain only in the groove, whereby the conductor 310 that includes the conductor 310a and the conductor 310b with flat top surfaces can be formed.

Next, the insulator 302 is formed over the insulator 301 and the conductor 310. The insulator 302 can be formed by a sputtering method, a CVD method, an MBE method, a PLD method, an ALD method, or the like.

Next, the insulator 303 is formed over the insulator 302. The insulator 303 can be formed by a sputtering method, a CVD method, an MBE method, a PLD method, an ALD method, or the like.

Next, the insulator 402 is formed over the insulator 303. The insulator 402 can be formed by a sputtering method, a CVD method, an MBE method, a PLD method, an ALD method, or the like.

Next, first heat treatment is preferably performed. The first heat treatment can be performed at a temperature higher than or equal to 250° C. and lower than or equal to 650° C., preferably higher than or equal to 300° C. and lower than or equal to 500° C., further preferably higher than or equal to 320° C. and lower than or equal to 450° C. The first heat treatment is performed in nitrogen, an inert gas atmosphere, or an atmosphere containing an oxidizing gas at 10 ppm or more, 1% or more, or 10% or more. The first heat treatment may be performed under a reduced pressure. Alternatively, the first heat treatment may be performed in such a manner that heat treatment is performed in nitrogen or an inert gas atmosphere, and then another heat treatment is performed in an atmosphere containing an oxidizing gas at 10 ppm or more, 1% or more, or 10% or more in order to compensate for released oxygen. By the first heat treatment, impurities such as hydrogen and water included in the insulator 402 can be removed, for example. Alternatively, in the first heat treatment, plasma treatment using oxygen may be performed under a reduced pressure. The plasma treatment using oxygen is preferably performed using an apparatus including a power source for generating high-density plasma using microwaves, for example. Alternatively, a power source for applying a radio frequency (RF) to a substrate side may be provided. The use of high-density plasma enables high-density oxygen radicals to be produced, and application of the RF to the substrate side allows oxygen radicals generated by the high-density plasma to be efficiently introduced into the insulator 402. Alternatively, after plasma treatment using an inert gas with the apparatus, plasma treatment using oxygen in order to compensate for released oxygen may be performed. Note that the first heat treatment is not necessarily performed in some cases.

This heat treatment can also be performed after the deposition of the insulator 302, after the deposition of the insulator 303, and after the deposition of the insulator 402. Although the heat treatment can be performed under the conditions for the first heat treatment, heat treatment after the deposition of the insulator 302 is preferably performed in an atmosphere containing nitrogen.

In this embodiment, as the first heat treatment, after the formation of the insulator 402, treatment is performed in a nitrogen atmosphere at 400° C. for one hour, and successively another treatment is performed in an oxygen atmosphere at 400° C. for one hour.

Next, an oxide 406a1 and an oxide 406b1 are sequentially formed over the insulator 402. Note that it is preferable that the oxide 406a1 and the oxide 406b1 be successively formed without being exposed to the atmosphere. By such film formation, impurities or moisture from the atmosphere can be prevented from being attached to the oxide 406a1, and an interface between the oxide 406a1 and the oxide 406b1 and the vicinity of the interface can be kept clean.

The oxide 406a1 and the oxide 406b1 can be formed by a sputtering method, a CVD method, an MBE method, a PLD method, an ALD method, or the like.

For example, in the case where the oxide 406a1 and the oxide 406b1 are formed by a sputtering method, oxygen or a mixed gas of oxygen and a rare gas is used as a sputtering gas. By increasing the proportion of oxygen in the sputtering gas, the amount of excess oxygen in the oxide film to be deposited can be increased.

In particular, during the formation of the oxide 406a1, part of oxygen contained in the sputtering gas is supplied to the insulator 402 in some cases.

Note that the proportion of oxygen in the sputtering gas is 70% or higher, preferably 80% or higher, and more preferably 100%.

Next, the oxide 406b1 is formed by a sputtering method. At this time, when the proportion of oxygen in the sputtering gas is higher than or equal to 1% and lower than or equal to 30%, preferably higher than or equal to 5% and lower than or equal to 20%, an oxygen-deficient oxide semiconductor is formed. A transistor including an oxygen-deficient oxide semiconductor can have relatively high field-effect mobility.

Note that when an oxygen-deficient oxide semiconductor is used for the oxide 406b1, an oxide film containing excess oxygen is preferably used for the oxide 406a1. The oxygen doping treatment may be performed after the formation of the oxide 406b1.

Note that in the case where the oxide is formed by a sputtering method, the formed film has an atomic ratio that is different from an atomic ratio of the target in some cases. For example, depending on the substrate temperature at the time of the film formation, the proportion of zinc (Zn) in the film is lower than the proportion of zinc (Zn) in the target in some cases.

Specifically, the case where In-M-Zn oxides are formed as the oxide 406b1 and an oxide 406c1 (described later) is described. In a film formed by a sputtering method using a target with an atomic ratio of In:Ga:Zn=4:2:4.1, the atomic proportion of Zn is particularly low in some cases. Therefore, the atomic ratio of the formed film is in the vicinity of In:Ga:Zn=4:2:3 in some cases.

Even in the case where films are formed using targets with the same atomic ratio, if other deposition conditions are different, strictly, the films have different compositions in some cases. Therefore, in this specification, in the case where the oxide 406b1 and the oxide 406c1 are formed using targets with the same atomic ratio, the oxide 406b1 and the oxide 406c1 have the same atomic ratio or similar atomic ratios. The description "the composition of the oxide 406b1 is similar to the composition of the oxide 406c1" includes the case where atomic proportion of indium (In) between the oxide 406b1 and the oxide 406c1 fluctuates within 10 atomic %.

In this embodiment, the oxide 406a1 is formed by a sputtering method using a target with an atomic ratio of In:Ga:Zn=1:3:4, and the oxide 406b1 is formed by a sputtering method using a target with an atomic ratio of In:Ga:Zn=4:2:4.1.

After that, second heat treatment may be performed. For the second heat treatment, the conditions for the first heat treatment can be used. By the second heat treatment, impurities such as hydrogen and water included in the oxide 406a1 and the oxide 406b1 can be removed. In this embodiment, treatment is performed in a nitrogen atmosphere at 400° C. for one hour, and successively another treatment is performed in an oxygen atmosphere at 400° C. for one hour.

Next, a conductor 416 is formed over the oxide 406b1. The conductor 416 can be formed by a sputtering method, a CVD method, an MBE method, a PLD method, an ALD method, or the like. As the conductor 416, a conductive oxide such as indium tin oxide (ITO), indium oxide including tungsten oxide, indium zinc oxide including tungsten oxide, indium oxide including titanium oxide, indium tin oxide including titanium oxide, indium zinc oxide, indium tin oxide to which silicon is added, or indium gallium zinc oxide including nitrogen is deposited, and a material including one or more metal elements selected from aluminum, chromium, copper, silver, gold, platinum, tantalum, nickel, titanium, molybdenum, tungsten, hafnium, vanadium, niobium, manganese, magnesium, zirconium, beryllium, indium, and the like, a semiconductor with high electric conductivity typified by polycrystalline silicon including an impurity element such as phosphorus, or a silicide such as nickel silicide may be deposited over the oxide.

The oxide may have a function of absorbing hydrogen in the oxide 406a1 and the oxide 406b1 and capturing hydrogen diffused from the outside; thus, the electrical characteristics and reliability of the transistor 1000 are improved in some cases. Titanium instead of the oxide may have a similar function. In this embodiment, tantalum nitride is formed for the conductor 416.

Then, a barrier film 417 is formed over the conductor 416. The barrier film 417 can be formed by a sputtering method, a CVD method, an MBE method, a PLD method, an ALD method, or the like. In this embodiment, aluminum oxide is formed as the barrier film 417.

Subsequently, a conductor 411 is formed over the barrier film 417. The conductor 411 can be formed by a sputtering method, a CVD method, an MBE method, a PLD method, an ALD method, or the like. In this embodiment, tantalum nitride is formed for the conductor 411 (see FIGS. 7A to 7C).

Next, the conductor 411 is processed into a conductor 411a by a lithography method. Through this processing, a tapered cross section is preferably formed. The taper angle between the cross section and a plane parallel to the bottom surface of the substrate is greater than or equal to 30° and less than 75°, preferably greater than or equal to 30° and less than 70°. With such a taper angle, coverage with films formed later in the manufacturing process can be improved. The processing is preferably performed by a dry etching method. The dry etching method is suitable for microfabrication and the above described formation of a tapered shape (see FIGS. 8A to 8C).

In the lithography method, first, a resist is exposed to light through a mask. Next, a region exposed to light is removed or left using a developing solution, so that a resist mask is formed. Then, etching is conducted with the resist mask. As a result, a conductor, a semiconductor, an insulator, or the like can be processed into a desired shape. The resist mask is formed by, for example, exposure of the resist to light using KrF excimer laser light, ArF excimer laser light, extreme ultraviolet (EUV) light, or the like. Alternatively, a liquid immersion technique may be employed in which a portion between a substrate and a projection lens is filled with liquid (e.g., water) to perform light exposure. An electron beam or an ion beam may be used instead of the above-mentioned light. Note that a mask is not necessary in the case of using an electron beam or an ion beam. Note that dry etching treatment such as ashing or wet etching treatment can be used for removal of the resist mask. Alternatively, wet etching treatment can be performed after dry etching treatment. Still alternatively, dry etching treatment can be performed after wet etching treatment.

As a dry etching apparatus, a capacitively coupled plasma (CCP) etching apparatus including parallel plate type electrodes can be used. The capacitively coupled plasma etching apparatus including parallel plate type electrodes may have a structure in which a high-frequency power source is applied to one of the parallel plate type electrodes. Alternatively, the capacitively coupled plasma etching apparatus may have a structure in which different high-frequency power sources are applied to one of the parallel plate type electrodes. Alternatively, the capacitively coupled plasma etching apparatus may have a structure in which high-frequency power sources with the same frequency are applied to the parallel plate type electrodes. Alternatively, the capacitively coupled plasma etching apparatus may have a structure in which high-frequency power sources with different frequencies are applied to the parallel plate type electrodes. Alternatively, a dry etching apparatus including a high-density plasma source can be used. As the dry etching apparatus including a high-density plasma source, an inductively coupled plasma (ICP) etching apparatus can be used, for example.

Next, a resist 421 is formed by a lithography method.

Figure 9A:
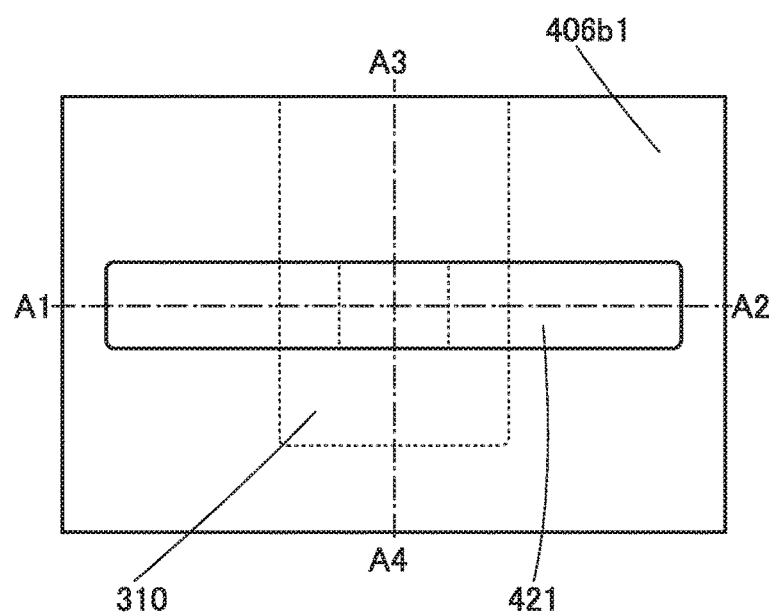
FIGS. 9A to 9C illustrate a method of manufacturing a transistor of one embodiment of the present invention.
Figure 9C:
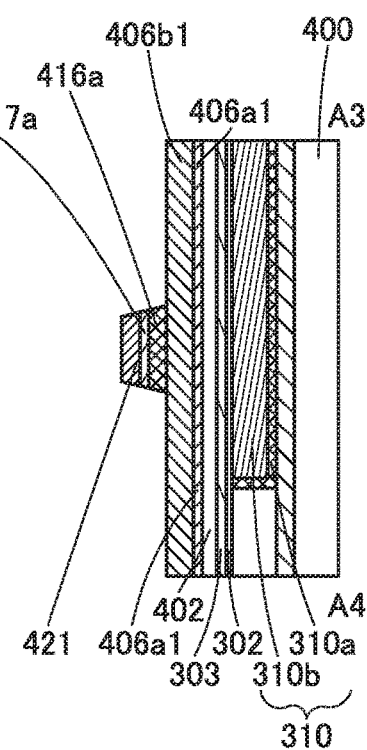
Figure 9B:
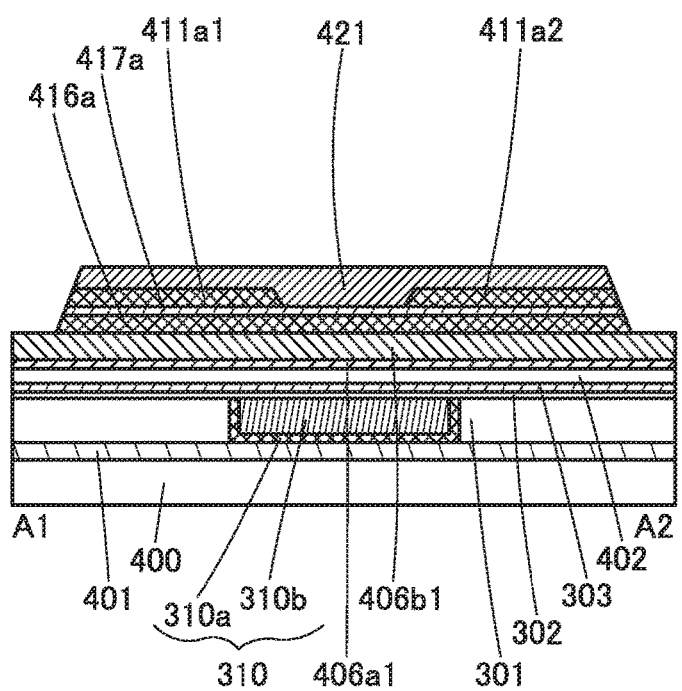
Figure 10A:
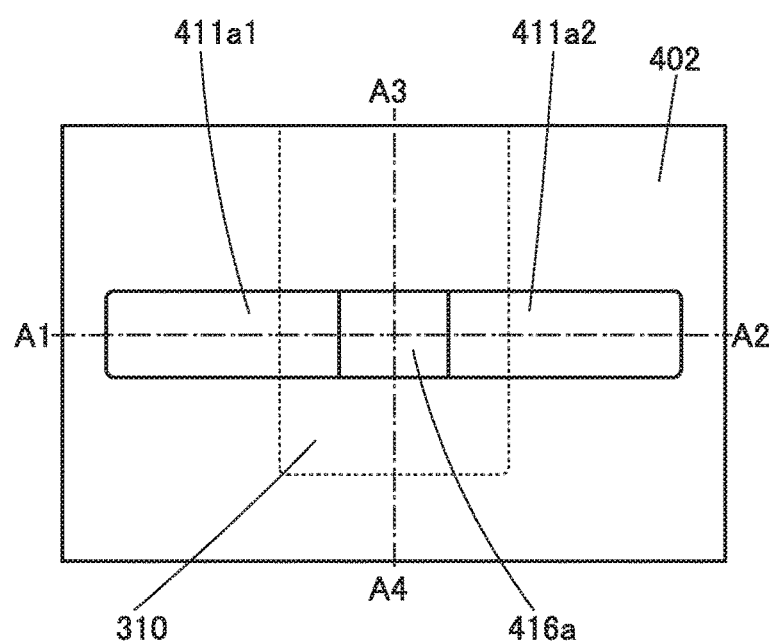
FIGS. 10A to 10C illustrate a method of manufacturing a transistor of one embodiment of the present invention.
Figure 10C:
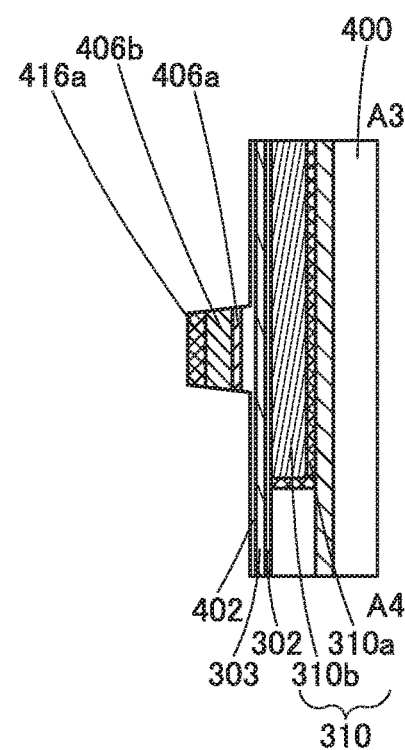
Figure 10B:
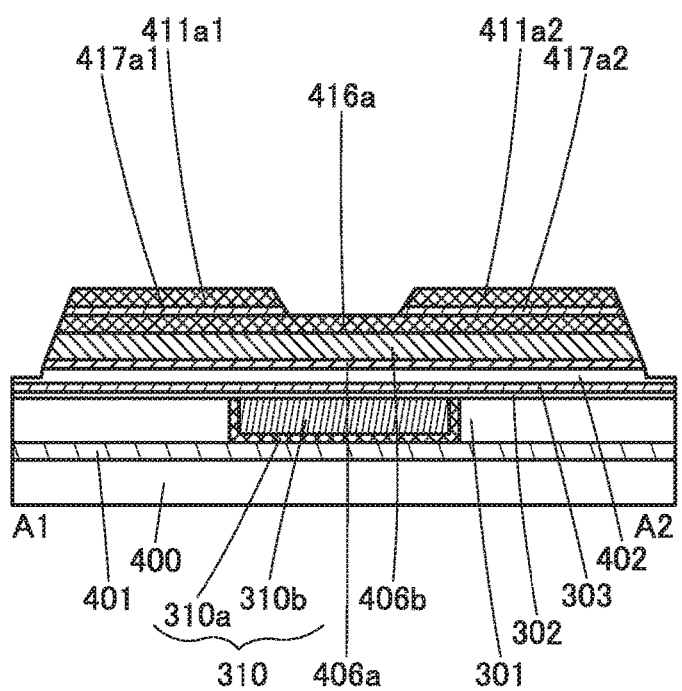

Next, the conductor 411, the barrier film 417, and the conductor 416 are etched with the use of a resist 421 as an etching mask to form a conductor 411$a$1, a conductor 411$a$2, the barrier film 417$a$, and the conductor 416$a$ (see FIGS. 9A to 9C).

Next, the resist 421 is removed, and then a region of the barrier film 417$a$ which is over the conductor 416$a$ and sandwiched between the conductor 411$a$1 and the conductor 411$a$2 is etched, whereby the barrier film 417$a$1 and the barrier film 417$a$2 are formed.

Next, the oxide 406$a$ and the oxide 406$b$ are formed with the use of the conductor 411$a$l, the conductor 411$a$2, and an exposed portion of the surface of the conductor 416$a$ as etching masks. Since tantalum nitride is used for the conductor 411$a$1, the conductor 411$a$2, and the conductor 416$a$ in this embodiment, the oxide 406$a$1 and the oxide 406$b$1 are preferably processed under an etching condition in which the etching rates of the oxides 406$a$1 and 406$b$1 are higher than the etching rate of tantalum nitride. When the etching rate of tantalum nitride is regarded as 1, the etching rates of the oxides 406$a$1 and 406$b$1 are higher than or equal to 3 and lower than or equal to 50, preferably higher than or equal to 5 and lower than or equal to 30 (see FIGS. 10A to 10C).

Figure 11A:
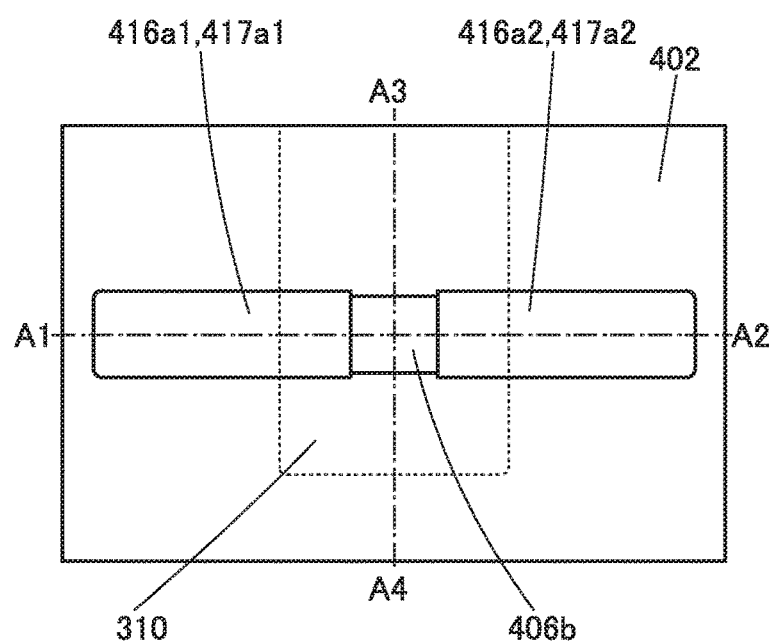
FIGS. 11A to 11C illustrate a method of manufacturing a transistor of one embodiment of the present invention.
Figure 11C:
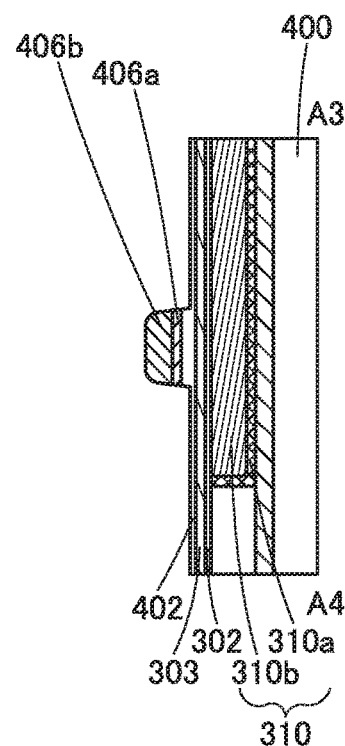
Figure 11B:
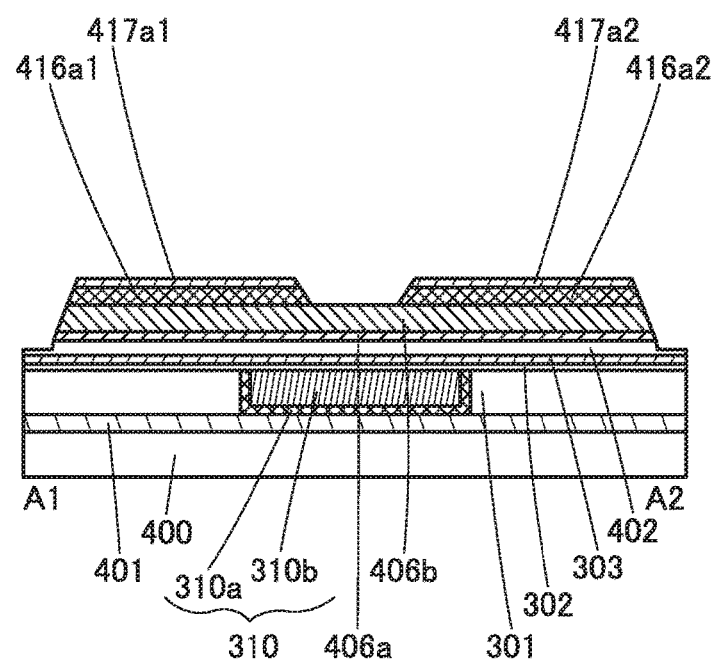
Figure 12A:
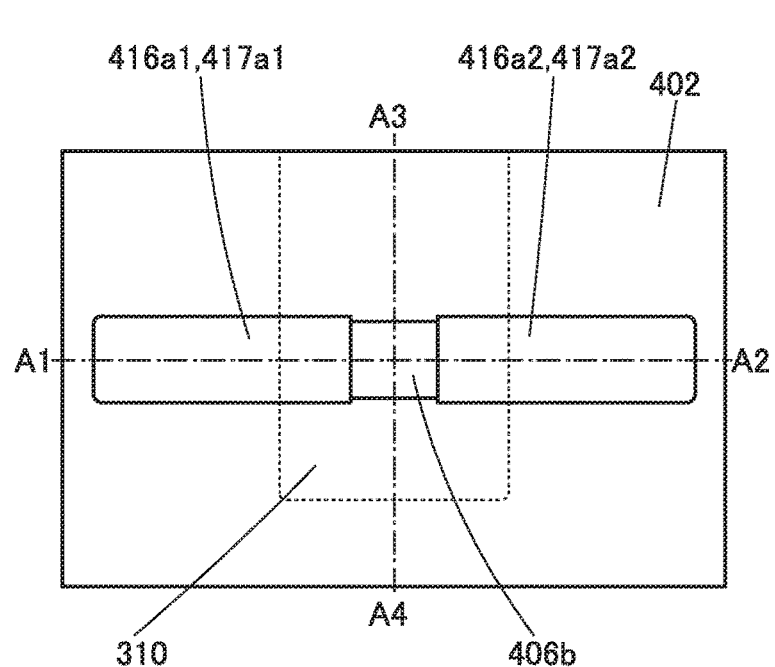
FIGS. 12A to 12C illustrate a method of manufacturing a transistor of one embodiment of the present invention.
Figure 12C:
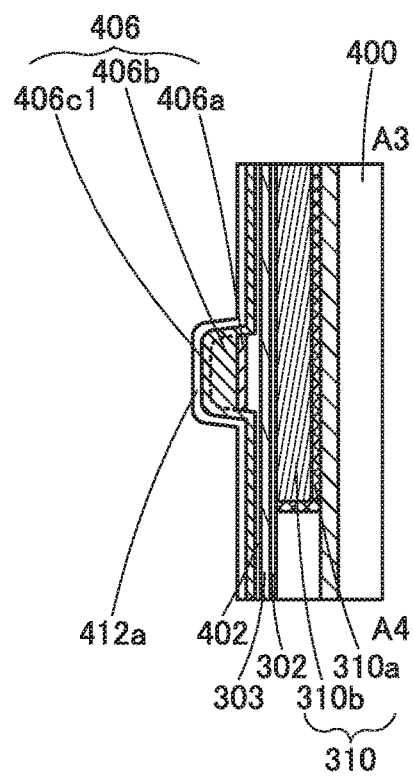
Figure 12B:
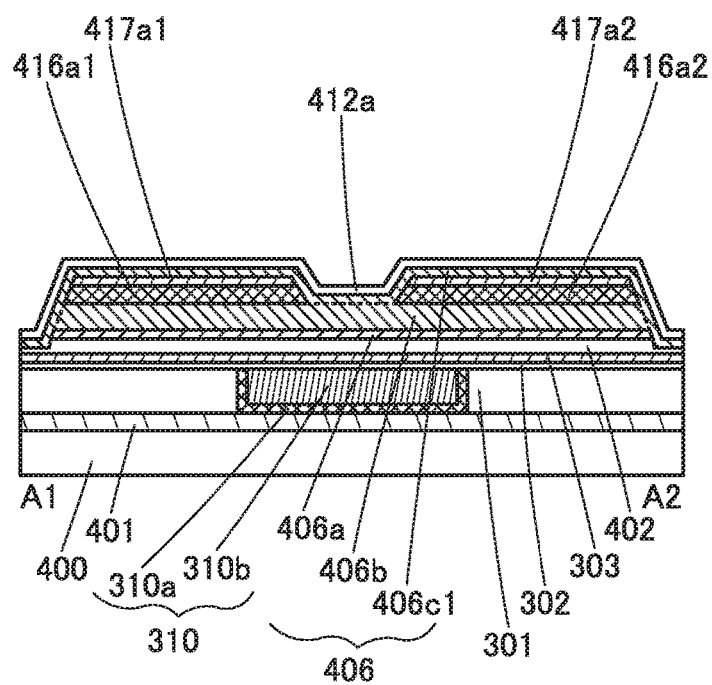

Next, the conductor 411$a$1, the conductor 411$a$2, and the exposed portion of the surface of the conductor 416$a$ are etched, so that the conductor 416$a$1 and the conductor 416$a$2 are formed (see FIGS. 11A to 11C).

In some cases, treatment such as dry etching performed in the above process causes the attachment or diffusion of an impurity due to an etching gas or the like to a surface or an inside portion of the oxide 406$a$, the oxide 406$b$, or the like. Examples of the impurity include fluorine and chlorine.

In order to remove the impurities, cleaning is performed. Examples of the cleaning method include wet cleaning using a cleaning solution, plasma treatment using plasma, and heat treatment, and any of these cleaning methods may be used in appropriate combination.

As the wet cleaning, cleaning treatment may be performed using an aqueous solution obtained by diluting an oxalic acid, a phosphoric acid, a hydrofluoric acid, or the like with pure water or carbonated water. Alternatively, ultrasonic cleaning using pure water or carbonated water may be performed. In this embodiment, ultrasonic cleaning using pure water or carbonated water is performed.

Next, third heat treatment may be performed. For the third heat treatment, the conditions for the first heat treatment can be used. Note that the third heat treatment is not necessarily performed in some cases. In this embodiment, the third heat treatment is not performed.

The above treatment allows a reduction in impurity concentration. Furthermore, the moisture concentration and the hydrogen concentration in the oxide 406$a$ and the oxide 406$b$ can be reduced.

Next, the oxide 406$c$1 is formed. The oxide 406$c$1 can be formed by a sputtering method, a CVD method, an MBE method, a PLD method, an ALD method, or the like. A sputtering method is especially preferred for the film formation. As the oxide 406$c$1 to be the oxide 406$c$, an oxide with the same composition as the oxide 406$b$ is preferably formed. The oxide 406$b$ and the oxide 406$c$ with the same composition can have the same electron affinity or a small difference in electron affinity. Accordingly, the interface state density between the oxide 406$b$ and the oxide 406$c$ can be low. Low interface state density can prevent a decrease in on-state current of the transistor 1000.

For example, in the case where In-M-Zn oxides are used for the oxide 406$c$1 and the oxide 406$b$1, the oxides are preferably formed such that the atomic proportions of metal elements in the oxide 406$c$1 are almost equal to the atomic proportions of metal elements in the oxide 406$b$1. Specifically, when a sputtering method is employed, targets with the same atomic ratio of metal elements are preferably used. Furthermore, a mixed gas of oxygen and argon is used as a sputtering gas, and the proportion of oxygen contained in the sputtering gas is greater than or equal to 0%, preferably greater than or equal to 80%, more preferably 100%.

In this embodiment, the oxide 406$c$1 is formed by a sputtering method using a target with an atomic ratio of In:Ga:Zn=4:2:4.1. The proportion of oxygen contained in the sputtering gas is 100%.

The oxide 406$c$1 is preferably deposited under the above conditions, in which case excess oxygen can be added to the oxide 406$a$, the oxide 406$b$, and the insulator 402.

Next, an insulator 412$a$ is formed over the oxide 406$c$1. The insulator 412$a$ can be formed by a sputtering method, a CVD method, an MBE method, a PLD method, an ALD method, or the like (see FIGS. 12A to 12C).

Here, fourth heat treatment can be performed. For this heat treatment, the conditions for the first heat treatment can be used. The heat treatment can reduce the moisture concentration and the hydrogen concentration in the insulator 412$a$. Note that the fourth heat treatment is not necessarily performed in some cases. In this embodiment, the fourth heat treatment is not performed.

Next, a conductor to be the conductor 404 is formed. The conductor to be the conductor 404 can be formed by a sputtering method, a CVD method, an MBE method, a PLD method, an ALD method, or the like.

The conductor 404 may be a multilayer film. For example, as a conductor to be the conductor 404, an oxide is deposited under conditions similar to those for the oxide 406c1, whereby oxygen can be added to the insulator 412a. Note that oxygen added to the insulator 412a serves as excess oxygen.

Next, a conductor is formed over the oxide by a sputtering method. As a result, the electric resistance of the oxide is decreased, whereby the oxide can be a conductor. This oxide can be called an oxide conductor (OC) electrode. A conductor may be further formed over the conductor over the OC electrode by a sputtering method or the like.

In this embodiment, titanium nitride is formed by a sputtering method as the conductor to be the conductor 404a, and tungsten is formed by a sputtering method as the conductor to be the conductor 404b.

Here, fifth heat treatment can be performed. For this heat treatment, the conditions for the first heat treatment can be used. Note that the fifth heat treatment is not necessarily performed in some cases. In this embodiment, the fifth heat treatment is not performed.

Figure 13A:
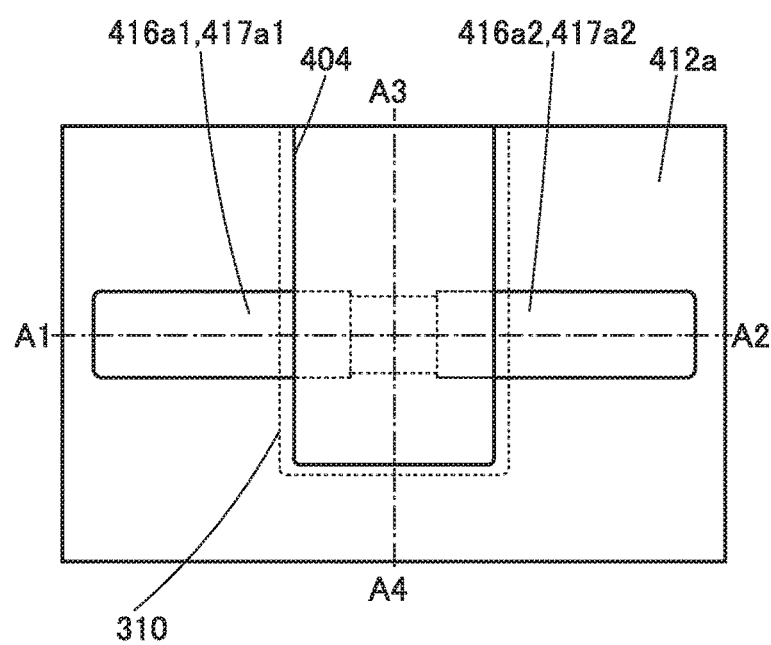
FIGS. 13A to 13C illustrate a method of manufacturing a transistor of one embodiment of the present invention.
Figure 13C:
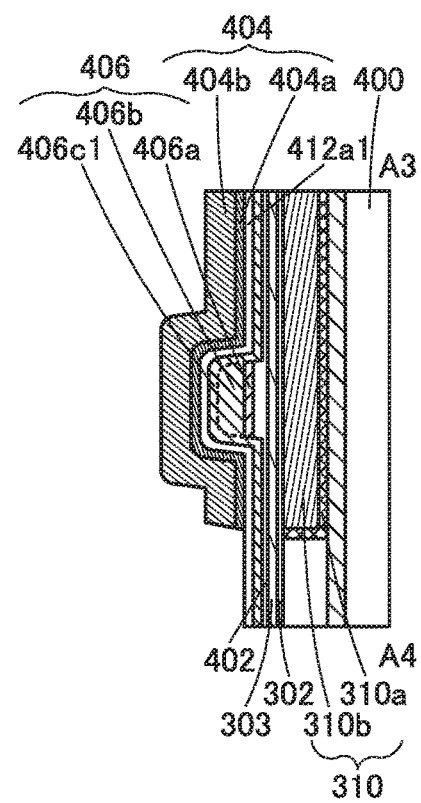
Figure 13B:
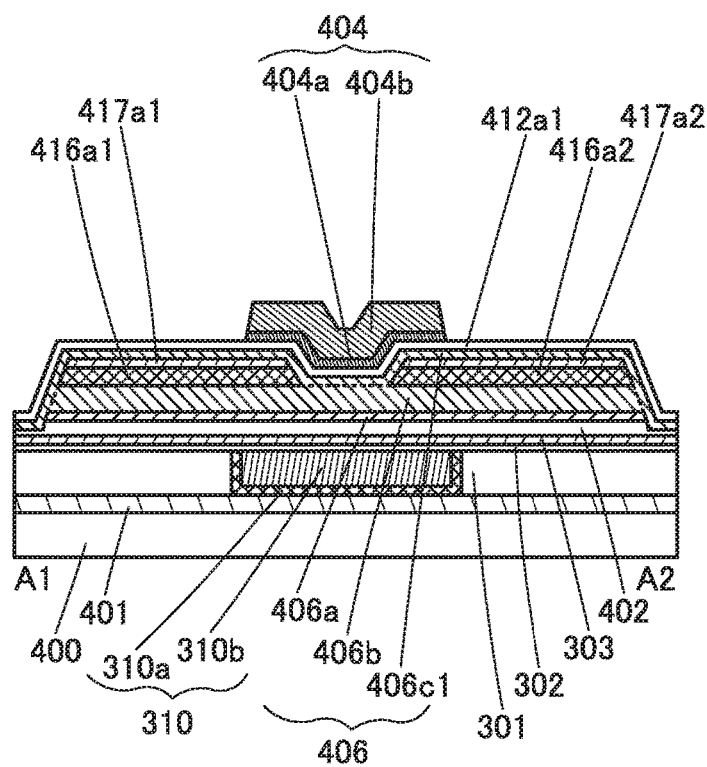
Figure 14A:
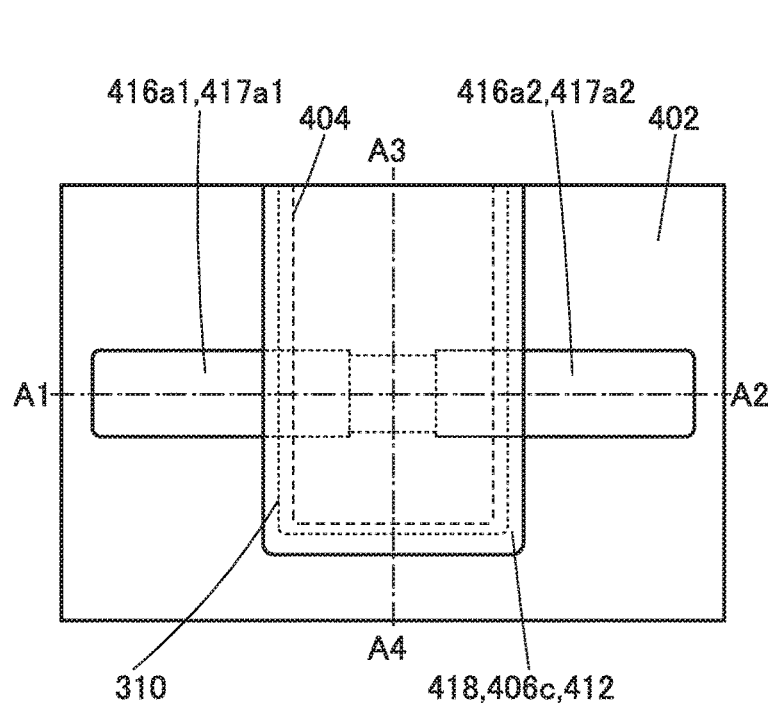
FIGS. 14A to 14C illustrate a method of manufacturing a transistor of one embodiment of the present invention.
Figure 14C:
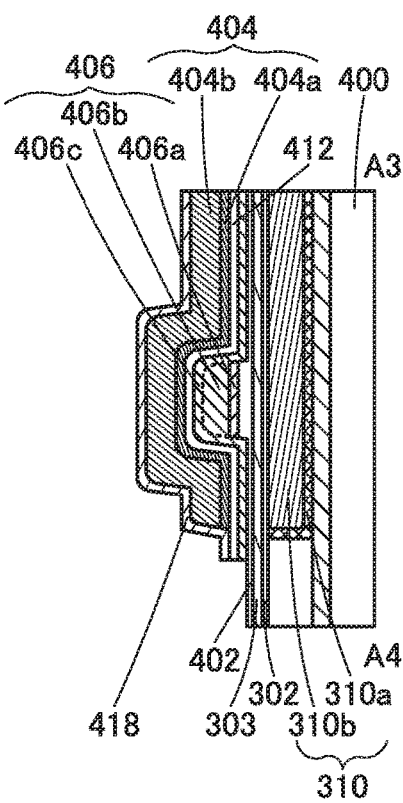
Figure 14B:
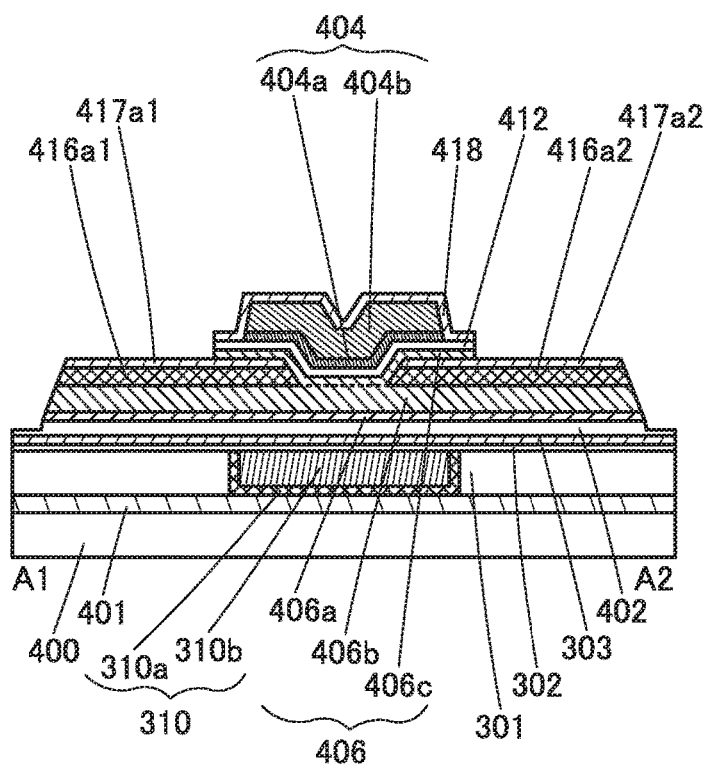

The conductors to be the conductors 404a and 404b are processed by a lithography method to form the conductors 404a and 404b (see FIGS. 13A to 13C).

Next, an oxide to be the insulator 418 may be deposited. The oxide to be the insulator 418 is preferably formed using a metal oxide, which can be deposited by a sputtering method, a CVD method, an MBE method, a PLD method, an ALD method, or the like. For example, in the case where aluminum oxide is deposited by an ALD method, the oxide to be the insulator 418 can be formed to have few pinholes and uniform thickness on the top and side surfaces of the conductor 404, resulting in prevention of oxidation of the conductor 404. In this embodiment, aluminum oxide is deposited by an ALD method.

Next, the oxide to be the insulator 418, the insulator 412a, and the oxide 406c1 are processed by a lithography method to form the insulator 418, the insulator 412, and the oxide 406c. An interface between the insulator 412 and the oxide 406c formed in this manner is hardly subjected to damage, which is preferable.

Here, in the channel length direction, the end portions of the insulator 418, the end portions of the insulator 412, and the end portions of the oxide 406c are aligned and positioned over the barrier film 417a1 and the barrier film 417a2. In the channel width direction, the end portion of the insulator 418, the end portion of the insulator 412, and the end portion of the oxide 406c are aligned and positioned over the insulator 402 (see FIGS. 14A to 14C).

Next, the insulator 410 is formed. The insulator 410 can be formed by a sputtering method, a CVD method, an MBE method, a PLD method, an ALD method, or the like. Alternatively, the insulator 410 can be formed by a spin coating method, a dipping method, a droplet discharging method (such as an ink-jet method), a printing method (such as screen printing or offset printing), a doctor knife method, a roll coater method, a curtain coater method, or the like.

The insulator 410 may be formed to have a flat top surface. For example, the top surface of the insulator 410 may have flatness immediately after the film formation. Alternatively, for example, the insulator 410 may have flatness by removing the insulator and the like from the top surface after the film formation so that the top surface is parallel to a reference surface such as a rear surface of the substrate. Such treatment is referred to as planarization treatment. Examples of the planarization treatment include CMP treatment and dry etching treatment. However, the top surface of the insulator 410 is not necessarily flat.

Next, the insulator 420 is formed over the insulator 410. The insulator 420 is preferably formed using a metal oxide, which can be formed by a sputtering method, a CVD method, an MBE method, a PLD method, an ALD method, or the like.

When aluminum oxide is formed as the insulator 420 by a sputtering method using oxygen plasma, oxygen can be added to the insulator 410. The added oxygen serves as excess oxygen in the insulator 410.

The insulator 420 may have a multilayer structure. For example, the multilayer structure may be formed in such a manner that an aluminum oxide is formed by a sputtering method and an aluminum oxide is formed over the aluminum oxide by an ALD method. Alternatively, the multilayer structure may be formed in such a manner that an aluminum oxide is formed by an ALD method and an aluminum oxide is formed over the aluminum oxide by a sputtering method.

Here, sixth heat treatment can be performed. For this heat treatment, the conditions for the first heat treatment can be used. In this embodiment, the sixth heat treatment is performed in an oxygen atmosphere at 350° C. for one hour.

Through the above-described process, a semiconductor device including the transistor 1000 can be manufactured (see FIGS. 1A to 1C).

Embodiment 3

In this embodiment, one embodiment of a semiconductor device will be described with reference to FIG. 17, FIG. 18, FIG. 19, FIG. 20, FIG. 21, and FIG. 22.

[Memory Device 1]

Figure 17:
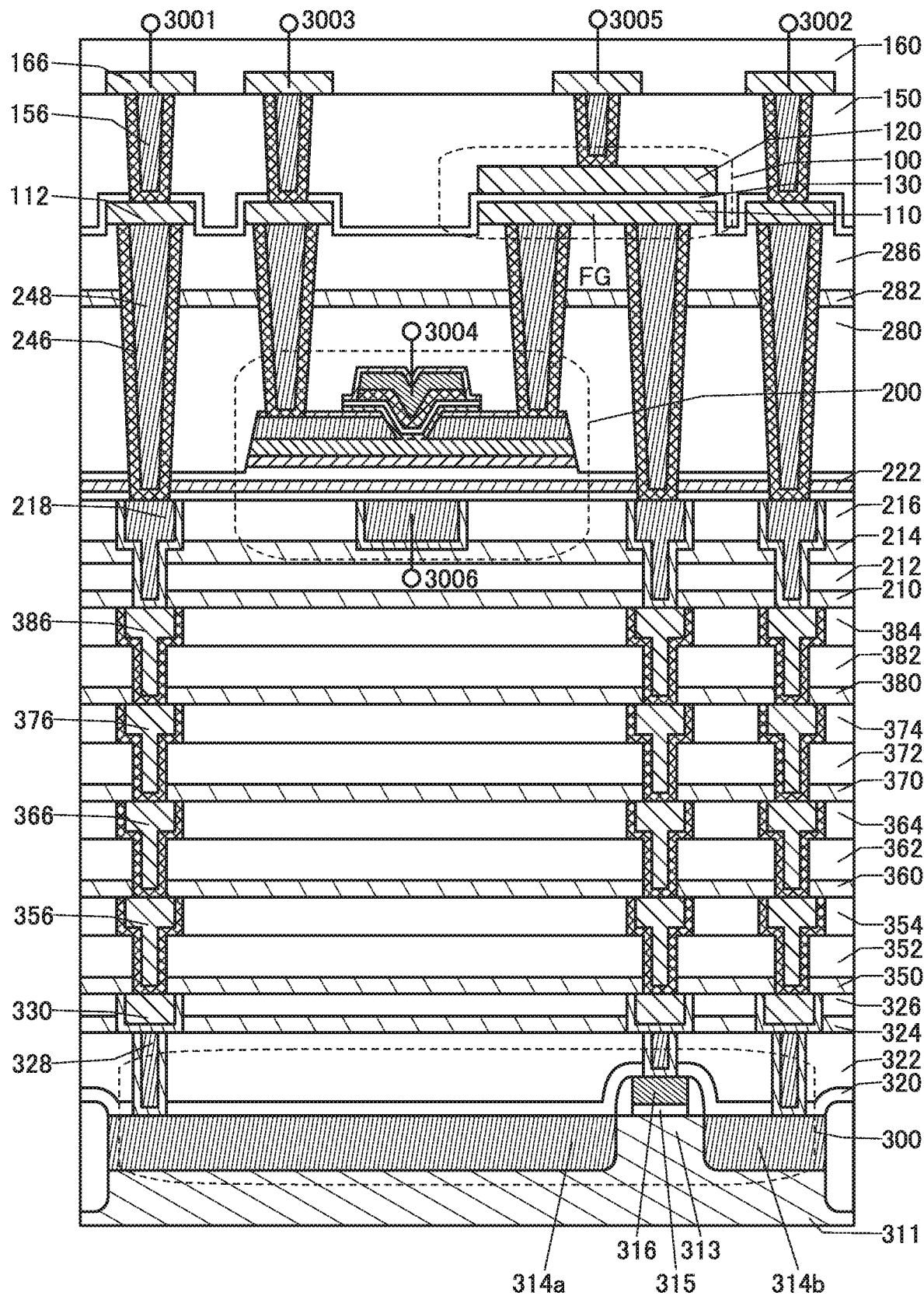
FIG. 17 is a cross-sectional view illustrating a structure of a memory device of one embodiment of the present invention.
Figure 18:
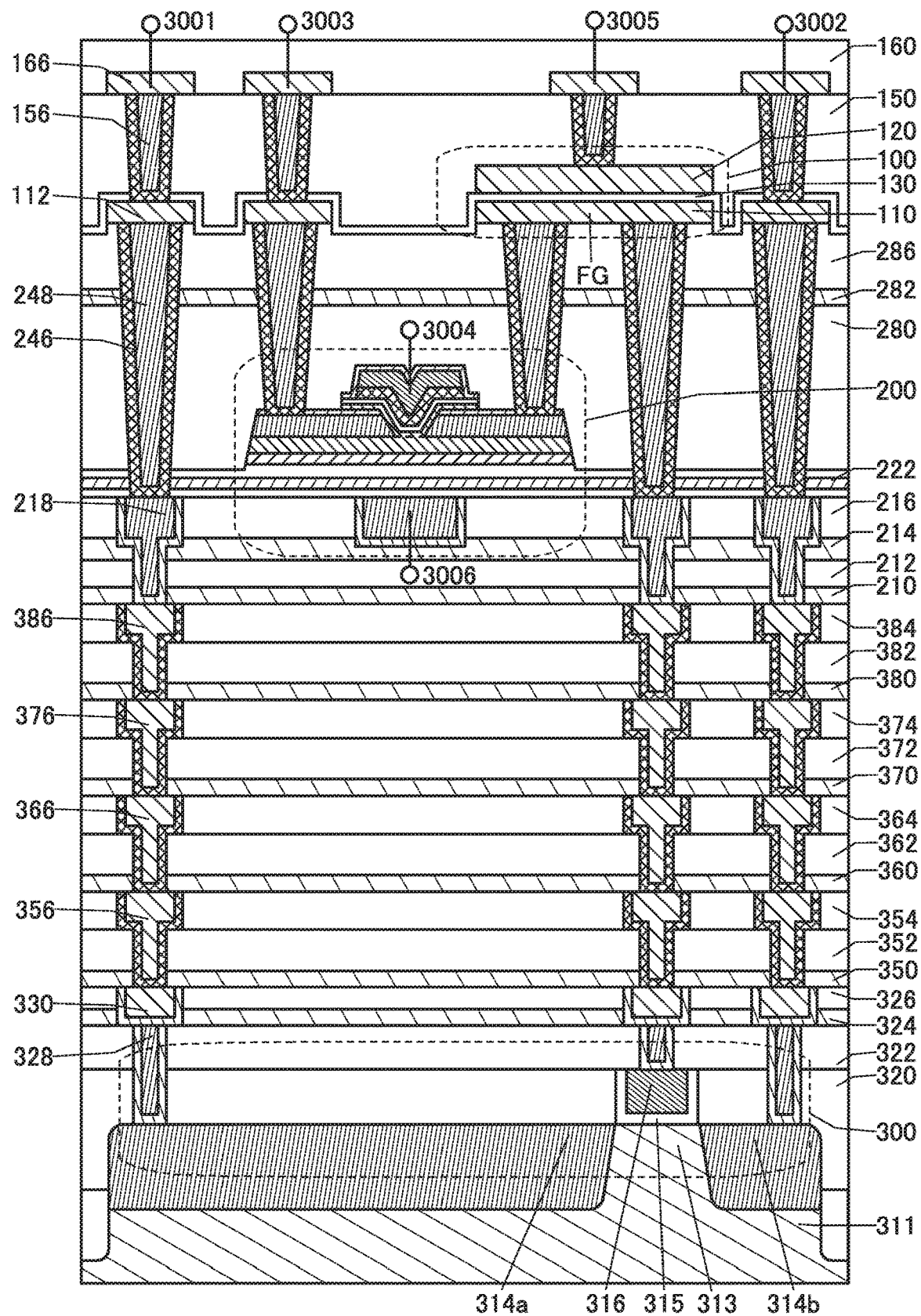
FIG. 18 is a cross-sectional view illustrating a structure of a memory device of one embodiment of the present invention.

Semiconductor devices illustrated in FIG. 17 and FIG. 18 each include a transistor 300, a transistor 200, and a capacitor 100.

The transistor 200 is a transistor in which a channel is formed in a semiconductor layer including an oxide semiconductor. Since the off-state current of the transistor 200 is low, by using the transistor 200 in a memory device, stored data can be retained for a long time. In other words, such a memory device does not require refresh operation or has an extremely low frequency of the refresh operation, which leads to a sufficient reduction in power consumption.

In FIG. 17 and FIG. 18, a wiring 3001 is electrically connected to a source of the transistor 300. A wiring 3002 is electrically connected to a drain of the transistor 300. A wiring 3003 is electrically connected to one of a source and a drain of the transistor 200. A wiring 3004 is electrically connected to a first gate of the transistor 200. A wiring 3006 is electrically connected to a second gate of the transistor 200. A gate of the transistor 300 and the other of the source and the drain of the transistor 200 are electrically connected to one electrode of the capacitor 100. A wiring 3005 is electrically connected to the other electrode of the capacitor 100.

The semiconductor devices illustrated in FIG. 17 and FIG. 18 each have a feature that the potential of the gate of the transistor 300 can be retained, and thus enables writing, retaining, and reading of data as follows.

Writing and retaining of data will be described. First, the potential of the wiring 3004 is set to a potential at which the transistor 200 is turned on, so that the transistor 200 is turned on. Accordingly, the potential of the wiring 3003 is supplied to a node FG where the gate of the transistor 300 and the one electrode of the capacitor 100 are electrically connected to each other. That is, a predetermined charge is supplied to the gate of the transistor 300 (writing). Here, one of two kinds of charges providing different potential levels (hereinafter referred to as a low-level charge and a high-level charge) is supplied. After that, the potential of the wiring 3004 is set to a potential at which the transistor 200 is turned off, so that the transistor 200 is turned off. Thus, the charge is retained at the node FG (retaining).

In the case where the off-state current of the transistor 200 is low, the charge of the node FG is retained for a long time.

Next, reading of data is described. An appropriate potential (a reading potential) is supplied to the wiring 3005 while a predetermined potential (a constant potential) is supplied to the wiring 3001, whereby the potential of the wiring 3002 varies depending on the amount of charge retained in the node FG. This is because in the case of using an n-channel transistor as the transistor 300, an apparent threshold voltage $V_{th\_H}$ at the time when the high-level charge is given to the gate of the transistor 300 is lower than an apparent threshold voltage $V_{th\_L}$ at the time when the low-level charge is given to the gate of the transistor 300. Here, an apparent threshold voltage refers to the potential of the wiring 3005 which is needed to make the transistor 300 be in "on state." Thus, the potential of the wiring 3005 is set to a potential $V_0$ which is between $V_{th\_H}$ and $V_{th\_L}$, whereby charge supplied to the node FG can be determined. For example, in the case where the high-level charge is supplied to the node FG in writing and the potential of the wiring 3005 is $V_0$ ($>V_{th\_H}$), the transistor 300 is brought into "on state." On the other hand, in the case where the low-level charge is supplied to the node FG in writing, even when the potential of the wiring 3005 is $V_0$ ($<V_{th\_L}$), the transistor 300 remains in "off state." Thus, the data retained in the node FG can be read by determining the potential of the wiring 3002.

<Structure of Semiconductor Device 1>

The semiconductor device of one embodiment of the present invention includes the transistor 300, the transistor 200, and the capacitor 100 as illustrated in FIG. 17. The transistor 200 is provided above the transistor 300, and the capacitor 100 is provided above the transistor 300 and the transistor 200.

The transistor 300 is provided over a substrate 311 and includes a conductor 316, an insulator 315, a semiconductor region 313 that is a part of the substrate 311, and low-resistance regions 314a and 314b functioning as a source region and a drain region.

Although the transistor 300 is an n-channel transistor in description in this embodiment, the transistor 300 may be either a p-channel transistor or an n-channel transistor.

It is preferable that a region of the semiconductor region 313 where a channel is formed, a region in the vicinity thereof, the low-resistance regions 314a and 314b functioning as a source region and a drain region, and the like contain a semiconductor such as a silicon-based semiconductor, further preferably single crystal silicon. Alternatively, a material including germanium (Ge), silicon germanium (SiGe), gallium arsenide (GaAs), gallium aluminum arsenide (GaAlAs), or the like may be contained. Silicon whose effective mass is controlled by applying stress to the crystal lattice and thereby changing the lattice spacing may be contained. Alternatively, the transistor 300 may be a high-electron-mobility transistor (HEMT) with GaAs and GaAlAs, or the like.

The low-resistance regions 314a and 314b contain an element which imparts n-type conductivity, such as arsenic or phosphorus, or an element which imparts p-type conductivity, such as boron, in addition to a semiconductor material used for the semiconductor region 313.

The conductor 316 functioning as a gate electrode can be formed using a semiconductor material such as silicon containing the element which imparts n-type conductivity, such as arsenic or phosphorus, or the element which imparts p-type conductivity, such as boron, or a conductive material such as a metal material, an alloy material, or a metal oxide material.

Note that a work function of a conductor is determined by a material of the conductor, whereby the threshold voltage can be adjusted. Specifically, it is preferable to use titanium nitride, tantalum nitride, or the like as the conductor. Furthermore, in order to ensure the conductivity and embeddability of the conductor, it is preferable to use a stacked layer of metal materials such as tungsten and aluminum as the conductor. In particular, tungsten is preferable in terms of heat resistance.

Note that the transistor 300 illustrated in FIG. 17 is only an example and is not limited to the structure illustrated therein; an appropriate transistor may be used in accordance with a circuit configuration or a driving method.

An insulator 320, an insulator 322, an insulator 324, and an insulator 326 are stacked sequentially so as to cover the transistor 300.

The insulator 320, the insulator 322, the insulator 324, and the insulator 326 can be formed using, for example, silicon oxide, silicon oxynitride, silicon nitride oxide, silicon nitride, aluminum oxide, aluminum oxynitride, aluminum nitride oxide, aluminum nitride, or the like.

The insulator 322 may function as a planarization film for eliminating a level difference caused by the transistor 300 or the like underlying the insulator 322. For example, the top surface of the insulator 322 may be planarized by planarization treatment using a chemical mechanical polishing (CMP) method or the like to increase the level of planarity.

The insulator 324 is preferably formed using a film having a barrier property that prevents impurities and hydrogen from diffusing from the substrate 311, the transistor 300, or the like into a region where the transistor 200 is formed.

As an example of the film having a barrier property against hydrogen, silicon nitride formed by a CVD method can be given. The diffusion of hydrogen to a semiconductor element including an oxide semiconductor, such as the transistor 200, degrades the characteristics of the semiconductor element in some cases. Therefore, a film that prevents hydrogen diffusion is preferably provided between the transistor 200 and the transistor 300. Specifically, the film that prevents hydrogen diffusion is a film from which hydrogen is less likely to be released.

The amount of released hydrogen can be measured by thermal desorption spectroscopy (TDS), for example. The amount of hydrogen released from the insulator 324 that is converted into hydrogen atoms per unit area of the insulator 324 is less than or equal to $10 \times 10^{15}$ atoms/cm$^2$, preferably less than or equal to $5 \times 10^{15}$ atoms/cm$^2$ in the TDS analysis in the range of 50° C. to 500° C., for example.

Note that the permittivity of the insulator 326 is preferably lower than that of the insulator 324. For example, the relative permittivity of the insulator 326 is preferably lower than 4, further preferably lower than 3. For example, the relative permittivity of the insulator 326 is preferably 0.7 times or less that of the insulator 324, further preferably 0.6 times or less that of the insulator 324. In the case where a material with a low permittivity is used as an interlayer film, the parasitic capacitance between wirings can be reduced.

A conductor 328, a conductor 330, and the like that are electrically connected to the capacitor 100 or the transistor 200 are provided in the insulator 320, the insulator 322, the insulator 324, and the insulator 326. Note that the conductor 328 and the conductor 330 each function as a plug or a wiring. A plurality of structures of conductors functioning as plugs or wirings are collectively denoted by the same reference numeral in some cases. Furthermore, in this specification and the like, a wiring and a plug electrically connected to the wiring may be a single component. That is, there are cases where part of a conductor functions as a wiring and part of a conductor functions as a plug.

As a material of each of plugs and wirings (e.g., the conductor 328 and the conductor 330), a conductive material such as a metal material, an alloy material, a metal nitride material, or a metal oxide material can be used in a single-layer structure or a stacked-layer structure. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

A wiring layer may be provided over the insulator 326 and the conductor 330. For example, in FIG. 17, an insulator 350, an insulator 352, and an insulator 354 are stacked sequentially. Furthermore, a conductor 356 is formed in the insulator 350, the insulator 352, and the insulator 354. The conductor 356 functions as a plug or a wiring. Note that the conductor 356 can be formed using a material similar to those used for forming the conductor 328 and the conductor 330.

Note that for example, the insulator 350 is preferably formed using an insulator having a barrier property against hydrogen, like the insulator 324. Furthermore, the conductor 356 preferably includes a conductor having a barrier property against hydrogen. The conductor having a barrier property against hydrogen is formed particularly in an opening of the insulator 350 having a barrier property against hydrogen. In such a structure, the transistor 300 and the transistor 200 can be separated by a barrier layer, so that the diffusion of hydrogen from the transistor 300 to the transistor 200 can be prevented.

Note that as the conductor having a barrier property against hydrogen, tantalum nitride may be used, for example. By stacking tantalum nitride and tungsten, which has high conductivity, the diffusion of hydrogen from the transistor 300 can be prevented while the conductivity of a wiring is ensured. In this case, a tantalum nitride layer having a barrier property against hydrogen is preferably in contact with the insulator 350 having a barrier property against hydrogen.

A wiring layer may be provided over the insulator 350 and the conductor 356. For example, in FIG. 17, an insulator 360, an insulator 362, and an insulator 364 are stacked sequentially. Furthermore, a conductor 366 is formed in the insulator 360, the insulator 362, and the insulator 364. The conductor 366 functions as a plug or a wiring. Note that the conductor 366 can be formed using a material similar to those used for forming the conductor 328 and the conductor 330.

Note that for example, the insulator 360 is preferably formed using an insulator having a barrier property against hydrogen, like the insulator 324. Furthermore, the conductor 366 preferably includes a conductor having a barrier property against hydrogen. The conductor having a barrier property against hydrogen is formed particularly in an opening of the insulator 360 having a barrier property against hydrogen. In such a structure, the transistor 300 and the transistor 200 can be separated by a barrier layer, so that the diffusion of hydrogen from the transistor 300 to the transistor 200 can be prevented.

A wiring layer may be provided over the insulator 364 and the conductor 366. For example, in FIG. 17, an insulator 370, an insulator 372, and an insulator 374 are stacked sequentially. Furthermore, a conductor 376 is formed in the insulator 370, the insulator 372, and the insulator 374. The conductor 376 functions as a plug or a wiring. Note that the conductor 376 can be formed using a material similar to those used for forming the conductor 328 and the conductor 330.

Note that for example, the insulator 370 is preferably formed using an insulator having a barrier property against hydrogen, like the insulator 324. Furthermore, the conductor 376 preferably includes a conductor having a barrier property against hydrogen. The conductor having a barrier property against hydrogen is formed particularly in an opening of the insulator 370 having a barrier property against hydrogen. In such a structure, the transistor 300 and the transistor 200 can be separated by a barrier layer, so that the diffusion of hydrogen from the transistor 300 to the transistor 200 can be prevented.

A wiring layer may be provided over the insulator 374 and the conductor 376. For example, in FIG. 17, an insulator 380, an insulator 382, and an insulator 384 are stacked sequentially. Furthermore, a conductor 386 is formed in the insulator 380, the insulator 382, and the insulator 384. The conductor 386 functions as a plug or a wiring. Note that the conductor 386 can be formed using a material similar to those used for forming the conductor 328 and the conductor 330.

Note that for example, the insulator 380 is preferably formed using an insulator having a barrier property against hydrogen, like the insulator 324. Furthermore, the conductor 386 preferably includes a conductor having a barrier property against hydrogen. The conductor having a barrier property against hydrogen is formed particularly in an opening of the insulator 380 having a barrier property against hydrogen. In such a structure, the transistor 300 and the transistor 200 can be separated by a barrier layer, so that the diffusion of hydrogen from the transistor 300 to the transistor 200 can be prevented.

An insulator 210, the insulator 212, the insulator 214, and the insulator 216 are stacked sequentially over the insulator 384. A material having a barrier property against oxygen and hydrogen is preferably used for any of the insulator 210, the insulator 212, the insulator 214, and the insulator 216.

The insulators 210 and 214 are preferably formed using, for example, a film having a barrier property that prevents hydrogen and impurities from diffusing from the substrate 311, a region where the transistor 300 is formed, or the like to a region where the transistor 200 is formed. Therefore, the insulators 210 and 214 can be formed using a material similar to that used for forming the insulator 324.

As an example of the film having a barrier property against hydrogen, silicon nitride formed by a CVD method can be given. The diffusion of hydrogen to a semiconductor element including an oxide semiconductor, such as the transistor 200, degrades the characteristics of the semiconductor element in some cases. Therefore, a film that prevents hydrogen diffusion is preferably provided between the transistor 200 and the transistor 300. Specifically, the film that prevents hydrogen diffusion is a film from which hydrogen is less likely to be released.

As the film having a barrier property against hydrogen, for example, as each of the insulators 210 and 214, a metal oxide such as aluminum oxide, hafnium oxide, or tantalum oxide is preferably used.

In particular, aluminum oxide has an excellent blocking effect that prevents permeation of oxygen and impurities such as hydrogen and moisture which cause a change in electrical characteristics of the transistor. Accordingly, the use of aluminum oxide can prevent entry of impurities such as hydrogen and moisture into the transistor 200 in and after a manufacturing process of the transistor. In addition, release of oxygen from the oxide in the transistor 200 can be prevented. Therefore, aluminum oxide is suitably used as a protective film for the transistor 200.

For example, the insulators 212 and 216 can be formed using a material similar to that used for forming the insulator 320. In the case where interlayer films are formed of a material with a relatively low permittivity, the parasitic capacitance between wirings can be reduced. For example, a silicon oxide film, a silicon oxynitride film, or the like can be used for the insulators 212 and 216.

A conductor 218, a conductor (the conductor 205) included in the transistor 200, and the like are provided in the insulators 210, 212, 214, and 216. Note that the conductor 218 functions as a plug or a wiring that is electrically connected to the capacitor 100 or the transistor 300. The conductor 218 can be formed using a material similar to those used for forming the conductors 328 and 330.

In particular, part of the conductor 218 which is in contact with the insulators 210 and 214 is preferably a conductor with a barrier property against oxygen, hydrogen, and water. In such a structure, the transistors 300 and 200 can be completely separated by the layer with a barrier property against oxygen, hydrogen, and water. As a result, the diffusion of hydrogen from the transistor 300 to the transistor 200 can be prevented.

The transistor 200 is provided over the insulator 216. Note that, for example, the structure of the transistor included in the semiconductor device described in the above embodiment can be used as the structure of the transistor 200. Note that the transistor 200 in FIG. 17 is only an example and is not limited to the structure illustrated therein; an appropriate transistor may be used in accordance with a circuit configuration or a driving method.

The insulator 280 is provided over the transistor 200. In the insulator 280, an excess-oxygen region is preferably formed. In particular, in the case of using an oxide semiconductor in the transistor 200, when an insulator including an excess-oxygen region is provided in an interlayer film or the like in the vicinity of the transistor 200, oxygen vacancies in the oxide 230 included in the transistor 200 are reduced, whereby the reliability can be improved. The insulator 280 that covers the transistor 200 may function as a planarization film that covers a roughness thereunder.

As the insulator including the excess-oxygen region, specifically, an oxide material that releases part of oxygen by heating is preferably used. An oxide that releases part of oxygen by heating is an oxide film in which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in TDS analysis. Note that the temperature of the film surface in the TDS analysis is preferably higher than or equal to 100° C. and lower than or equal to 700° C., or higher than or equal to 100° C. and lower than or equal to 500° C.

For example, as such a material, a material containing silicon oxide or silicon oxynitride is preferably used. Alternatively, a metal oxide can be used. Note that in this specification, "silicon oxynitride" refers to a material that contains oxygen at a higher proportion than nitrogen, and "silicon nitride oxide" refers to a material that contains nitrogen at a higher proportion than oxygen.

The insulator 282 is provided over the insulator 280. A material having a barrier property against oxygen or hydrogen is preferably used for the insulator 282. Thus, the insulator 282 can be formed using a material similar to that used for forming the insulator 214. As the insulator 282, a metal oxide such as aluminum oxide, hafnium oxide, or tantalum oxide is preferably used, for example.

In particular, aluminum oxide has an excellent blocking effect that prevents permeation of oxygen and impurities such as hydrogen and moisture which cause a change in electrical characteristics of the transistor. Accordingly, the use of aluminum oxide can prevent entry of impurities such as hydrogen and moisture into the transistor 200 in and after a manufacturing process of the transistor. In addition, release of oxygen from the oxide in the transistor 200 can be prevented. Therefore, aluminum oxide is suitably used as a protective film for the transistor 200.

The insulator 286 is provided over the insulator 282. The insulator 286 can be formed using a material similar to that of the insulator 320. In the case where a material with a relatively low permittivity is used for an interlayer film, the parasitic capacitance between wirings can be reduced. For example, a silicon oxide film, a silicon oxynitride film, or the like can be used for the insulator 286.

The conductors 246, the conductors 248, and the like are provided in the insulators 220, 222, 224, 280, 282, and 286.

The conductors 246 and 248 function as plugs or wirings that are electrically connected to the capacitor 100, the transistor 200, or the transistor 300. The conductors 246 and 248 can be formed using a material similar to those used for forming the conductors 328 and 330.

The capacitor 100 is provided above the transistor 200. The capacitor 100 includes a conductor 110, a conductor 120, and an insulator 130.

A conductor 112 may be provided over the conductors 246 and 248. Note that the conductor 112 functions as a plug or a wiring that is electrically connected to the capacitor 100, the transistor 200, or the transistor 300. The conductor 110 functions as the one electrode of the capacitor 100. The conductor 112 and the conductor 110 can be formed at the same time.

The conductor 112 and the conductor 110 can be formed using a metal film containing an element selected from molybdenum, titanium, tantalum, tungsten, aluminum, copper, chromium, neodymium, and scandium; a metal nitride film containing any of the above elements as its component (e.g., a tantalum nitride film, a titanium nitride film, a molybdenum nitride film, or a tungsten nitride film); or the like. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

The conductor 112 and the conductor 110 each have a single-layer structure in FIG. 17; however, one embodiment of the present invention is not limited thereto, and a stacked-layer structure of two or more layers may be used. For example, between a conductor having a barrier property and a conductor having high conductivity, a conductor which is highly adhesive to the conductor having a barrier property and the conductor having high conductivity may be formed.

As a dielectric of the capacitor 100, the insulator 130 is provided over the conductors 112 and 110. The insulator 130 can be formed to have a single-layer structure or a stacked-layer structure using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, or the like.

For example, a material with high dielectric strength, such as silicon oxynitride, is preferably used for the insulator 130. In the capacitor 100 having the structure, the dielectric strength can be increased and the electrostatic breakdown of the capacitor 100 can be prevented because of the insulator 130.

Over the insulator 130, the conductor 120 is provided so as to overlap with the conductor 110. Note that the conductor 120 can be formed using a conductive material such as a metal material, an alloy material, or a metal oxide material. It is preferable to use a high-melting-point material which has both heat resistance and conductivity, such as tungsten or molybdenum, and it is particularly preferable to use tungsten. In the case where the conductor 120 is formed concurrently with another component such as a conductor, Cu (copper), Al (aluminum), or the like which is a low-resistance metal material may be used.

An insulator 150 is provided over the conductor 120 and the insulator 130. The insulator 150 can be formed using a material similar to that used for forming the insulator 320. The insulator 150 may function as a planarization film that covers a roughness thereunder.

The above is the description of the structure example. With the use of the structure, a change in electrical characteristics can be prevented and reliability can be improved in a semiconductor device including a transistor including an oxide semiconductor. A transistor including an oxide semiconductor with a high on-state current can be provided. A transistor including an oxide semiconductor with a low off-state current can be provided. A semiconductor device with low power consumption can be provided.

Modification Example 1 of Memory Device 1

FIG. 18 illustrates a modification example of this embodiment. FIG. 18 is different from FIG. 17 in the structure of the transistor 300.

In the transistor 300 illustrated in FIG. 18, the semiconductor region 313 (part of the substrate 311) in which the channel is formed has a protruding portion. Furthermore, the conductor 316 is provided to cover the top and side surfaces of the semiconductor region 313 with the insulator 315 positioned therebetween. Note that the conductor 316 may be formed using a material for adjusting the work function. The transistor 300 having such a structure is also referred to as a FIN transistor because the protruding portion of the semiconductor substrate is utilized. An insulator serving as a mask for forming the protruding portion may be provided in contact with the top surface of the protruding portion. Although the case where the protruding portion is formed by processing part of the semiconductor substrate is described here, a semiconductor film having a protruding shape may be formed by processing an SOI substrate.

The above is the description of the modification example. With the use of the structure, a change in electrical characteristics can be prevented and reliability can be improved in a semiconductor device including a transistor including an oxide semiconductor. A transistor including an oxide semiconductor with a high on-state current can be provided. A transistor including an oxide semiconductor with a low off-state current can be provided. A semiconductor device with low power consumption can be provided.

Modification Example 2 of Memory Device 1

Figure 19:
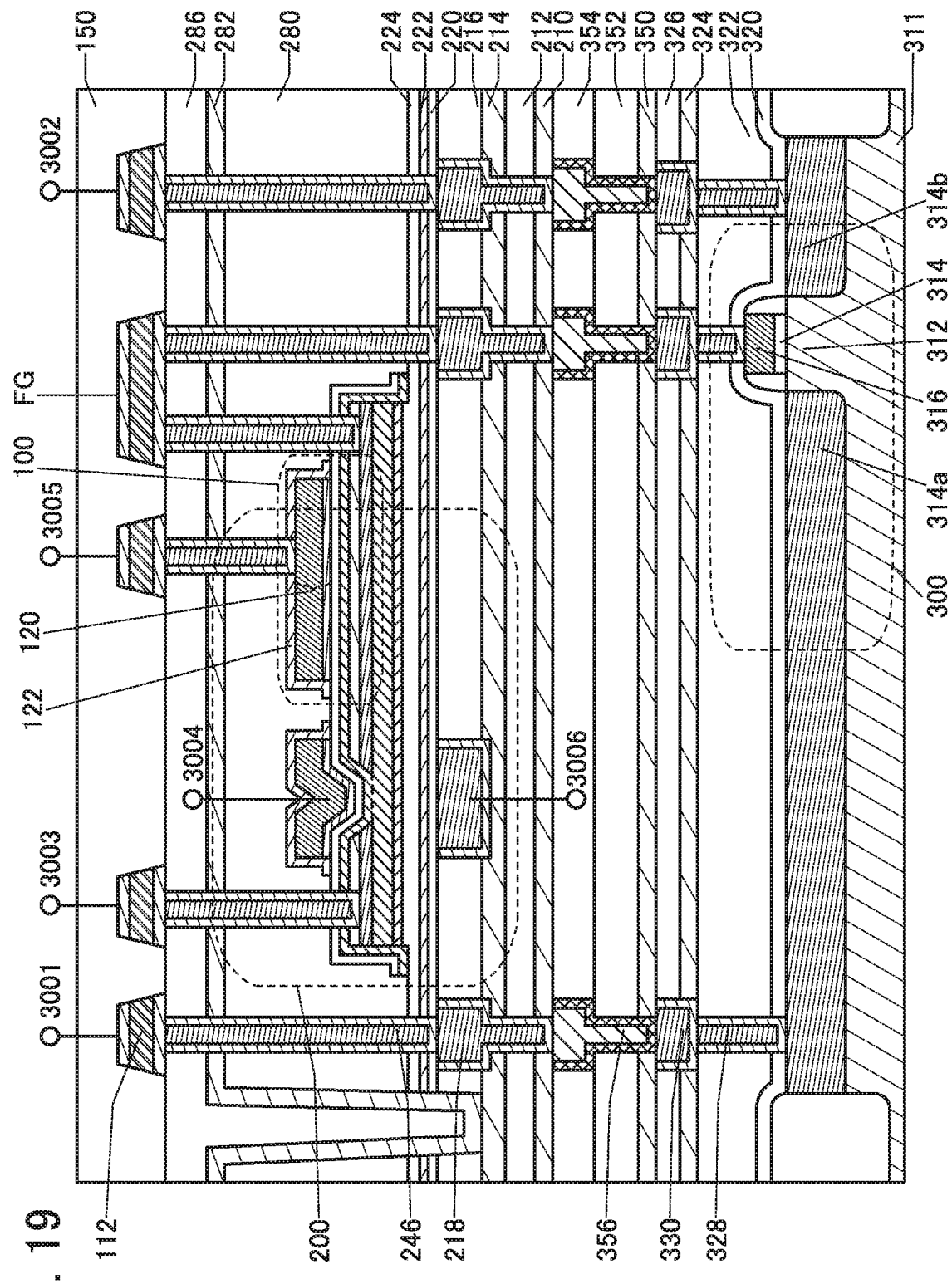
FIG. 19 is a cross-sectional view illustrating a structure of a memory device of one embodiment of the present invention.

FIG. 19 illustrates a modification example of the memory device. FIG. 19 differs from FIG. 17 and FIG. 18 in the placement of the capacitor 100 and the like.

The capacitor 100 illustrated in FIG. 19 can be formed in the same step as the transistor 200. The capacitor 100 illustrated in FIG. 19 includes a barrier layer 122, the conductor 120, an insulator 250, an oxide 230c, a barrier layer 245b, and a conductor 240b. The conductor 120 and the conductor 240b serve as the electrodes of the capacitor 100. The barrier layer 245b, the oxide 230c, and the insulator 250 serve as a dielectric of the capacitor 100. Note that the barrier layer 122 has a function of preventing oxidation of the conductor 120.

The conductor 120 and the conductor 404 are the same layer and can be formed in the same step. The barrier layer 122 and the insulator 418 are the same layer and can be formed in the same step. Accordingly, the process can be shortened, leading to an improvement in productivity.

With the structure illustrated in FIG. 19, the transistor 200 and the capacitor 100 can be formed through the same steps, whereby the process can be shortened.

With the use of the structure, a change in electrical characteristics can be prevented and reliability can be improved in a memory device including a transistor including an oxide semiconductor. A transistor including an oxide semiconductor with a high on-state current can be provided. A transistor including an oxide semiconductor with a low off-state current can be provided. A memory device with low power consumption can be provided.

The above is the description of the modification example. With the use of the structure, a change in electrical characteristics can be prevented and reliability can be improved in a semiconductor device including a transistor including an oxide semiconductor. A transistor including an oxide semiconductor with a high on-state current can be provided. A transistor including an oxide semiconductor with a low off-state current can be provided. A semiconductor device with low power consumption can be provided.

<Structure of Memory Cell Array>

Figure 20:
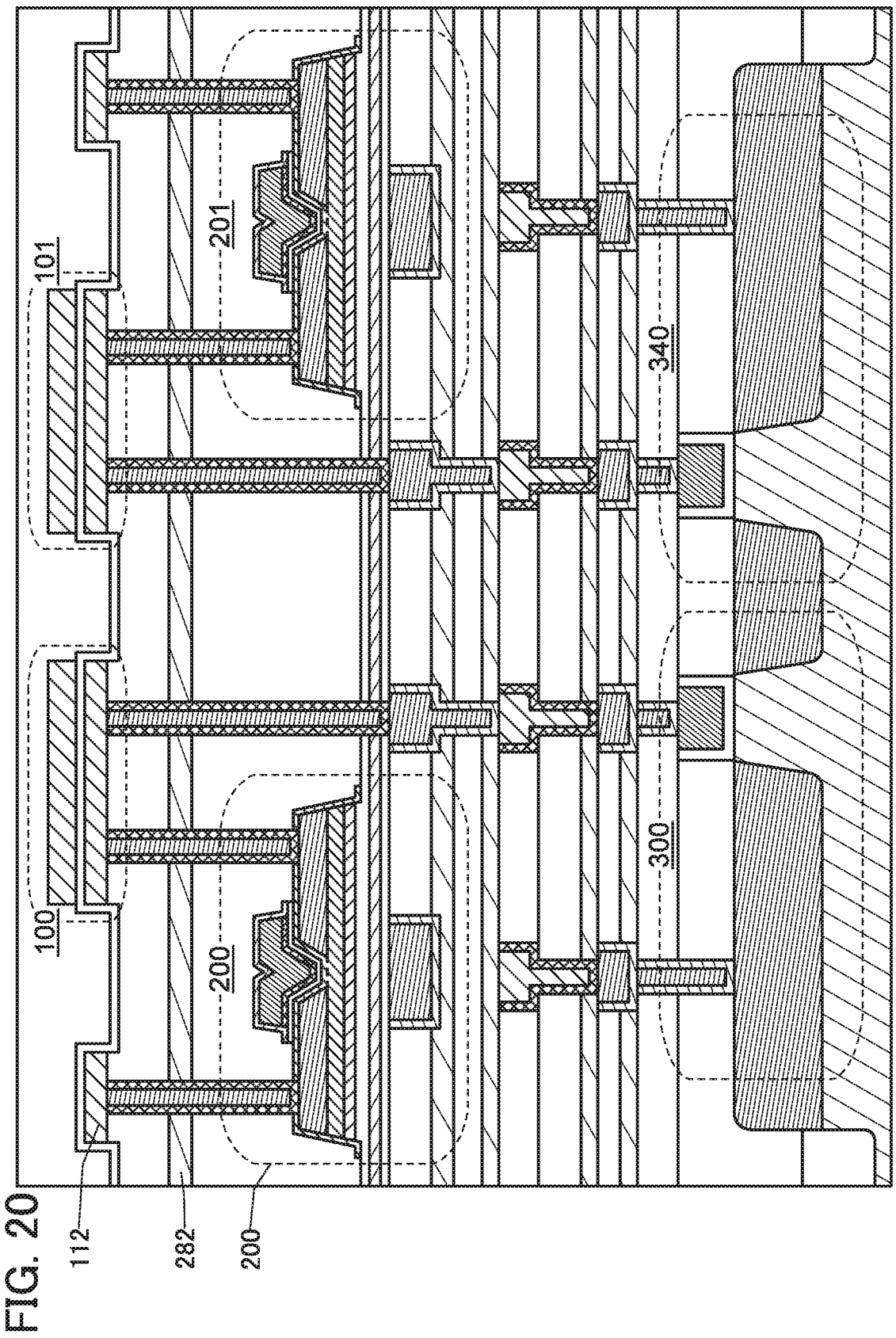
FIG. 20 is a cross-sectional view illustrating a structure of a memory device of one embodiment of the present invention.

FIG. 20 illustrates an example of a memory cell array of this embodiment. By arranging semiconductor devices illustrated in FIG. 17 and FIG. 18 in a matrix, a memory cell array can be formed. FIG. 20 is a cross-sectional view which illustrates part of a row in which the semiconductor devices illustrated in FIG. 18 are arranged in a matrix.

In FIG. 20, the semiconductor device which includes the transistor 300, the transistor 200, and the capacitor 100 and a semiconductor which includes a transistor 340, a transistor 201, and a capacitor 101 are arranged in the same row.

As illustrated in FIG. 20, the memory cell array includes a plurality of transistors (the transistors 200 and 201 in the drawing).

Note that in the case where memory cells are arrayed, it is necessary that data of a desired memory cell is read in read operation. For example, in the case of a NOR-type memory cell array, only data of a desired memory cell can be read by turning off the transistors 300 of memory cells from which data is not read. In this case, a potential at which the transistor 300 is turned off regardless of the charge supplied to the node FG, that is, a potential lower than $V_{th\_H}$ is supplied to the wiring 3005. Alternatively, in the case of a NAND-type memory cell array, for example, only data of a desired memory cell can be read by turning on the transistors 300 of memory cells from which data is not read. In this case, a potential at which the transistor 300 is turned on regardless of the charge supplied to the node FG, that is, a potential higher than $V_{th\_L}$ is supplied to the wiring 3005 connected to the memory cells from which data is not read.

[Memory Device 2]

Figure 21:
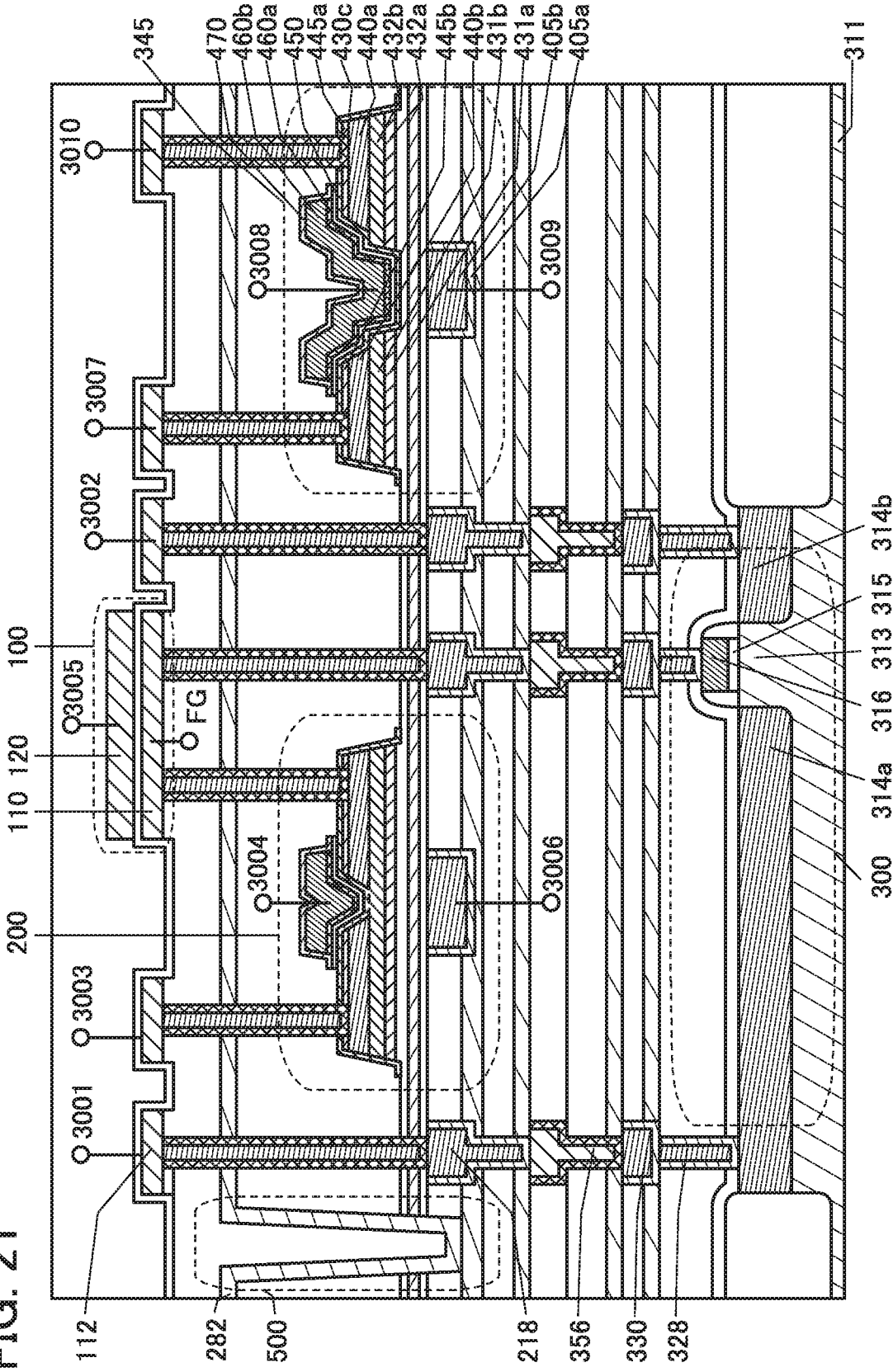
FIG. 21 is a cross-sectional view illustrating a structure of a memory device of one embodiment of the present invention.

FIG. 21 illustrates an example of a memory device using the semiconductor device of one embodiment of the present invention.

The memory device illustrated in FIG. 21 includes a transistor 345 in addition to the semiconductor device illustrated in FIG. 17 that includes the transistor 200, the transistor 300, and the capacitor 100.

The transistor 345 can control second gate voltage of the transistor 200. For example, a first gate and a second gate of the transistor 345 are diode-connected to a source thereof, and the source of the transistor 345 is connected to the second gate of the transistor 200. When a negative potential of the second gate of the transistor 200 is held in this structure, first gate-source voltage and second gate-source voltage of the transistor 345 are 0 V. In the transistor 345, a drain current when the second gate voltage and first gate voltage are 0 V is extremely low; thus, the negative potential of the second gate of the transistor 200 can be held for a long time even without power supply to the transistors 200 and 345. Accordingly, the memory device including the transistors 200 and 345 can retain stored data for a long time.

In FIG. 21, the wiring 3001 is electrically connected to the source of the transistor 300. The wiring 3002 is electrically connected to the drain of the transistor 300. The wiring 3003 is electrically connected to one of the source and the drain of the transistor 200. The wiring 3004 is electrically connected to the first gate of the transistor 200. The wiring 3006 is electrically connected to the second gate of the transistor 200. The gate of the transistor 300 and the other of the source and the drain of the transistor 200 are electrically connected to one electrode of the capacitor 100. The wiring 3005 is electrically connected to the other electrode of the capacitor 100. A wiring 3007 is electrically connected to the source of the transistor 345. A wiring 3008 is electrically connected to the first gate of the transistor 345. A wiring 3009 is electrically connected to the second gate of the transistor 345. A wiring 3010 is electrically connected to the drain of the transistor 345. The wirings 3006, 3007, 3008, and 3009 are electrically connected one another.

The memory device illustrated in FIG. 21 has a feature that the potential of the gate of the transistor 300 can be held and thus enables writing, retaining, and reading of data as described below.

The memory devices illustrated in FIG. 21 are arranged in a matrix like the memory devices illustrated in FIG. 17, whereby a memory cell array can be formed. Note that one transistor 345 can control second gate voltages of the transistors 200. For this reason, the number of transistors 345 can be smaller than the number of transistors 200.

<Structure of Memory Device 2>

The transistor 345 and the transistor 200 are formed in the same tier and thus can be fabricated in parallel. The transistor 345 includes a conductor 460 (including a conductor 460a and a conductor 460b) functioning as a first gate electrode, a conductor 405 (including a conductor 405a and a conductor 405b) functioning as a second gate electrode, a barrier layer 470 in contact with the conductor 460, the insulators 220, 222, and 224 and an insulator 450 functioning as gate insulating layers, an oxide 430c including a channel formation region, a conductor 440a and oxides 431a and 431b functioning as one of a source and a drain, and a conductor 440b and oxides 432a and 432b functioning as the other of the source and the drain, and a barrier layer 445 (a barrier layer 445a and a barrier layer 445b).

In the transistor 345, the conductor 405 is in the same tier as the conductor 205. The oxides 431a and 432a are in the same tier as the oxide 230a, and the oxides 431b and 432b are in the same tier as the oxide 230b. The conductors 440 are in the same tier as the conductors 240. The oxide 430c is in the same tier as the oxide 230c. The insulator 450 is in the same tier as the insulator 250. The conductor 460 is in the same tier as the conductor 260. The barrier layer 470 is in the same tier as the barrier layer 270.

In the oxide 430c functioning as an active layer of the transistor 345, oxygen vacancies and impurities such as hydrogen or water are reduced, as in the oxide 230 or the like. Accordingly, the threshold voltage of the transistor 345 can be higher than 0 V, an off-state current can be reduced, and the drain current when the second gate voltage and the first gate voltage are 0 V can be extremely low.

A dicing line (also referred to as a scribe line, a dividing line, or a cutting line) that is provided when a large-sized substrate is divided into semiconductor elements so that a plurality of semiconductor devices are each formed in a chip form will be described. In an example of a dividing method, for example, a groove (a dicing line) for separating the semiconductor elements is formed on the substrate, and then the substrate is cut along the dicing line so that a plurality of semiconductor devices that are separated are obtained. FIG. 21 is a cross-sectional view of a structure 500 around the dicing line, for example.

As in the structure 500, for example, openings are provided in the insulators 280, 224, 222, 220, and 216 around a region overlapping with the dicing line formed in an end portion of the memory cell including the transistor 200 or the transistor 345. Furthermore, the insulator 282 is provided so as to cover side surfaces of the insulators 280, 224, 222, 220, and 216.

Thus, in the openings, the insulators 222 and 214 are in contact with the insulator 282. At that time, at least one of the insulators 222 and 214 is formed using the same material and method as those used for forming the insulator 282, whereby adhesion therebetween can be improved. Aluminum oxide can be used, for example.

With such a structure, the insulator 280 and the transistors 200 and 345 can be enclosed with the insulators 210, 222, and 282. Since the insulators 210, 222, and 282 have functions of preventing the diffusion of oxygen, hydrogen, and water even when the substrate is divided into circuit regions each of which is provided with the semiconductor elements in this embodiment to form a plurality of chips, the entry and diffusion of impurities such as hydrogen or water from the direction of a side surface of the divided substrate to the transistor 200 or the transistor 345 can be prevented.

Furthermore, in the structure, excess oxygen in the insulator 280 can be prevented from diffusing to the outside of the insulators 282 and 222. Accordingly, excess oxygen in the insulator 280 is efficiently supplied to the oxide where the channel is formed in the transistor 200 or the transistor 345. The oxygen can reduce oxygen vacancies in the oxide where the channel is formed in the transistor 200 or the transistor 345. Thus, the oxide where the channel is formed in the transistor 200 or the transistor 345 can be an oxide semiconductor with a low density of defect states and stable characteristics. That is, a change in electrical characteristics of the transistor 200 or the transistor 345 can be prevented and the reliability can be improved.

Modification Example 1 of Memory Device 2

Figure 22:
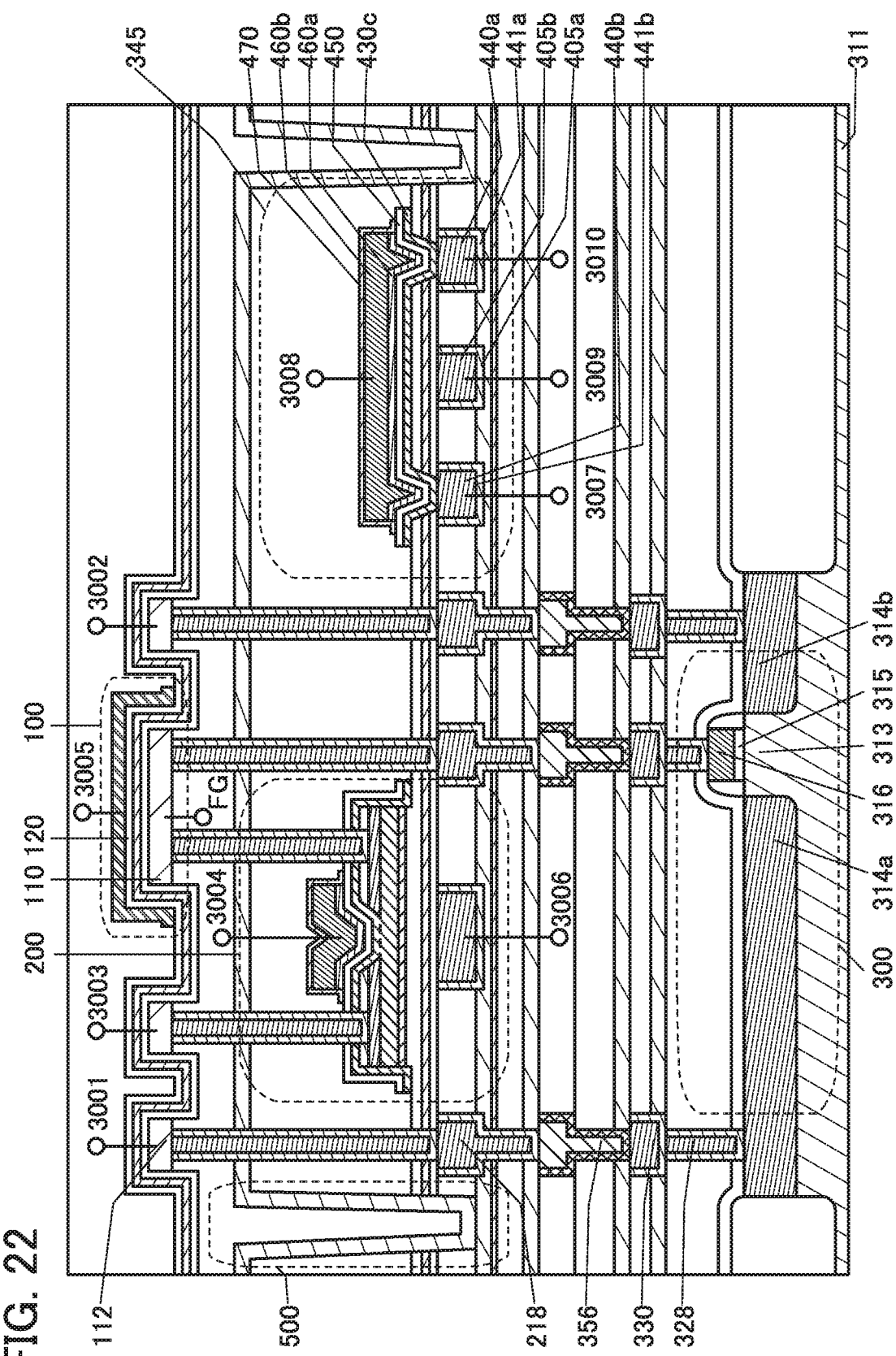
FIG. 22 is a cross-sectional view illustrating a structure of a memory device of one embodiment of the present invention.

FIG. 22 illustrates a modification example of this embodiment. FIG. 22 is different from FIG. 21 in the structure of the transistor 345.

In the transistor 345 illustrated in FIG. 22, the conductor 440a, a conductor 441a, the conductor 440b, and a conductor 441b are provided in the same layer as the conductor 405. That is, the source or drain electrode of the transistor 345 can be provided concurrently with the second gate electrode.

The above is the description of the modification example. With the use of the structure, a change in electrical characteristics can be prevented and reliability can be improved in a semiconductor device including a transistor including an oxide semiconductor. A transistor including an oxide semiconductor with a high on-state current can be provided. A transistor including an oxide semiconductor with a low off-state current can be provided. A semiconductor device with low power consumption can be provided.

Embodiment 4

In this embodiment, one embodiment of a semiconductor device will be described with reference to FIGS. 23A and 23B and FIGS. 24A and 24B.
<Semiconductor Wafer and Chip>

Figure 23A:
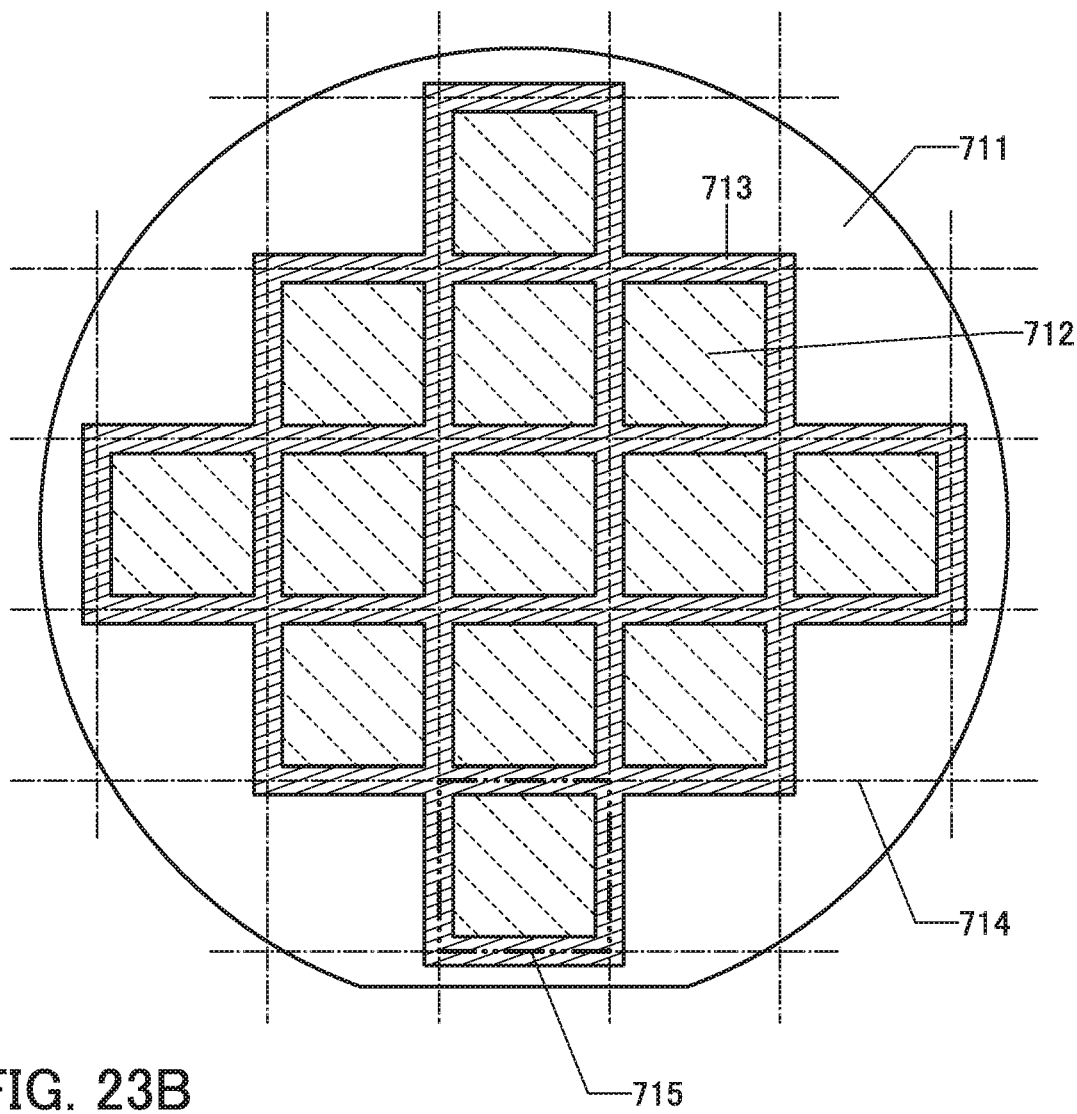
FIGS. 23A and 23B are top views illustrating a semiconductor wafer of one embodiment of the present invention.

FIG. 23A is a top view illustrating a substrate 711 before dicing treatment. As the substrate 711, a semiconductor substrate (also referred to as a "semiconductor wafer") can be used, for example. A plurality of circuit regions 712 are provided over the substrate 711. A semiconductor device or the like of one embodiment of the present invention can be provided in the circuit region 712.

Figure 23B:
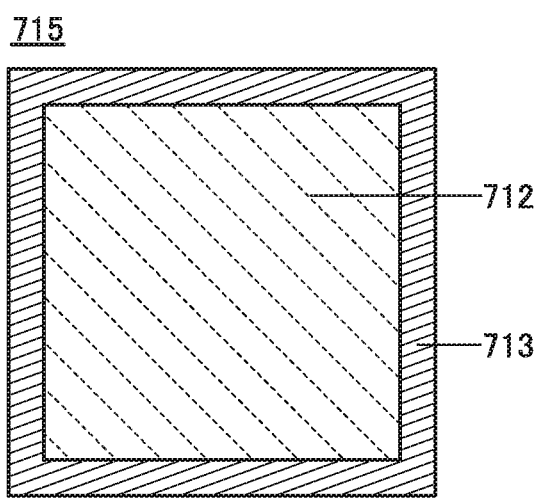

The plurality of circuit regions 712 are each surrounded by a separation region 713. Separation lines (also referred to as "dicing lines") 714 are set at a position overlapping with the separation regions 713. The substrate 711 can be cut along the separation lines 714 into chips 715 including the circuit regions 712. FIG. 23B is an enlarged view of the chip 715.

A conductive layer, a semiconductor layer, or the like may be provided in the separation regions 713. Providing a conductive layer, a semiconductor layer, or the like in the separation regions 713 relieves ESD that might be caused in a dicing step, preventing a decrease in the yield of the dicing step. A dicing step is generally performed while pure water whose specific resistance is decreased by dissolution of a carbonic acid gas or the like is supplied to a cut portion, in order to cool down a substrate, remove swarf, and prevent electrification, for example. Providing a conductive layer, a semiconductor layer, or the like in the separation regions 713 allows a reduction in the usage of the pure water. Therefore, the cost of manufacturing semiconductor devices can be reduced. Thus, semiconductor devices can be manufactured with improved productivity.
<Electronic Component>

Figure 24A:
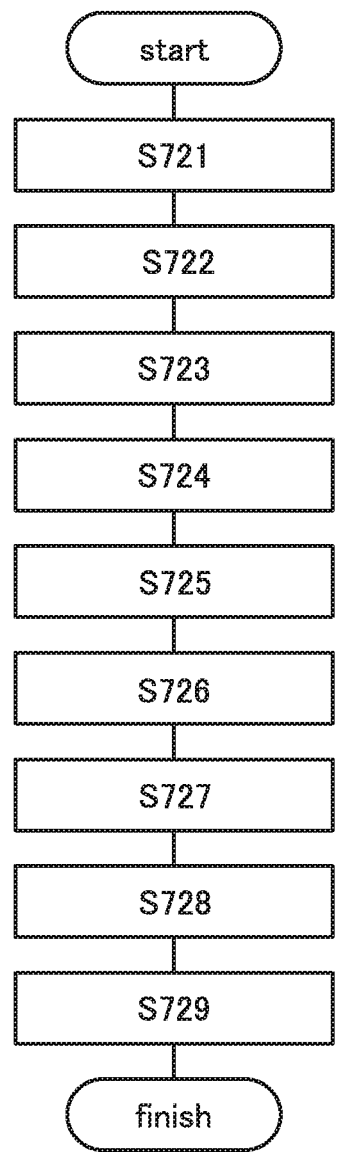
FIG. 24A is a flowchart showing an example of a manufacturing process of an electronic component.

An example of an electronic component using the chip 715 will be described with reference to FIGS. 24A and 24B. Note that the electronic component is also referred to as a semiconductor package or an IC package. The electronic component has a plurality of standards, names, and the like depending on a terminal extraction direction, a terminal shape, and the like.

The electronic component is completed when the semiconductor device described in the above embodiment is combined with components other than the semiconductor device in an assembly process (post-process).

The post-process will be described with reference to a flow chart in FIG. 24A. After the semiconductor device of one embodiment of the present invention and the like are provided over the substrate 711 in a pre-process, a back surface grinding step in which a back surface (a surface where the semiconductor device and the like are not formed) of the substrate 711 is ground is performed (Step S721). When the substrate 711 is thinned by grinding, the size of the electronic component can be reduced.

Next, the substrate 711 is divided into a plurality of chips 715 in a dicing step (Step S722). Then, the divided chips 715 are individually bonded to a lead frame in a die bonding step (Step S723). To bond the chip 715 and a lead frame in the die bonding step, a method such as resin bonding or tape-automated bonding is selected as appropriate depending on products. Note that the chip 715 may be bonded to an interposer substrate instead of the lead frame.

Next, a wire bonding step for electrically connecting a lead of the lead frame and an electrode on the chip 715 through a metal wire is performed (Step S724). As the metal wire, a silver wire or a gold wire can be used. Ball bonding or wedge bonding can be used as the wire bonding.

The wire-bonded chip 715 is subjected to a molding step of sealing the chip with an epoxy resin or the like (Step S725). Through the molding step, the inside of the electronic component is filled with a resin, so that a wire for connecting the chip 715 to the lead can be protected from external mechanical force, and deterioration of characteristics (decrease in reliability) due to moisture or dust can be reduced.

Subsequently, the lead of the lead frame is plated in a lead plating step (Step S726). This plating process prevents rust of the lead and facilitates soldering at the time of mounting the chip on a printed wiring board in a later step. Then, the lead is cut and processed in a formation step (Step S727).

Next, a printing (marking) step is performed on a surface of the package (Step S728). After a testing step (Step S729) for checking whether an external shape is good and whether there is malfunction, for example, the electronic component is completed.

Figure 24B:
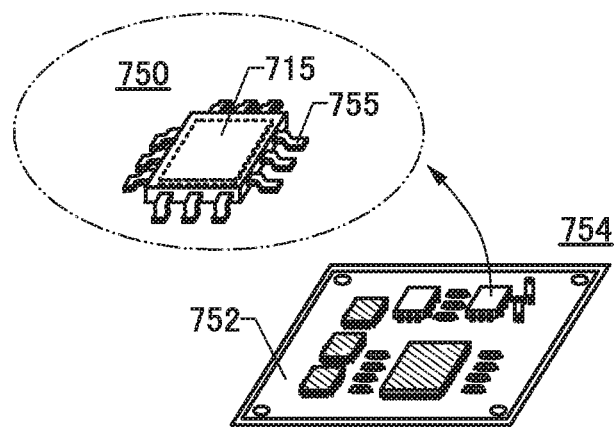
FIG. 24B is a schematic perspective view of the electronic component.

FIG. 24B is a perspective schematic diagram of a completed electronic component. FIG. 24B is a perspective schematic diagram illustrating a quad flat package (QFP) as an example of the electronic component. An electronic component 750 in FIG. 24B includes a lead 755 and the chip 715. The electronic component 750 may include more than one chip 715.

The electronic component 750 in FIG. 24B is mounted on a printed circuit board 752, for example. A plurality of electronic components 750 are combined and electrically connected to each other over the printed circuit board 752; thus, a circuit board on which the electronic components are mounted (a circuit board 754) is completed. The completed circuit board 754 is provided in an electronic device or the like.

Embodiment 5

<Electronic Device>

A semiconductor device of one embodiment of the present invention can be used for a variety of electronic devices. FIGS. 25A to 25F illustrate specific examples of the electronic devices including the semiconductor device of one embodiment of the present invention.

Figure 25A:
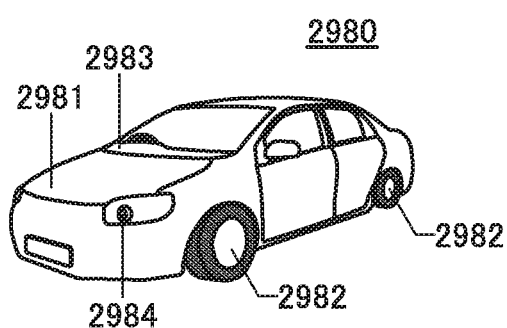
FIGS. 25A to 25F illustrate electronic devices of embodiments of the present invention.

FIG. 25A is an external view illustrating an example of a car. A car 2980 includes a car body 2981, wheels 2982, a dashboard 2983, lights 2984, and the like. The car 2980 includes an antenna, a battery, and the like.

Figure 25B:
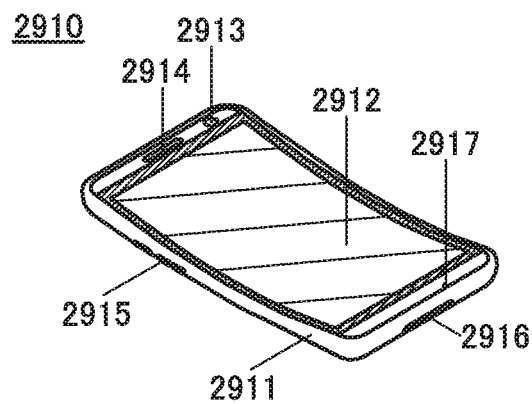

An information terminal 2910 illustrated in FIG. 25B includes a housing 2911, a display portion 2912, a microphone 2917, a speaker portion 2914, a camera 2913, an external connection portion 2916, an operation switch 2915, and the like. A display panel and a touch screen that use a flexible substrate are provided in the display portion 2912. In the housing 2911 of the information terminal 2910, an antenna, a battery, and the like are provided. The information terminal 2910 can be used as, for example, a smartphone, a mobile phone, a tablet information terminal, a tablet personal computer, or an e-book reader.

Figure 25C:
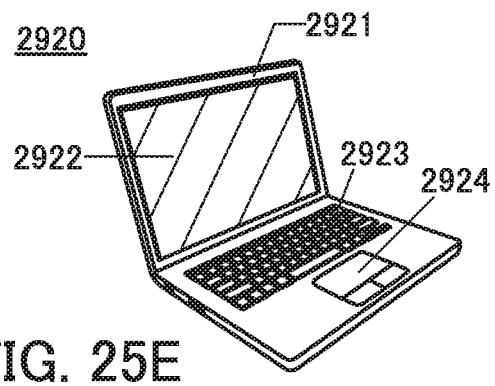

A notebook personal computer 2920 illustrated in FIG. 25C includes a housing 2921, a display portion 2922, a keyboard 2923, a pointing device 2924, and the like. In the housing 2921 of the notebook personal computer 2920, an antenna, a battery, and the like are provided.

Figure 25D:
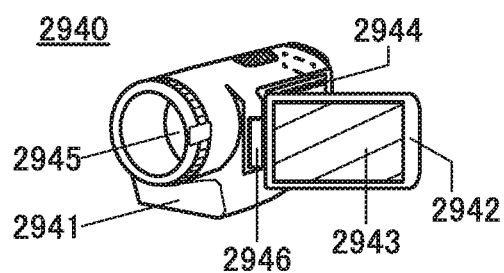

A video camera 2940 illustrated in FIG. 25D includes a housing 2941, a housing 2942, a display portion 2943, operation switches 2944, a lens 2945, a joint 2946, and the like. The operation switches 2944 and the lens 2945 are provided for the housing 2941, and the display portion 2943 is provided for the housing 2942. In the housing 2941 of the video camera 2940, an antenna, a battery, and the like are provided. The housing 2941 and the housing 2942 are connected to each other with the joint 2946, and the angle between the housing 2941 and the housing 2942 can be changed with the joint 2946. The orientation of an image on the display portion 2943 may be changed and display and non-display of an image can be switched depending on the angle between the housings 2941 and 2942.

Figure 25E:
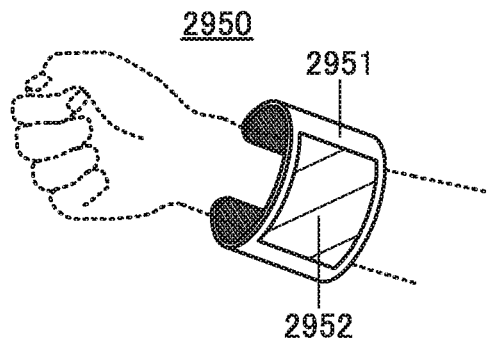

FIG. 25E illustrates an example of a bangle-type information terminal. An information terminal 2950 includes a housing 2951, a display portion 2952, and the like. In the housing 2951 of the information terminal 2950, an antenna, a battery, and the like are provided. The display portion 2952 is supported by the housing 2951 having a curved surface. A display panel formed with a flexible substrate is provided in the display portion 2952, whereby the information terminal 2950 can be a user-friendly information terminal that is flexible and lightweight.

Figure 25F:
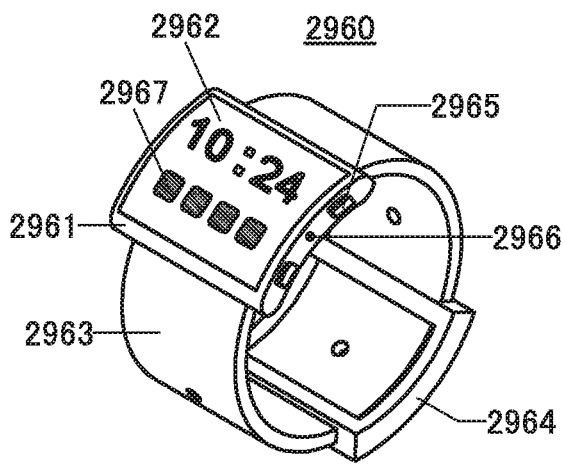

FIG. 25F illustrates an example of a watch-type information terminal. An information terminal 2960 includes a housing 2961, a display portion 2962, a band 2963, a buckle 2964, an operation switch 2965, an input/output terminal 2966, and the like. In the housing 2961 of the information terminal 2960, an antenna, a battery, and the like are provided. The information terminal 2960 is capable of executing a variety of applications such as mobile phone calls, e-mailing, viewing and editing texts, music reproduction, Internet communication, and a computer game.

The display surface of the display portion 2962 is curved, and images can be displayed on the curved display surface. In addition, the display portion 2962 includes a touch sensor, and operation can be performed by touching the screen with a finger, a stylus, or the like. For example, by touching an icon 2967 displayed on the display portion 2962, an application can be started. With the operation switch 2965, a variety of functions such as time setting, power on/off, on/off of wireless communication, setting and cancellation of a silent mode, and setting and cancellation of a power saving mode can be performed. For example, the functions of the operation switch 2965 can be set by setting the operation system incorporated in the information terminal 2960.

The information terminal 2960 can employ near field communication that is a communication method based on an existing communication standard. In that case, for example, mutual communication between the information terminal 2960 and a headset capable of wireless communication can be performed, and thus hands-free calling is possible. Moreover, the information terminal 2960 includes the input/output terminal 2966, and data can be directly transmitted to and received from another information terminal via a connector. In addition, charging via the input/output terminal 2966 is possible. Note that the charging operation may be performed by wireless power feeding without using the input/output terminal 2966.

For example, a memory device including the semiconductor device of one embodiment of the present invention can hold control data, a control program, or the like of the above electronic device for a long time. With the use of the semiconductor device of one embodiment of the present invention, a highly reliable electronic device can be provided.

This embodiment can be implemented in an appropriate combination with any of the structures described in the other embodiments, Example, and the like.

Example

In this example, the transistor 1000 (a sample A) included in the semiconductor device of one embodiment of the present invention illustrated in FIGS. 1A to 1C was fabricated. In addition, a comparative transistor (a sample B) in which the oxide 406$b$ (S2) and the oxide 406$c$ (S3) have different compositions was fabricated. The electrical characteristics of these transistors were measured and reliability tests were performed thereon.

To fabricate the transistor 1000, a 400-nm-thick silicon oxide film was formed over a p-type single crystal silicon wafer by a thermal oxidation method. Next, a 40-nm-thick first aluminum oxide film was formed over the silicon oxide film by a sputtering method. Then, a 150-nm-thick first silicon oxynitride film was formed over the first aluminum oxide film by a CVD method.

Next, a 35-nm-thick first tungsten film was formed over the first silicon oxynitride film by a sputtering method. Then, the first tungsten film was processed through a lithography method, so that a hard mask including the first tungsten film was formed.

Subsequently, the first silicon oxynitride film was processed, so that a groove reaching the first aluminum oxide film was formed. In the groove, a first tantalum nitride film was formed by a sputtering method and a first titanium nitride film and a second tungsten film were formed over the first tantalum nitride film by an ALD method and a CVD method. Then, the second tungsten film, the first titanium nitride film, the first tantalum nitride film, and the first tungsten film were polished by first CMP treatment until the top surface of the first silicon oxynitride film was exposed, and the second tungsten film, the first titanium nitride film, and the first tantalum nitride film were embedded in the groove; accordingly, a wiring layer and a second gate electrode were formed.

Next, a 10-nm-thick second silicon oxynitride film was formed by a CVD method. A 20-nm-thick hafnium oxide film was formed by an ALD method. Then, a 30-nm-thick third silicon oxynitride film was formed by a CVD method. The second silicon oxynitride film, the hafnium oxide film, and the third silicon oxynitride film serve as a second gate insulating film. Next, first heat treatment was performed.

The first heat treatment was performed in an atmosphere containing nitrogen at 400° C. for one hour, and subsequently another treatment was performed in an atmosphere containing oxygen at 400° C. for one hour.

Next, as a first oxide (S1), a 5-nm-thick In—Ga—Zn oxide was formed by a sputtering method. The S1 was formed under the following conditions: a target having an atomic ratio of In:Ga:Zn=1:3:4 was used, the oxygen gas flow rate was 45 sccm, the pressure was 0.7 Pa, and the substrate temperature was 200° C.

Then, as a second oxide (S2), a 20-nm-thick In—Ga—Zn oxide was formed over the S1 by a sputtering method. The S2 was formed under the following conditions: a target having an atomic ratio of In:Ga:Zn=4:2:4.1 was used, the argon gas flow rate was 40 sccm, the oxygen gas flow rate was 5 sccm, the pressure was 0.7 Pa, and the substrate temperature was 130° C. Note that S1 and S2 were continuously formed without being exposed to the atmosphere.

Then, second heat treatment was performed. As the second heat treatment, treatment was performed in an atmosphere containing nitrogen at 400° C. for one hour, and subsequently another treatment was performed in an atmosphere containing oxygen at 400° C. for one hour.

Next, a 20-nm-thick second tantalum nitride film was formed over the S2 by a sputtering method. Then, a 5-nm-thick second aluminum oxide film was formed over the second tantalum nitride film by an ALD method. Next, a 15-nm-thick third tantalum nitride film was formed over the second aluminum oxide film by a sputtering method.

Then, the third tantalum nitride film was etched by a lithography method. A dry etching method was used for the etching.

Then, by a lithography method, a resist mask was formed and the third tantalum nitride film, the second aluminum oxide film, and the second tantalum nitride film were sequentially etched with the use of the resist mask as an etching mask. After that, the resist mask was removed using oxygen plasma, and a portion of the second aluminum oxide film where a channel was formed was etched. Next, unnecessary portions of S2 and S1 were sequentially etched. A dry etching method was used for the etching.

Then, the second tantalum nitride film in a region where a channel is formed was etched. The third tantalum nitride film over the second aluminum oxide film was also etched by the etching. A dry etching method was used for the etching.

Next, S3 was formed. In the sample A and the sample B, oxides with different compositions were formed as S3. Specifically, as a third oxide (S3) in the sample A, a 5-nm-thick In—Ga—Zn oxide was formed by a sputtering method. The S3 was formed under the following conditions: a target having an atomic ratio of In:Ga:Zn=4:2:4.1 was used, the oxygen gas flow rate was 45 sccm, the pressure was 0.7 Pa, and the substrate temperature was 130° C.

As the third oxide (S3) in the sample B, a 5-nm-thick In—Ga—Zn oxide was formed by a sputtering method. The S3 was formed under the following conditions: a target having an atomic ratio of In:Ga:Zn=1:3:2 was used, the oxygen gas flow rate was 45 sccm, the pressure was 0.7 Pa, and the substrate temperature was 130° C.

Then, a 10-nm-thick fourth silicon oxynitride film functioning as a first gate oxide film was formed over S3 by a CVD method.

Then, a 10-nm-thick second titanium nitride film was formed over the fourth silicon oxynitride film by a sputtering method, and a 30-nm-thick third tungsten film was formed over the second titanium nitride film by a sputtering method. The second titanium nitride film and the third tungsten film were successively formed.

Next, the third tungsten film and the second titanium nitride film were sequentially etched by a lithography method, so that a gate electrode was formed. For the etching of the third tungsten film and the second titanium nitride film, a dry etching method was employed.

Next, a 7-nm-thick third aluminum oxide film was formed by an ALD method. The substrate temperature was 250° C.

Next, part of the third aluminum oxide film, part of the fourth silicon oxynitride film, and part of S3 were etched by a lithography method. A dry etching method was used for the etching.

Next, a 310-nm-thick fifth silicon oxynitride film was formed by a CVD method. Then, second CMP treatment was performed to polish the fifth silicon oxynitride film so that the surface of the fifth silicon oxynitride film was planarized.

Then, a 40-nm-thick fourth aluminum oxide film was formed over the fifth silicon oxynitride film by a sputtering method under the following conditions: the argon gas flow rate was 25 sccm, the oxygen gas flow rate was 25 sccm, the pressure was 0.4 Pa, and the substrate temperature was 250° C.

Then, fourth heat treatment was performed. The fourth heat treatment was performed in an atmosphere containing oxygen at 350° C. for one hour.

Next, a 100-nm-thick sixth silicon oxynitride film was formed by a CVD method.

Next, a 90-nm-thick fourth tungsten film was formed by a sputtering method. Next, a 130-nm-thick silicon nitride film was formed by a CVD method.

Then, a contact hole reaching the second tungsten film (second gate electrode), a contact hole reaching the third tungsten film (first gate electrode), and a contact hole reaching the second tantalum nitride film (source electrode and drain electrode) were formed by a lithography method using the fourth tungsten film and the silicon nitride film as etching masks. A 20-nm-thick third titanium nitride film was formed by an ALD method, and a 150-nm-thick fifth tungsten film was formed by a CVD method.

Then, the fifth tungsten film, the third titanium nitride film, the silicon nitride film, and the fifth tantalum nitride film were polished to reach the sixth silicon oxynitride film by third CMP treatment, so that the fifth tungsten film and the third titanium nitride film were embedded in each contact hole to form plugs.

Next, a 50-nm-thick sixth tungsten film was formed by a sputtering method. Next, the sixth tungsten film was etched by a lithography method to form a wiring layer.

Next, the fourth heat treatment was performed at 250° C. for one hour.

Next, 1-μm-thick photoresist was formed by a coating method. Then, a portion of the photoresist that is to be a measurement terminal (measurement pad) was removed by a lithography method.

Through these steps, the transistor 1000 (the sample A) and the comparative sample (the sample B) were fabricated.

Next, electrical characteristics of the transistor 1000 and the comparative sample were measured. Each of the sample A and the sample B is a 5-inch-square substrate, and transistors are disposed in the substrate.

The electrical characteristics of transistor 1000 and the comparative sample were measured by measuring change in source-drain voltage (hereinafter referred to as a drain current Id) when a source-gate voltage (hereinafter referred to as a gate voltage Vg) changed from −4.0 V to +4.0 V at a source-drain voltage (hereinafter referred to as a drain voltage Vd) of 0.1 V or 1.2 V. That is, Id-Vg characteristics were measured. Hereinafter, the gate voltage Vg refers to the potential of a first gate electrode (top gate electrode). In this measurement, the potential of a second gate electrode (back gate electrode) was set to 0 V. A potential of the back gate electrode is referred to as Vbg. In this measurement, the Id-Vg characteristics of nine transistors on each substrate were measured.

The sample A is a sample of one embodiment of the present invention fabricated in such a manner that S2 and S3 were formed by a sputtering method using a target with an atomic ratio of In:Ga:Zn=4:2:4.1. Therefore, each of S2 and S3 contains more In atoms than Ga atoms, and S2 and S3 have the same composition or similar compositions.

The sample B is a sample fabricated in such a manner that S2 was formed by a sputtering method using a target with an atomic ratio of In:Ga:Zn=4:2:4.1 and S3 was formed by a sputtering method using a target with an atomic ratio of In:Ga:Zn=1:3:2. Therefore, S2 and S3 are oxides with different compositions. S2, In contains more In atoms than Ga atoms, and S3 contains more Ga atoms than In atoms.

Figure 26A:
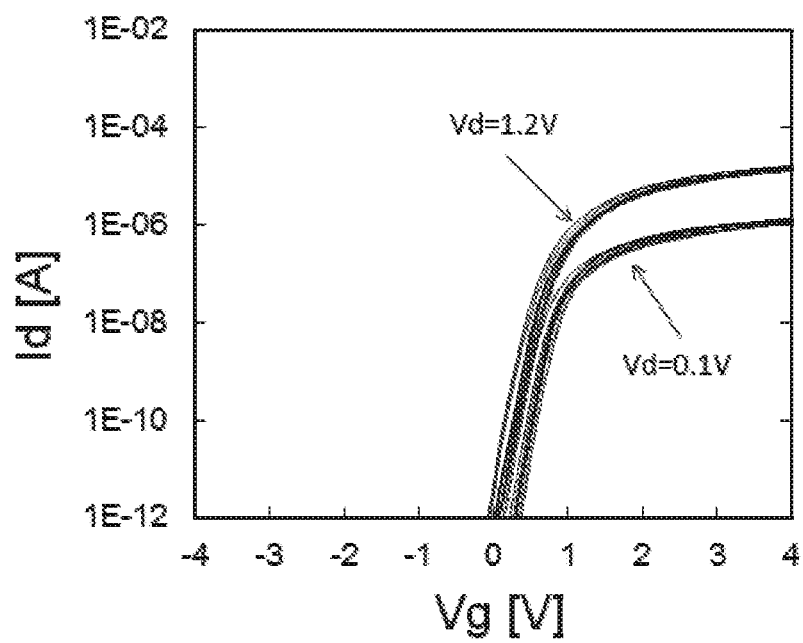
FIGS. 26A and 26B show Id-Vg characteristics in Example.
Figure 26B:
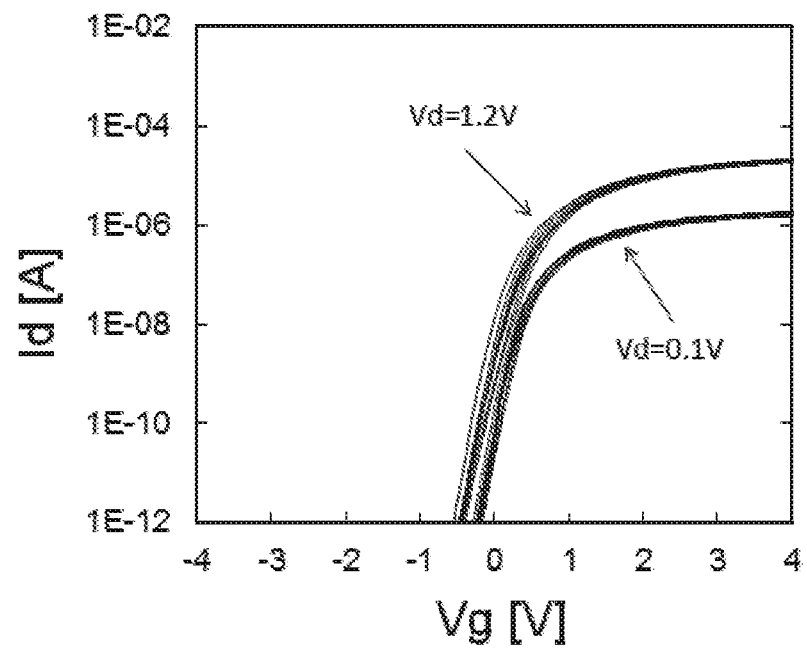

FIG. 26A shows the Id-Vg characteristics of the transistors 1000 in the sample A. FIG. 26B shows the Id-Vg characteristics of the transistors in the sample B. The transistors in the sample A and the transistors in the sample B are normally off and have favorable characteristics in which the transistors are sharply switched from an off state to an on state. In particular, Vsh of the transistors 1000 in the sample A is more on the positive side than Vsh of the transistors in the sample B, and a better result can be obtained from the sample A. Vsh is a value of Vg when $Id = 1 \times 10^{12}$ A.

Next, one transistor 1000 in the sample A and one transistor in the sample B were subjected to reliability tests. As one of the reliability tests, a +gate bias temperature (+GBT) stress test was performed. The +GBT stress test is one of the most important reliability tests of a transistor.

The +GBT stress test was performed under the conditions that the sample temperature was 125° C., Vg was +3.63 V, Vd and Vs were 0 V, and stress was applied for an hour (3600 s) at a maximum. During the stress test, at times when 100 s (0.028 h), 300 s (0.083 h), 600 s (0.17 h), 1000 s (0.28 h), 1800 s (0.5 h), and 3600 s (1 h) passed since stress application was started, Id-Vg characteristics were measured at a temperature of 125° C. In the Id-Vg characteristics measurement, Id was measured while Vg changes from −3.3 V to +3.3 V. Note that the potential of the second gate electrode was set at 0 V.

Here, as indexes of the amount of change in electrical characteristics of the transistor caused by stress, ΔIds (%) which shows a rate of change in Ids and ΔVsh (V) which shows a rate of time-dependent change in Vsh were used. Ids is Id when Vd is 1.2 V and Vg is 3.3 V. ΔIds (%) is a rate of change between Ids when stress application was started and Ids when stress time has passed. ΔVsh is a difference between Vsh when stress application was started and Vsh when stress time has passed.

Figure 27A:
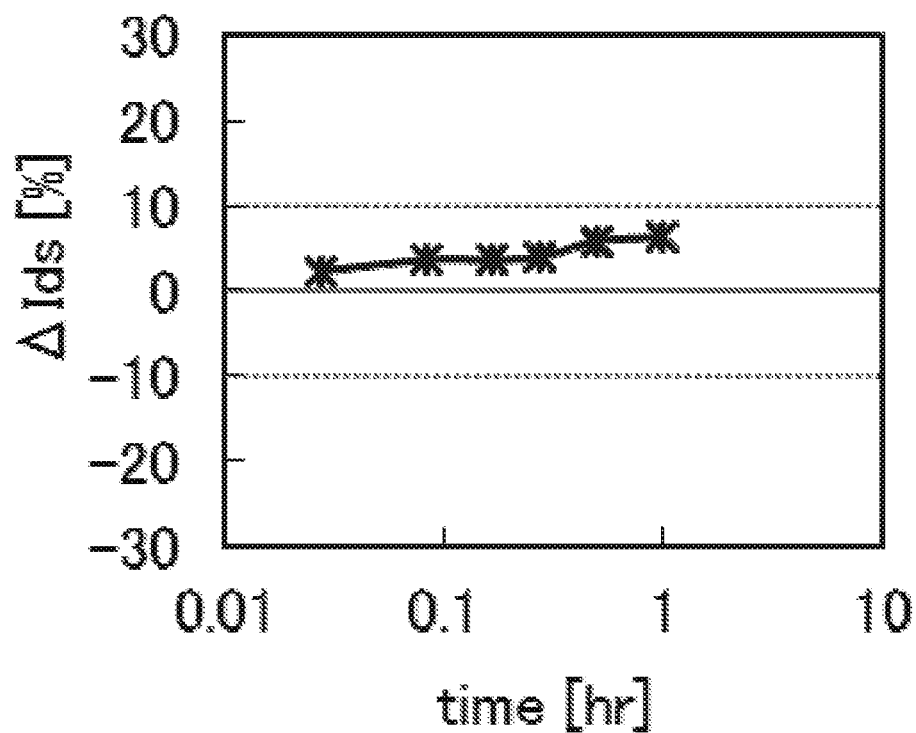
FIGS. 27A and 27B are graphs showing +GBT stress time dependence of ΔIds and ΔVsh, respectively, in Example.
Figure 27B:
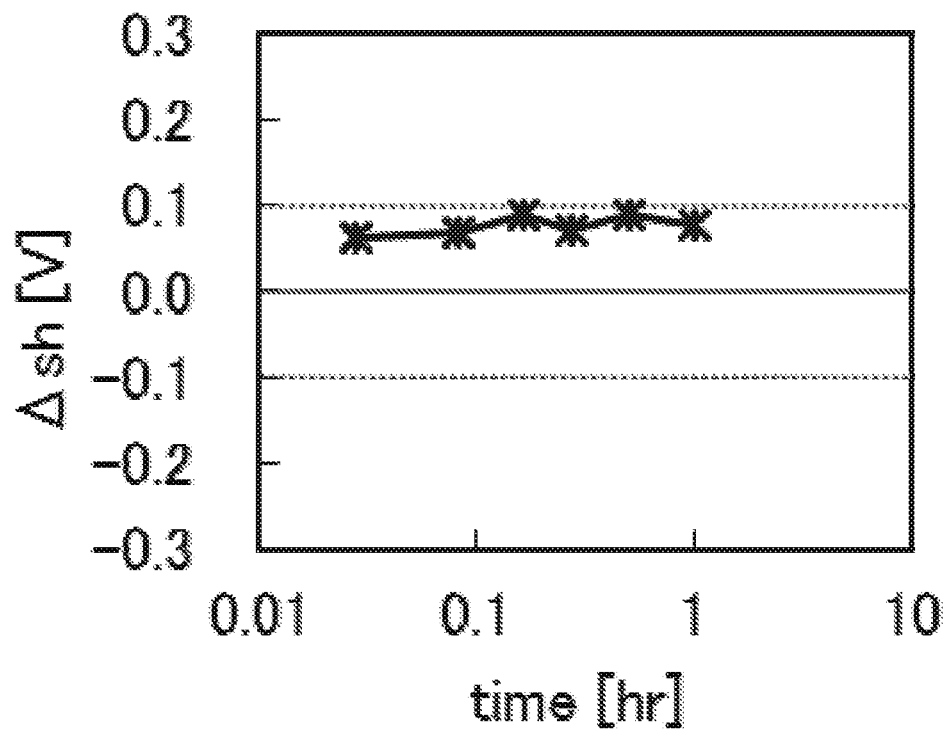

FIGS. 27A and 27B are graphs showing the +GBT stress time dependence of ΔIds and ΔVsh of the transistor 1000 in the sample A. FIG. 27A is a graph showing the stress time dependence of ΔIds, and the rate of change is within ±10% even after a stress time of an hour has passed. FIG. 27B is a graph showing the stress time dependence of ΔVsh, and the rate of change is within ±0.1 V even after a stress time of an hour has passed.

Figure 28A:
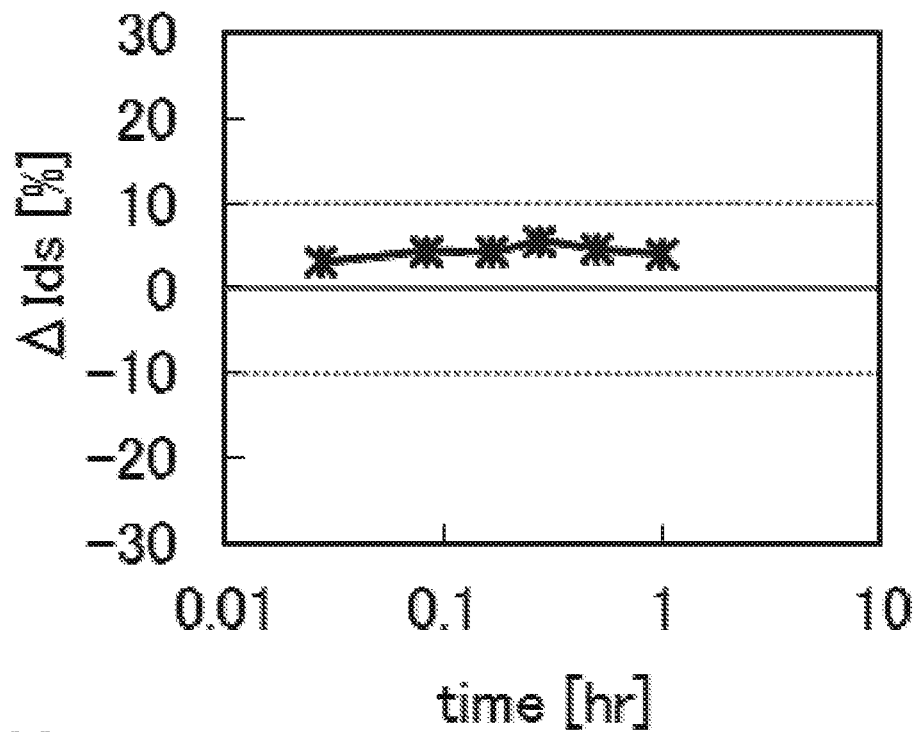
FIGS. 28A and 28B are graphs showing +GBT stress time dependence of ΔIds and ΔVsh, respectively, in Example.
Figure 28B:
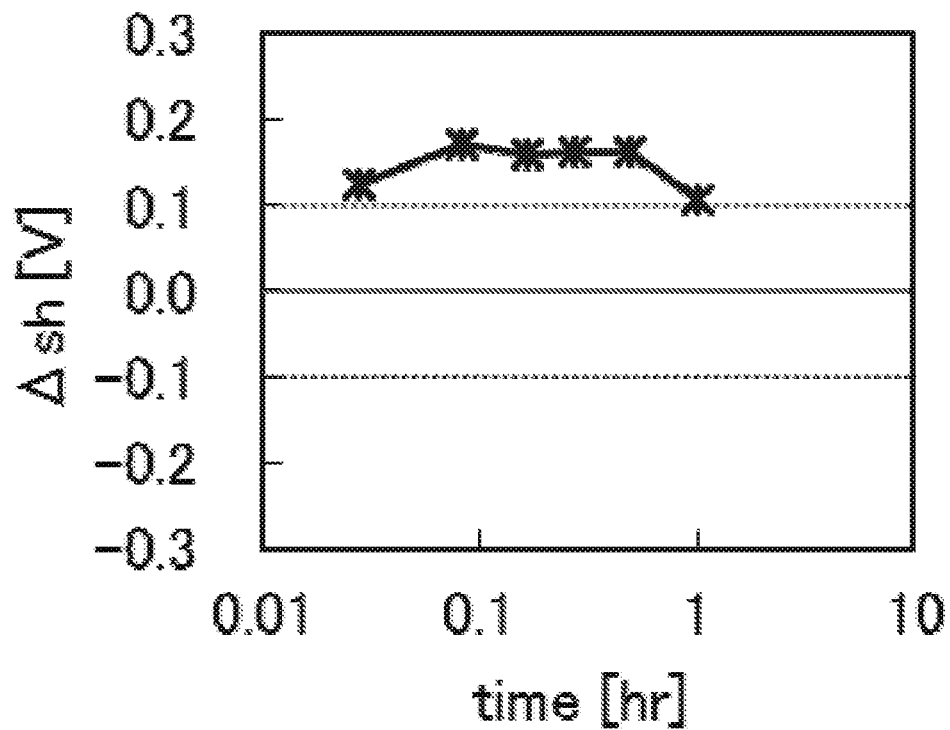

FIGS. 28A and 28B are graphs showing the +GBT stress time dependence of ΔIds and ΔVsh of the transistor in the sample B. FIG. 28A is a graph showing the stress time dependence of ΔIds, and the rate of change is within ±10% even after a stress time of an hour has passed. FIG. 28B is a graph showing the stress time dependence of ΔVsh, and the rate of change already exceeds +0.1 V at a stress time of 100 s (0.028 h).

As described above, according to the results of the Id-Vg characteristics measurement and the +GBT stress test, it is found that the transistor 1000 in which each of S2 and S3 contains more In atoms than Ga atoms and S2 and S3 have the same composition or similar compositions has favorable Id-Vg characteristics and high reliability.

Figure 29A:
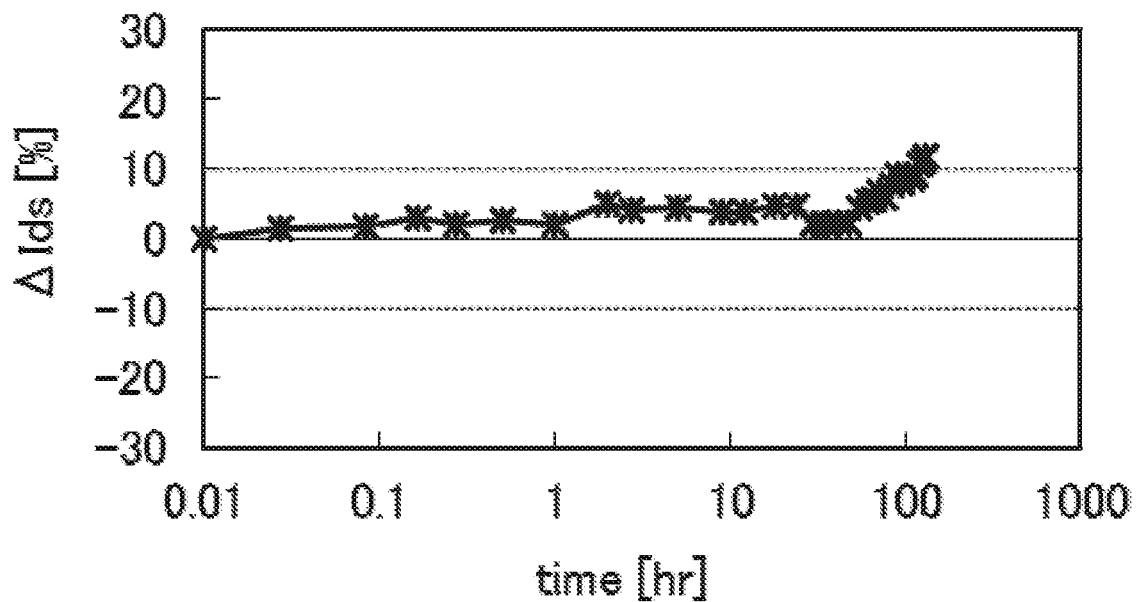
FIGS. 29A and 29B are graphs showing +GBT stress time dependence of ΔIds and ΔVsh, respectively, in Example.
Figure 29B:
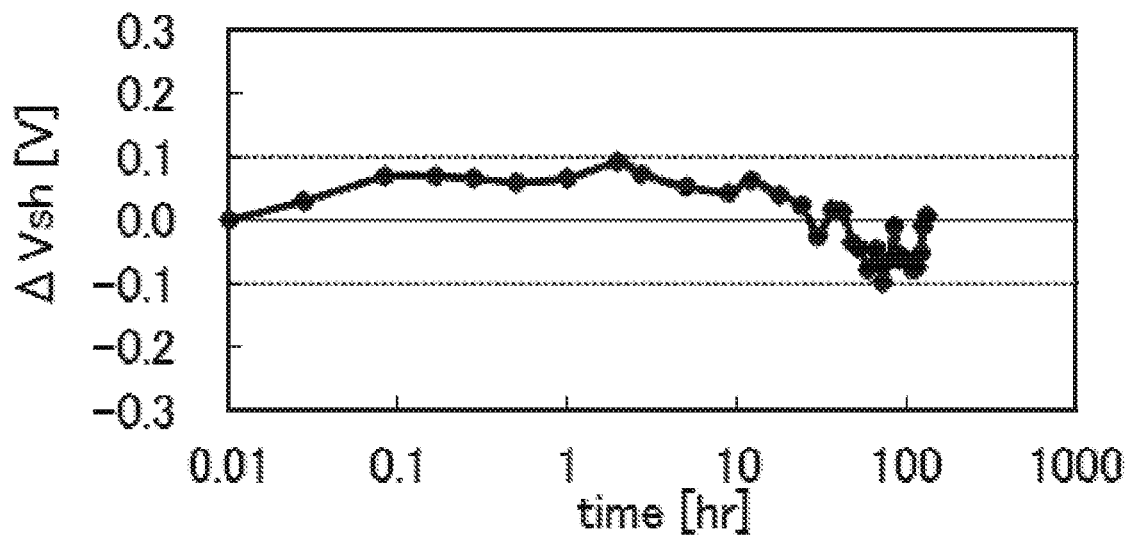

Next, the sample A was subjected to a long-term reliability test. As the long-term reliability test, a +GBT stress test was continuously performed for 132 h. FIG. 29A is a graph showing the +GBT stress time dependence of ΔIds, and the rate of change is +9.2%, which is within ±10%, after a stress time of 114h has passed. FIG. 29B is a graph showing the +GBT stress time dependence of ΔVsh, and the rate of change is within ±0.1 V even after a stress time of 132h has passed.

As described above, according to the result of the long-term reliability test, it is verified that the transistor 1000 in which each of S2 and S3 of one embodiment of the present invention contains more In atoms than Ga atoms and S2 and S3 have the same composition or similar compositions has high reliability.

Next, other reliability tests were performed. Specifically, a +drain bias temperature (+DBT) stress test, a −back gate bias temperature (−BGBT) stress test, a +drain gate bias temperature (+DGBT) stress test, and a −GBT stress test were performed.

As the +DBT stress test, stress was applied for 12 h at a maximum under the conditions that the sample temperature was 125° C., Vg was 0 V, Vs was 0 V, Vbg was 0 V, and Vd was +1.32 V.

Figure 30A:
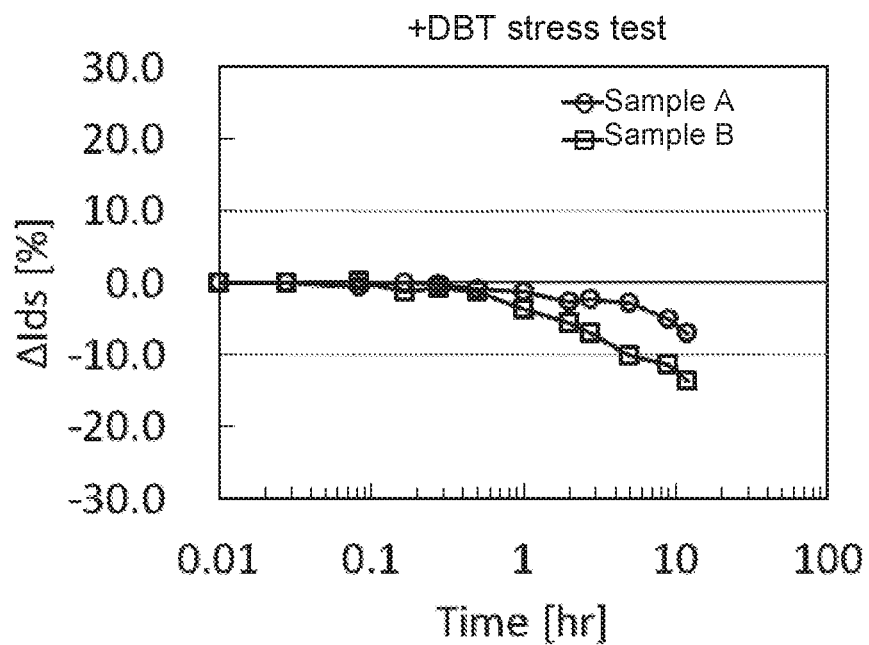
FIGS. 30A and 30B are graphs showing +DBT stress time dependence of ΔIds and ΔVsh, respectively, in Example.
Figure 30B:
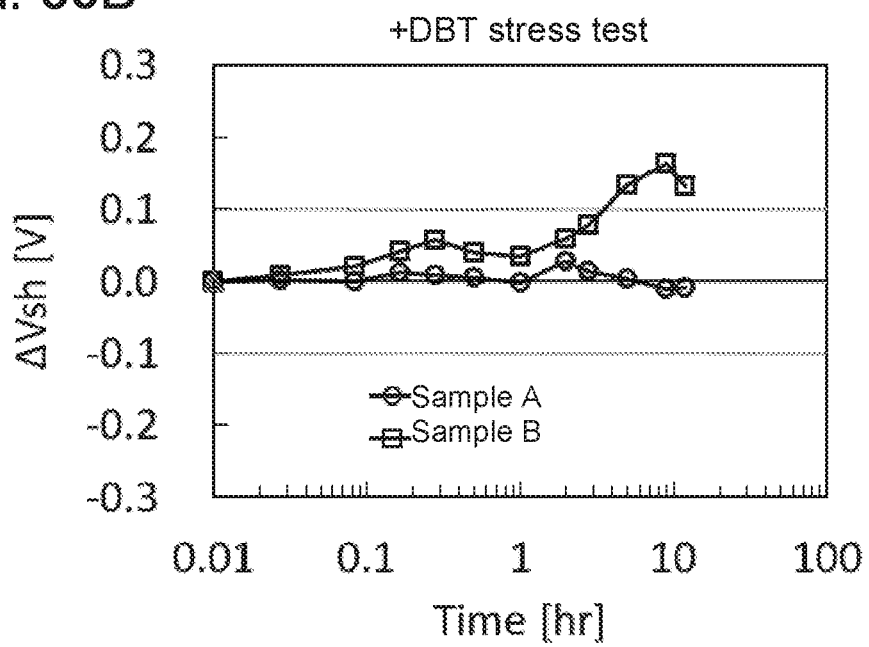

FIG. 30A is a graph showing stress time dependence of ΔIds, and FIG. 30B is a graph showing stress time dependence of ΔVsh. A rate of change in ΔIds of the transistor 1000 in the sample A is within ±10%, and a rate of change in ΔVsh of the transistor 1000 in the sample A is within ±0.1 V. A rate of change in ΔIds of the transistor in the sample B exceeds ±10%, and a rate of change in ΔVsh of the transistor in the sample B also exceeds ±0.1 V.

As the −BGBT stress test, stress was applied for 12 h at a maximum under the conditions that the sample temperature was 125° C., Vg was 0 V, Vs was 0 V, Vbg was −8 V, and Vd was 0 V.

Figure 31A:
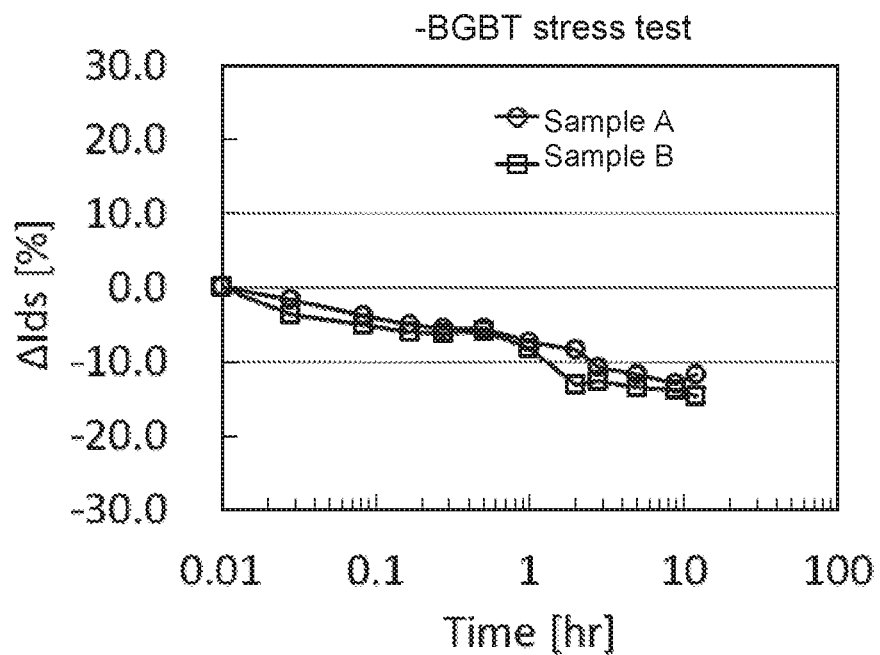
FIGS. 31A and 31B are graphs showing −BGBT stress time dependence of ΔIds and ΔVsh, respectively, in Example.
Figure 31B:
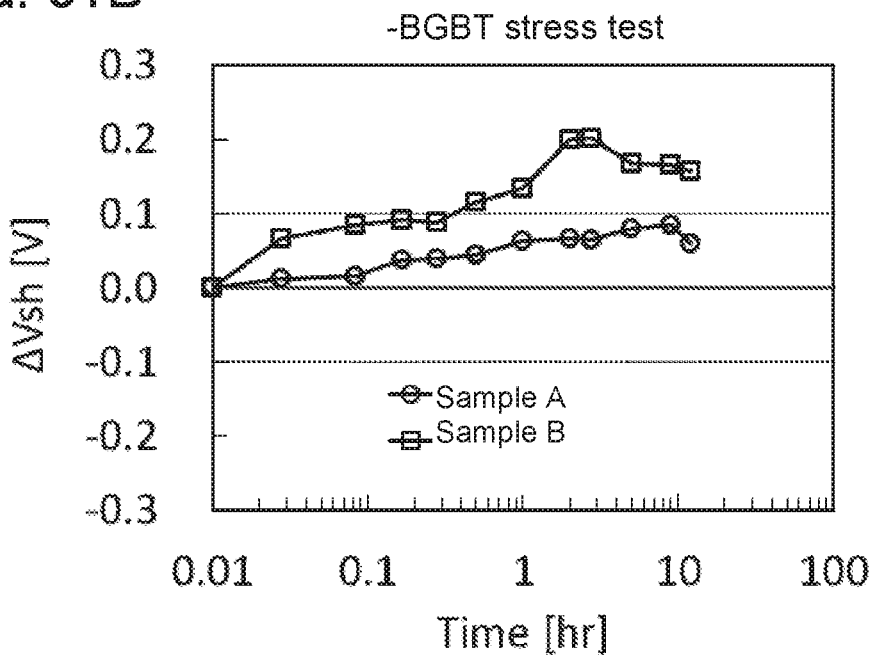

FIG. 31A is a graph showing stress time dependence of ΔIds, and FIG. 31B is a graph showing stress time dependence of ΔVsh. Variation in ΔIds of the transistor 1000 in the sample A exceeds ±10%. A rate of change in ΔVsh of the transistor 1000 in the sample A is within ±0.1 V. A rate of change in ΔIds of the transistor in the sample B exceeds ±10%, and a rate of change in ΔVsh of the transistor in the sample B also exceeds ±0.1 V.

As the +DGBT stress test, stress was applied for 12 h at a maximum under the conditions that the sample temperature was 125° C., Vg was +3.63 V, Vs was 0 V, Vbg was 0 V, and Vd was 1.32 V.

Figure 32A:
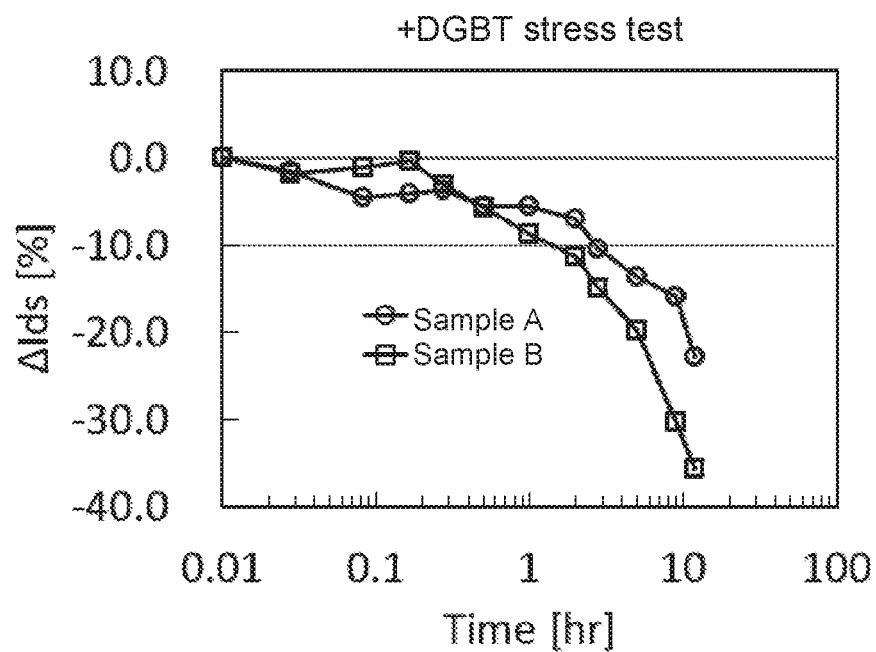
FIGS. 32A and 32B are graphs showing +DGBT stress time dependence of ΔIds and ΔVsh, respectively, in Example.
Figure 32B:
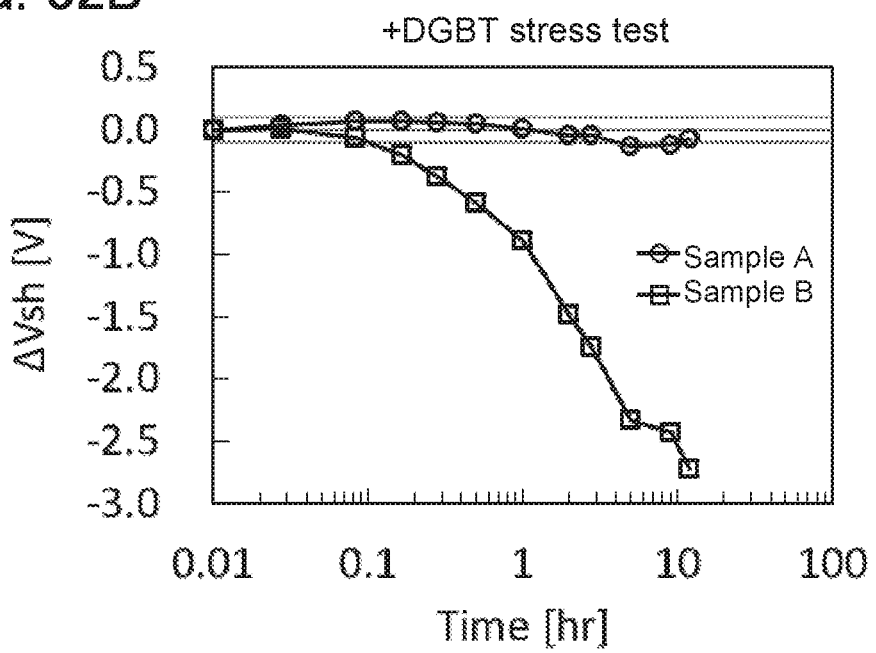

FIG. 32A is a graph showing stress time dependence of ΔIds, and FIG. 32B is a graph showing stress time dependence of ΔVsh. The rate of change in ΔIds of the transistor 1000 in the sample A exceeds ±10%, while the rate of change in ΔVsh of the transistor 1000 in the sample A is within ±0.1 V. A rate of change in ΔIds of the transistor in the sample B exceeds ±10%, and a rate of change in ΔVsh of the transistor in the sample B also exceeds ±0.1 V.

As the −GBT stress test, stress was applied for 12 h at a maximum under the conditions that the sample temperature was 125° C., Vg was −3.32 V, Vs was 0 V, Vbg was 0V, and Vd was 0 V.

Figure 33A:
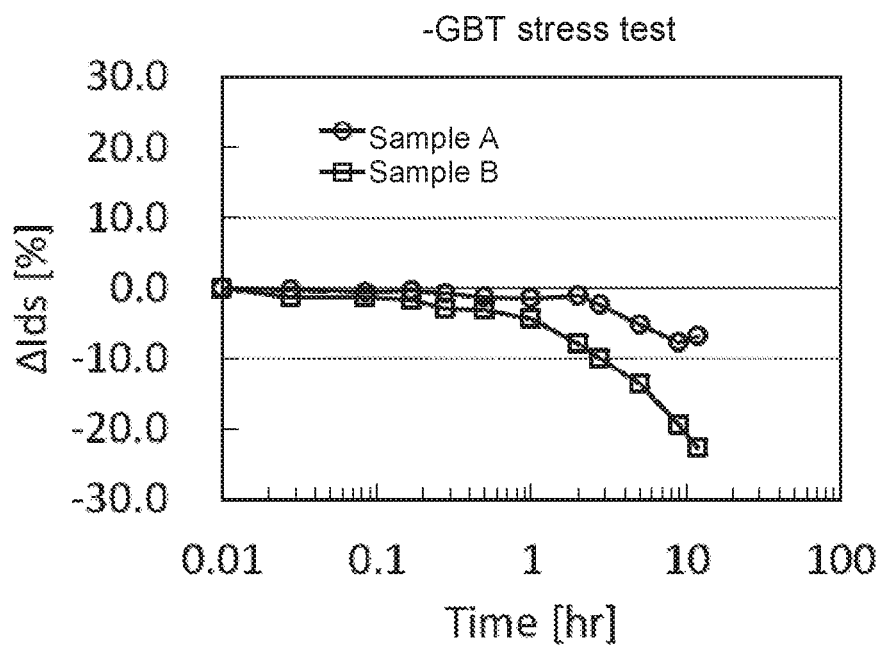
FIGS. 33A and 33B are graphs showing −GBT stress time dependence of ΔIds and ΔVsh, respectively, in Example.
Figure 33B:
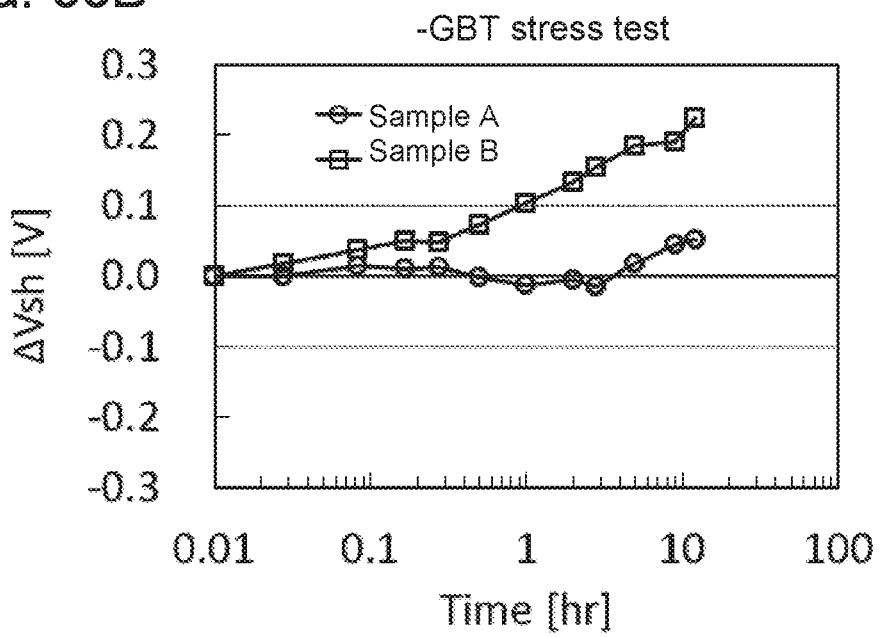

FIG. 33A is a graph showing stress time dependence of ΔIds, and FIG. 33B is a graph showing stress time dependence of ΔVsh. The rate of change in ΔIds of the transistor 1000 in the sample A is within ±10%, and the rate of change in ΔVsh of the transistor 1000 in the sample A is also within ±0.1 V. A rate of change in ΔIds of the transistor in the sample B exceeds ±10%, and a rate of change in ΔVsh of the transistor in the sample B also exceeds ±0.1 V.

As described above, also in the +DBT stress test, the −BGBT stress test, the +DGBT stress test, and the −GBT stress test, it is verified that the transistor 1000 in which each of S2 and S3 of one embodiment of the present invention contains more In atoms than Ga atoms and S2 and S3 have the same composition or similar compositions has high reliability.

REFERENCE NUMERALS

100: capacitor, 101: capacitor, 110: conductor, 112: conductor, 120: conductor, 122: barrier layer, 130: insulator, 150: insulator, 200: transistor, 201: transistor, 205: conductor, 210: insulator, 212: insulator, 214: insulator, 216: insulator, 218: conductor, 220: insulator, 222: insulator, 224: insulator, 230: oxide, 230*a*: oxide, 230*b*: oxide, 230*c*: oxide, 240: conductor, 240*b*: conductor, 245*b*: barrier layer, 246: conductor, 248: conductor, 250: insulator, 260: conductor, 270: barrier layer, 280: insulator, 282: insulator, 286: insulator, 300: transistor, 301: insulator, 302: insulator, 303: insulator, 310: conductor, 310*a*: conductor, 310*b*: conductor, 311: substrate, 313: semiconductor region, 314*a*: low-resistance region, 314*b*: low-resistance region, 315: insulator, 316: conductor, 320: insulator, 322: insulator, 324: insulator, 326: insulator, 328: conductor, 330: conductor, 340: transistor, 345: transistor, 350: insulator, 352: insulator, 354: insulator, 356: conductor, 360: insulator, 362: insulator, 364: insulator, 366: conductor, 370: insulator, 372: insulator, 374: insulator, 376: conductor, 380: insulator, 382: insulator, 384: insulator, 386: conductor, 400: substrate, 401: insulator, 402: insulator, 404: conductor, 404*a*: conductor, 404*b*: conductor, 405: conductor, 405*a*: conductor, 405*b*: conductor, 406: oxide, 406*a*: oxide, 406*a*1: oxide, 406*a*2: oxide, 406*a*3: oxide, 406*b*: oxide, 406*b*1: oxide, 406*b*2: oxide, 406*b*3: oxide, 406*c*: oxide, 406*c*1: oxide, 406*d*: oxide, 408: insulator, 408*a*: insulator, 408*b*: insulator, 410: insulator, 411: conductor, 411*a*: conductor, 411*a*1: conductor, 411*a*2: conductor, 412: insulator, 412*a*: insulator, 416: conductor, 416*a*: conductor, 416*a*1: conductor, 416*a*2: conductor, 417: barrier film, 417*a*: barrier film, 417*a*1: barrier film, 417*a*2: barrier film, 417*b*1: barrier film, 417*b*2: barrier film, 418: insulator, 420: insulator, 421: resist, 430*c*: oxide, 431*a*: oxide, 431*b*: oxide, 432*a*: oxide, 432*b*: oxide, 440: conductor, 440*a*: conductor, 440*b*: conductor, 441*a*: conductor, 441*b*: conductor, 445: barrier layer, 445*a*: barrier layer, 445*b*: barrier layer, 450: insulator, 460: conductor, 460*a*: conductor, 460*b*: conductor, 470: barrier layer, 500: structure, 711: substrate, 712: circuit region, 713: separation region, 714: separation line, 715: chip, 750: electronic component, 752: printed circuit board, 754: circuit board, 755: lead, 1000: transistor, 1000*a*: transistor, 1000*b*: transistor, 1000*c*: transistor, 1000*d*: transistor, 1000*e*: transistor, 2000: transistor, 2910: information terminal, 2911: housing, 2912: display portion, 2913: camera, 2914: speaker portion, 2915: operation switch, 2916: external connection portion, 2917: microphone, 2920: laptop personal computer, 2921: housing, 2922: display portion, 2923: keyboard, 2924: pointing device, 2940: video camera, 2941: housing, 2942: housing, 2943: display portion, 2944: operation switch, 2945: lens, 2946: joint, 2950: information terminal, 2951: housing, 2952: display portion, 2960: information terminal, 2961: housing, 2962: display portion, 2963: band, 2964: buckle, 2965: operation switch, 2966: input/output terminal, 2967: icon, 2980: car, 2981: car body, 2982: wheel, 2983: dashboard, 2984: light, 3001: wiring, 3002: wiring, 3003: wiring, 3004: wiring, 3005: wiring, 3006: wiring, 3007: wiring, 3008: wiring, 3009: wiring, 3010: wiring.

This application is based on Japanese Patent Application Serial No. 2016-206544 filed with Japan Patent Office on Oct. 21, 2016, the entire contents of which are hereby incorporated by reference.

The invention claimed is:

1. A method of manufacturing a semiconductor device, comprising the steps of:
   forming a first oxide by a sputtering method using a first target;
   forming a second oxide over the first oxide by a sputtering method using a second target;
   forming a first conductor and a second conductor over the second oxide;
   forming a third oxide over the second oxide, the first conductor, and the second conductor by a sputtering method using a third target;
   forming an insulator over the third oxide; and
   forming a third conductor over the insulator,
   wherein a proportion of oxygen in a sputtering gas for forming the second oxide is smaller than a proportion of oxygen in a sputtering gas for forming the third oxide,
   wherein each of the first target, the second target, and the third target includes at least two kinds of metal elements, and
   wherein an atomic ratio of metal elements in the second target is equal to or similar to an atomic ratio of metal elements in the third target.

2. The method of manufacturing a semiconductor device, according to claim 1,
   wherein each of the second target and the third target includes In, an element M, and Zn,
   wherein the element M is Al, Ga, Y, or Sn, and
   wherein in each of the second target and the third target, an atomic proportion of the In is larger than an atomic proportion of the element M.

3. The method of manufacturing a semiconductor device, according to claim 1,
   wherein the first oxide and the second oxide are formed in this order under a reduced pressure.

4. The method of manufacturing a semiconductor device, according to claim 1, further comprising the step of forming a fourth oxide over the third oxide by a sputtering method using a fourth target,
   wherein the fourth oxide is formed before the step of forming the insulator.

5. The method of manufacturing a semiconductor device, according to claim 4,
   wherein each of the first to fourth targets includes In, an element M, and Zn,
   wherein the element M is Al, Ga, Y, or Sn, wherein in each of the second target and the third target, an atomic proportion of the In is larger than an atomic proportion of the element M, and wherein in the fourth target, an atomic proportion of the element M is larger an atomic proportion of the In.

6. The method of manufacturing a semiconductor device, according to claim 4, wherein the third oxide and the fourth oxide are formed in this order under a reduced pressure.

7. A method of manufacturing a module, wherein the module comprises a printed circuit board and a semiconductor device manufactured by the method of manufacturing a semiconductor device according to claim 1.

8. A method of manufacturing an electronic device, wherein the electronic device comprises a module manufactured by the method of manufacturing a module according to claim 7, and a speaker or an operation key.

9. A method of manufacturing a semiconductor device, comprising the steps of:

forming a first oxide by a sputtering method using a first target;

forming a second oxide over the first oxide by a sputtering method using a second target;

forming a first conductor and a second conductor over the second oxide;

forming a third oxide over the second oxide, the first conductor, and the second conductor by a sputtering method using a third target;

forming an insulator over the third oxide; and forming a third conductor over the insulator, wherein each of the first target, the second target, and the third target includes at least two kinds of metal elements, wherein an atomic ratio of metal elements in the second target is equal to or similar to an atomic ratio of metal elements in the third target, wherein each of the second target and the third target includes In, an element M, and Zn, wherein the element M is Al, Ga, Y, or Sn, and wherein in each of the second target and the third target, an atomic proportion of the In is larger than an atomic proportion of the element M.

10. The method of manufacturing a semiconductor device, according to claim 9, wherein the first oxide and the second oxide are formed in this order under a reduced pressure.

11. The method of manufacturing a semiconductor device, according to claim 9, further comprising the step of forming a fourth oxide over the third oxide by a sputtering method using a fourth target, wherein the fourth oxide is formed before the step of forming the insulator.

12. The method of manufacturing a semiconductor device, according to claim 11, wherein each of the first to fourth targets includes In, an element M, and Zn, wherein the element M is Al, Ga, Y, or Sn, wherein in each of the second target and the third target, an atomic proportion of the In is larger than an atomic proportion of the element M, and wherein in the fourth target, an atomic proportion of the element M is larger an atomic proportion of the In.

13. The method of manufacturing a semiconductor device, according to claim 11, wherein the third oxide and the fourth oxide are formed in this order under a reduced pressure.

14. A method of manufacturing a module, wherein the module comprises a printed circuit board and a semiconductor device manufactured by the method of manufacturing a semiconductor device according to claim 9.

15. A method of manufacturing an electronic device, wherein the electronic device comprises a module manufactured by the method of manufacturing a module according to claim 14, and a speaker or an operation key.

* * * * *